US010756762B2

(12) United States Patent
Park et al.

(10) Patent No.: US 10,756,762 B2
(45) Date of Patent: Aug. 25, 2020

(54) METHOD OF CHANNEL CODING FOR COMMUNICATION SYSTEMS AND APPARATUS USING THE SAME

(71) Applicant: Electronics and Telecommunications Research Institute, Daejeon (KR)

(72) Inventors: Sung-Ik Park, Daejeon (KR); Sun-Hyoung Kwon, Daejeon (KR); Nam-Ho Hur, Sejong-si (KR); Heung-Mook Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 69 days.

(21) Appl. No.: 16/100,268

(22) Filed: Aug. 10, 2018

(65) Prior Publication Data

US 2019/0052287 A1 Feb. 14, 2019

(30) Foreign Application Priority Data

Aug. 11, 2017 (KR) ........................ 10-2017-0102013
Jul. 30, 2018 (KR) ........................ 10-2018-0088550

(51) Int. Cl.
*H03M 13/00* (2006.01)
*H03M 13/11* (2006.01)
*H04L 1/00* (2006.01)

(52) U.S. Cl.
CPC ...... *H03M 13/116* (2013.01); *H03M 13/1105* (2013.01); *H03M 13/118* (2013.01); *H03M 13/6516* (2013.01); *H04L 1/0057* (2013.01)

(58) Field of Classification Search
CPC .......... H03M 13/116; H03M 13/1105; H03M 13/118; H03M 13/6516; H04L 1/0057
See application file for complete search history.

(56) References Cited

U.S. PATENT DOCUMENTS

2017/0187489 A1* 6/2017 Myung ............. H03M 13/1102

OTHER PUBLICATIONS

Myung, Seho et al., "Quasi-Cyclic LDPC Codes for Fast Encoding", *IEEE Transactions on Information Theory*, vol. 51, No. 8, Aug. 2005 (pp. 2894-2901).
Myung Seho, et al., "Lifting Methods for Quasi-Cyclic LDPC Codes", *IEEE Communications Letters*, vol. 10, No. 6, Jun. 2006 (pp. 489-491).

* cited by examiner

*Primary Examiner* — Samir W Rizk
(74) *Attorney, Agent, or Firm* — NSIP Law

(57) ABSTRACT

Disclosed herein are a channel coding/decoding method in which a parity check matrix is transformed and an apparatus using the same. The channel-coding method includes loading a first exponent matrix, transforming the first exponent matrix into a second exponent matrix, creating a parity check matrix corresponding to a required block size using the second exponent matrix, and performing LDPC encoding using the parity check matrix.

14 Claims, 5 Drawing Sheets

START

LOAD FIRST EXPONENT MATRIX ~S510

TRANSFORM FIRST EXPONENT MATRIX INTO SECOND EXPONENT MATRIX ~S520

GENERATE PARITY CHECK MATRIX USING SECOND EXPONENT MATRIX ~S530

PERFORM LDPC ENCODING/DECODING USING PARITY CHECK MATRIX ~S540

END

METHOD OF CHANNEL CODING FOR COMMUNICATION SYSTEMS AND APPARATUS USING THE SAME

CROSS REFERENCE TO RELATED APPLICATIONS

This application claims the benefit of Korean Patent Application No. 10-2017-0102013, filed Aug. 11, 2017, and No. 10-2018-0088550, filed Jul. 30, 2018, which are hereby incorporated by reference in their entirety into this application.

BACKGROUND OF THE INVENTION

1. Technical Field

The present invention relates generally to channel coding, and more particularly to data encoding and decoding methods for communication systems using low-density parity-check (LDPC) code.

2. Description of the Related Art

Wireless communication systems are widely used to provide various types of communication content, such as voice, data, and the like. These systems may be multiple-access systems that are capable of supporting communication with multiple users by sharing available system resources (for example, bandwidth and transmission power). Examples of such multiple-access systems include Code-Division Multiple Access (CDMA) systems, Time-Division Multiple Access (TDMA) systems, Frequency-Division Multiple Access (1-DMA) systems, 3rd-Generation Partnership Project (3GPP) Long-Term Evolution (LTE) systems, LTE-Advanced (LTE-A) systems, and Orthogonal Frequency-Division Multiple Access (OFDMA) systems.

In the current information age, binary values (that is, 1s and 0s) are used to represent various types of information, such as video, audio, statistical information, and the like, and are also used for communication. However, while binary data is being stored, transmitted, and/or processed, errors may occur. For example, data ‘1’ may change to ‘0’, or data ‘0’ may change to ‘1’.

In order to provide a mechanism for checking errors and correcting errors in some cases, binary data may be coded so as to adopt carefully designed redundancy. Coding a unit of data generates a so-called ‘codeword’. Due to the redundancy, a codeword may include a greater number of bits than the input unit of data from which the codeword is generated. As described above, adding parity bits (redundant bits) to information bits is called ‘channel coding’.

In order to generate a codeword, an encoder adds redundant bits to a bitstream to be transmitted. When the transmitted signals generated from the codewords are received or processed, the redundant information included in the codeword, which is observed in the signal, may be used to detect and/or correct errors in the received data or to eliminate distortion from the received signal in order to reconstruct the original data unit. Such error checking and/or error correction may be implemented as part of a decoding process.

Occasionally, communication systems need to operate at different rates, and the recent communication systems are actively using low-density parity-check (LDPC) code as a channel-coding method.

Generally, in order to applicably operate in devices having a wide performance range, communication systems are required to reduce the expenses of implementing an encoder and a decoder.

Accordingly, a new channel-coding method that may reduce the complexity of LDPC encoding and decoding is strongly required.

SUMMARY OF THE INVENTION

An object of the present invention is to perform LDPC encoding/decoding by transforming the parity check matrix of given LDPC code and creating another parity check matrix having similar algebraic characteristics, thereby maximizing the efficiency of channel encoding/decoding.

Another object of the present invention is to transform different formats of parity check matrices of LDPC code into a unified format, thereby reducing the complexity of encoding/decoding.

In order to accomplish the above objects, a channel-coding method according to the present invention includes loading a first exponent matrix; transforming the first exponent matrix into a second exponent matrix; creating a parity check matrix corresponding to a required block size using the second exponent matrix; and performing low-density parity-check (LDPC) encoding using the parity check matrix.

Here, transforming the first exponent matrix into the second exponent matrix may include performing a circular column permutation on one column of the first exponent matrix and thereby creating a column-permutated exponent matrix; and creating conversion values for elements that are greater than 0 in the column-permutated exponent matrix and creating the second exponent matrix using the conversion values.

Here, the one column may be a $(k_b+1)$-th column of the first exponent matrix (where $k_b$ is a natural number that is acquired by subtracting a number of rows in the first exponent matrix from a number of columns therein).

Here, the first exponent matrix and the second exponent matrix may be classified as two types, which are a first type and a second type, depending on first four elements in the $(k_b+1)$-th column of the first exponent matrix.

Here, when the first four elements include a single natural number (a), which is greater than 0, the exponent matrix may be classified as the first type, and when the first four elements include two natural numbers (a), the exponent matrix may be classified as the second type.

Here, when the first exponent matrix is the first type, the second exponent matrix may be the second type, and when the first exponent matrix is the second type, the second exponent matrix may be the first type.

Here, the circular column permutation may be performed using the natural number (a), which is greater than 0.

Here, the circular column permutation may be performed using the following equation, $$V'_{ij}=(V_{ij}-a) \bmod Z_{max} \text{ for } 0 \le V_{ij} \le Z_{max}-1$$

where $V'_{ij}$ denotes elements of the column-permutated exponent matrix, $V_{ij}$ denotes elements of the first exponent matrix, mod denotes a modulo operator, $Z_{max}$ denotes a maximum block size, and a denotes the natural number, which is greater than 0.

Here, the conversion value may be created by subtracting an element that is greater than 0 in the column-permutated exponent matrix from the maximum block size.

Here, the second exponent matrix may be created using the following equation, $$W_{ij} = \begin{cases} V'_{ij}, & V'_{ij} = -1, 0, \\ Z_{max} - V'_{ij}, & V'_{ij} > 0 \end{cases}.$$

where $W_{ij}$ denotes elements of the second exponent matrix, $V'_{ij}$ denotes elements of the column-permutated exponent matrix, and $Z_{max}$ denotes the maximum block size.

Also, a channel encoder according to an embodiment of the present invention includes memory for storing data pertaining to a first exponent matrix corresponding to an original parity check matrix; and a processor for creating a parity check matrix corresponding to a second exponent matrix that is created by transforming the first exponent matrix and for performing low-density parity-check (LDPC) encoding using the created parity check matrix.

Here, the second exponent matrix may be created using conversion values for elements that are greater than 0 in a column-permutated exponent matrix; and the column-permutated exponent matrix may be created by performing a circular column permutation on one column of the first exponent matrix.

Here, the one column may be a $(k_b+1)$-th column of the first exponent matrix (where $k_b$ is a natural number that is acquired by subtracting a number of rows in the first exponent matrix from a number of columns therein).

Here, the first exponent matrix and the second exponent matrix may be classified as two types, which are a first type and a second type, depending on first four elements in the $(k_b+1)$-th column of the first exponent matrix.

Here, when the first four elements include a single natural number, which is greater than 0, the exponent matrix may be classified as the first type, and when the first four elements include two natural numbers, the exponent matrix may be classified as the second type.

Here, when the first exponent matrix is the first type, the second exponent matrix may be the second type, and when the first exponent matrix is the second type, the second exponent matrix may be the first type.

Here, the circular column permutation may be performed using the natural number included in the first four elements, which is greater than 0.

Here, the circular column permutation may be performed using the following equation, $$V'_{ij} = (V_{ij} - a) \bmod Z_{max} \text{ for } 0 \le V_{ij} \le Z_{max} - 1$$

where $V'_{ij}$ denotes elements of the column-permutated exponent matrix, $V_{ij}$ denotes elements of the first exponent matrix, mod denotes a modulo operator, $Z_{max}$ denotes a maximum block size, and a denotes the natural number included in the first four elements, which is greater than 0.

Here, the second exponent matrix may be created using the following equation, $$W_{ij} = \begin{cases} V'_{ij}, & V'_{ij} = -1, 0, \\ Z_{max} - V'_{ij}, & V'_{ij} > 0 \end{cases}.$$

where $W_{ij}$ denotes elements of the second exponent matrix, $V'_{ij}$ denotes elements of the column-permutated exponent matrix, and $Z_{max}$ denotes the maximum block size.

Also, a channel decoder according to an embodiment of the present invention includes memory for storing data pertaining to a first exponent matrix corresponding to an original parity check matrix; and a processor for creating a parity check matrix corresponding to a second exponent matrix that is created by transforming the first exponent matrix and for performing low-density parity-check (LDPC) decoding using the created parity check matrix.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
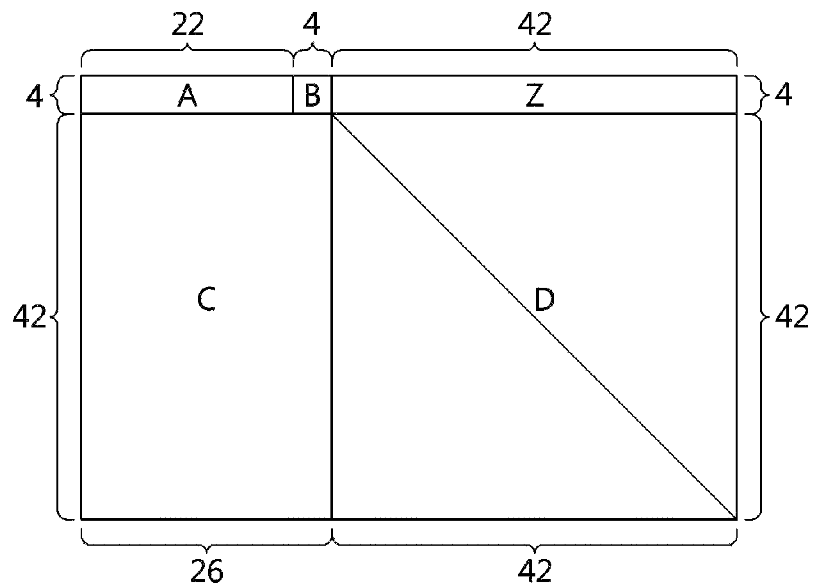
FIG. 1 and FIG. 2 are views that show examples of binary matrices corresponding to basic graphs.

The present invention will be described in detail below with reference to the accompanying drawings. Repeated descriptions and descriptions of known functions and configurations which have been deemed to unnecessarily obscure the gist of the present invention will be omitted below. The embodiments of the present invention are intended to fully describe the present invention to a person having ordinary knowledge in the art to which the present invention pertains. Accordingly, the shapes, sizes, etc. of components in the drawings may be exaggerated in order to make the description clearer.

Hereinafter, a preferred embodiment of the present invention will be described in detail with reference to the accompanying drawings.

Generally, low-density parity-check (LDPC) code, which is linear block code that can be defined as a parity check matrix, creates a codeword configured with $N_{ldpc}$ bits by receiving information or an information word configured with $K_{ldpc}$ bits or symbols (where $K_{ldpc}$ is a natural number and $N_{ldpc}$ is a natural number that is greater than $K_{ldpc}$).

Recently, in order to improve the efficiency of implementation and to maximize throughput as well as to improve the performance of encoding and decoding of LDPC code, encoding and decoding methods based on quasi-cyclic LDPC code have been proposed.

The present invention provides a method for transforming the parity check matrix of given quasi-cyclic LDPC code and thereby creating LDPC code having similar algebraic characteristics. The LDPC code designed through such transformation has almost the same algebraic characteristics as the given quasi-cyclic LDPC code, which is the target to be transformed. Here, the submatrix of the parity check matrix corresponding to the parity of an LDPC codeword is transformed into a specific format, whereby the effect of reducing the complexity of encoding may be acquired.

The symbols and terms used in the following description are specifically described in pages 2894-2901 of IEEE transactions on Information Theory, August 2005, and in a thesis titled "Lifting methods for quasi-cyclic LDPC codes", written by S. Myung, K. Yang, and J. Kim and published in IEEE Communications Letters (Volume 10, Issue 6, pp. 489-497) in June 2006.

First, quasi-cyclic LDPC code may be defined based on circulant permutation matrices. Here, a Z×Z circulant permutation matrix, $P=(P_{ij})$ ($P_{ij}$ is the element in the i-th row and the j-th column), may be defined as shown in the following Equation (1):

$$P_{ij} = \begin{cases} 1, & \text{if } i+1 \equiv j(\text{mod}Z) \\ 0, & \text{otherwise} \end{cases}. \quad (1)$$

Generally, the parity check matrix of quasi-cyclic LDPC code may be represented as shown in the following Equation (2):

$$H = \begin{bmatrix} pV_{11} & pV_{12} & \cdots & pV_{1k_b} & \cdots & pV_{1n_b} \\ pV_{21} & pV_{22} & \cdots & pV_{2k_b} & \cdots & pV_{2n_b} \\ \vdots & \vdots & \ddots & \vdots & \ddots & \vdots \\ pV_{m_b1} & pV_{m_b2} & \cdots & pV_{m_bk_b} & \cdots & pV_{m_bn_b} \end{bmatrix} \quad (2)$$

In Equation (2), the value of $V_{ij}$ (i and j are natural numbers) is an integer that is generally defined in the range {−1, 0, 1, 2, . . . }. Here, for $V_{ij}\geq 0$, $P^{Vij}$ is the same as the circulant permutation matrix acquired by circularly shifting each element of a Z×Z identity matrix to the right by $V_{ij}$. Also, in the present invention, $P^{-1}$ indicates a Z×Z zero matrix.

In the present invention, the case in which a single Z×Z sub-block corresponds to a single circulant permutation matrix in Equation (2) is described for convenience of description, but the technical idea of the present invention may also be identically applied to the case in which a single Z×Z sub-block corresponds to multiple circulant permutation matrices. For reference, a Z×Z sub-block consisting of multiple circulant permutation matrices is generally regarded as a circulant matrix, and the parity check matrix of LDPC code configured with such circular matrices or circular permutation matrices as shown in Equation (2) is generally treated as quasi-cyclic LDPC code.

The above Equation (2) shows a parity check matrix that represents quasi-cyclic LDPC code that is configured with a total of $m_b$ row-blocks and a total of $n_b$ column-blocks. Accordingly, the total length of a codeword is $n_bZ$. Also, if the parity check matrix is full rank, when $k_b=n_b-m_b$ is satisfied, the length of an information word is $k_bZ$.

Here, an $m_b\times n_b$ binary matrix may be created from the parity check matrix in Equation (2) by replacing Z×Z circulant permutation matrices with '1's and replacing Z×Z zero matrices with '0's, and the $m_b\times n_b$ binary matrix may be referred to as a basic graph, a base matrix, or a mother matrix.

Figure 2:
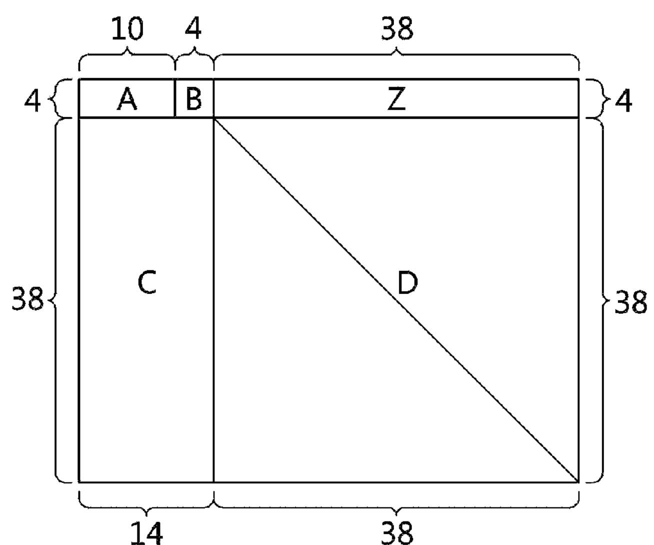

FIG. 1 and FIG. 2 are views that show examples of binary matrices, which are basic graphs.

In the examples illustrated in FIG. 1 and FIG. 2, the matrix D may be a diagonal matrix, and the matrix Z may be a zero matrix.

In the example illustrated in FIG. 1, the binary matrix is a 46×68 matrix, Z is a 4×42 zero matrix, D is a 42×42 diagonal matrix, A is a 4×22 matrix, the elements of which are 0 or 1, B is a 4×4 matrix, in which the elements in the first row are 1, 1, 0 and 0, the elements in the second row are 1, 1, 1 and 0, the elements in the third row are 0, 0, 1 and 1, and the elements in the fourth row are 1, 0, 0 and 1, and C is a 42×26 matrix, the elements of which are 0 or 1. The basic graph having the above-described structure may be referred to as a BG#1 type.

In the example illustrated in FIG. 2, the binary matrix is a 42×52 matrix, Z is a 4×38 zero matrix, D is a 38×38 diagonal matrix, A is a 4×10 matrix, the elements of which are 0 or 1, B is a 4×4 matrix, in which the elements in the first row are 1, 1, 0 and 0, the elements in the second row are 0, 1, 1 and 0, the elements in the third row are 1, 0, 1 and 1, and the elements in the fourth row are 1, 0, 0 and 1, and C is a 38×14 matrix, the elements of which are 0 or 1. The basic graph having the above-described structure may be referred to as a BG#2 type.

The examples of the basic graphs described with reference to FIG. 1 and FIG. 2 may correspond to a table that represents only the row index and the column index of the element '1', as shown in the following Table 1. Here, when i is 0, this indicates the first row, and when j is 0, this indicates the first column.

TABLE 1

| Row index (i) | Column indices (j) of every element of value 1 for BG#1 | Column indices (j) of every element of value 1 for BG#2 |
|---|---|---|
| 0 | 0, 1, 2, 3, 5, 6, 9, 10, 11, 12, 13, 15, 16, 18, 19, 20, 21, 22, 23 | 0, 1, 2, 3, 6, 9, 10, 11 |
| 1 | 0, 2, 3, 4, 5, 7, 8, 9, 11, 12, 14, 15, 16, 17, 19, 21, 22, 23, 24 | 0, 3, 4, 5, 6, 7, 8, 9, 11, 12 |
| 2 | 0, 1, 2, 4, 5, 6, 7, 8, 9, 10, 13, 14, 15, 17, 18, 19, 20, 24, 25 | 0, 1, 3, 4, 8, 10, 12, 13 |
| 3 | 0, 1, 3, 4, 6, 7, 8, 10, 11, 12, 13, 14, 16, 17, 18, 20, 21, 22, 25 | 1, 2, 4, 5, 6, 7, 8, 9, 10, 13 |
| 4 | 0, 1, 26 | 0, 1, 11, 14 |
| 5 | 0, 1, 3, 12, 16, 21, 22, 27 | 0, 1, 5, 7, 11, 15 |
| 6 | 0, 6, 10, 11, 13, 17, 18, 20, 28 | 0, 5, 7, 9, 11, 16 |
| 7 | 0, 1, 4, 7, 8, 14, 29 | 1, 5, 7, 11, 13, 17 |
| 8 | 0, 1, 3, 12, 16, 19, 21, 22, 24, 30 | 0, 1, 12, 18 |
| 9 | 0, 1, 10, 11, 13, 17, 18, 20, 31 | 1, 8, 10, 11, 19 |
| 10 | 1, 2, 4, 7, 8, 14, 32 | 0, 1, 6, 7, 20 |
| 11 | 0, 1, 12, 16, 21, 22, 23, 33 | 0, 7, 9, 13, 21 |
| 12 | 0, 1, 10, 11, 13, 18, 34 | 1, 3, 11, 22 |
| 13 | 0, 3, 7, 20, 23, 35 | 0, 1, 8, 13, 23 |
| 14 | 0, 12, 15, 16, 17, 21, 36 | 1, 6, 11, 13, 24 |
| 15 | 0, 1, 10, 13, 18, 25, 37 | 0, 10, 11, 25 |
| 16 | 1, 3, 11, 20, 22, 38 | 1, 9, 11, 12, 26 |
| 17 | 0, 14, 16, 17, 21, 39 | 1, 5, 11, 12, 27 |
| 18 | 1, 12, 13, 18, 19, 40 | 0, 6, 7, 28 |
| 19 | 0, 1, 7, 8, 10, 41 | 0, 1, 10, 29 |
| 20 | 0, 3, 9, 11, 22, 42 | 1, 4, 11, 30 |
| 21 | 1, 5, 16, 20, 21, 43 | 0, 8, 13, 31 |
| 22 | 0, 12, 13, 17, 44 | 1, 2, 32 |
| 23 | 1, 2, 10, 18, 45 | 0, 3, 5, 33 |
| 24 | 0, 3, 4, 11, 22, 46 | 1, 2, 9, 34 |
| 25 | 1, 6, 7, 14, 47 | 0, 5, 35 |
| 26 | 0, 2, 4, 15, 48 | 2, 7, 12, 13, 36 |
| 27 | 1, 6, 8, 49 | 0, 6, 37 |
| 28 | 0, 4, 19, 21, 50 | 1, 2, 5, 38 |
| 29 | 1, 14, 18, 25, 51 | 0, 4, 39 |
| 30 | 0, 10, 13, 24, 52 | 2, 5, 7, 9, 40 |
| 31 | 1, 7, 22, 25, 53 | 1, 13, 41 |
| 32 | 0, 12, 14, 24, 54 | 0, 5, 12, 42 |
| 33 | 1, 2, 11, 21, 55 | 2, 7, 10, 43 |
| 34 | 0, 7, 15, 17, 56 | 0, 12, 13, 44 |
| 35 | 1, 6, 12, 22, 57 | 1, 5, 11, 45 |
| 36 | 0, 14, 15, 18, 58 | 0, 2, 7, 46 |
| 37 | 1, 13, 23, 59 | 10, 13, 47 |
| 38 | 0, 9, 10, 12, 60 | 1, 5, 11, 48 |
| 39 | 1, 3, 7, 19, 61 | 0, 7, 12, 49 |
| 40 | 0, 8, 17, 62 | 2, 10, 13, 50 |
| 41 | 1, 3, 9, 18, 63 | 1, 5, 11, 51 |

TABLE 1-continued

| Row index (i) | Column indices (j) of every element of value 1 for BG#1 | Column indices (j) of every element of value 1 for BG#2 |
|---|---|---|
| 42 | 0, 4, 24, 64 | |
| 43 | 1, 16, 18, 25, 65 | |
| 44 | 0, 7, 9, 22, 66 | |
| 45 | 1, 6, 10, 67 | |

Also, as shown in the following Equation (3), an $m_b \times n_b$ integer matrix $V=(V_{ij})$ that consists of $V_{ij}$, which is the exponent of a circulant permutation matrix or the exponent representing a zero matrix in the parity check matrix in Equation (2), is referred to as an exponent matrix, a shift matrix, or a shift value matrix.

$$V=(V_{ij})=\begin{bmatrix} V_{11} & V_{12} & \cdots & V_{1k_b} & \cdots & V_{1n_b} \\ V_{21} & V_{22} & \cdots & p_{2k_b} & \cdots & V_{2n_b} \\ \vdots & \vdots & \ddots & \vdots & \ddots & \vdots \\ V_{m_b1} & V_{m_b2} & \cdots & V_{m_bk_b} & \cdots & V_{m_bn_b} \end{bmatrix} \quad (3)$$

Generally, when an exponent matrix and Z, which is the size of the circulant permutation matrix corresponding to the exponent matrix, are known, the parity check matrix of LDPC code may be correctly determined. In other words, when the size of the circulant permutation matrix, Z×Z, is known, encoding and decoding of LDPC code may be performed based on the exponent matrix. Hereinafter, Z indicates the size of a circulant permutation matrix or a block size.

In order to store the parity check matrix of LDPC code, not only the method of storing an exponent matrix but also various other methods may be used. For example, when only the base matrix of given LDPC code and the elements $V_{ij}$ that are not equal to −1 in Equation (3) are known, the parity check matrix of LDPC code may be correctly determined. As described above, in some cases, when only the base matrix of LDPC code, an LDPC sequence corresponding to elements $V_{ij}$ of an exponent matrix, and Z, which is the size of a circulant permutation matrix, are stored, the same effect as storing the entire parity check matrix of LDPC code may be acquired. Consequently, there may be various methods algebraically having the same effect as the method of storing a parity check matrix.

In order to create LDPC code having a different length from a given single exponent matrix, as shown in Equation (3), or from an LDPC sequence, a lifting method may be used. For example, when an exponent matrix $V=(V_{ij})$, shown in Equation (3), is given, each element $V_{ij}$ is converted into $v_{ij}$ using the block size, Z, through $v_{ij}(Z)=V_{ij} \bmod Z$, and then a parity check matrix based on a Z×Z circulant permutation matrix may be defined for $v_{ij}(Z)$, as shown in the following Equation (4), and may be used for LDPC encoding and decoding.

$$H(Z)=(v_{ij}(Z))=\begin{bmatrix} P^{v_{11}(Z)} & P^{v_{12}(Z)} & \cdots & P^{v_{1k_b}(Z)} & \cdots & P^{v_{1n_b}(Z)} \\ P^{v_{21}(Z)} & P^{v_{22}(Z)} & \cdots & P^{v_{2k_b}(Z)} & \cdots & P^{v_{2n_b}(Z)} \\ \vdots & \vdots & \ddots & \vdots & \ddots & \vdots \\ P^{v_{m_b1}(Z)} & P^{v_{m_b2}(Z)} & \cdots & P^{v_{m_bk_b}(Z)} & \cdots & P^{v_{m_bn_b}(Z)} \end{bmatrix} \quad (4)$$

When the given single exponent matrix is transformed into a new exponent matrix by converting elements $V_{ij}$ into $v_{ij}(Z)$ through $v_{ij}(Z)=V_{ij} \bmod Z$ depending on the block size Z and the new exponent matrix is used, it is possible to acquire the same effect as storing various exponent matrices when only $V=(V_{ij})$ and the available value of Z are known. Therefore, the storage efficiency that is required when LDPC encoding and decoding are implemented may be maximized.

For example, block sizes may be categorized into eight sets, as shown in the following Equation (5), and different exponent matrices may be applied depending on the respective block size sets. All of the block sizes included in the block size sets in Equation (5) or some of the block sizes therein may be used in the system.

$$\begin{aligned} &\text{Set 1: } Z_1=\{2,4,8,16,32,64,128,256\}, \\ &\text{Set 2: } Z_2=\{3,6,12,24,48,96,192,384\}, \\ &\text{Set 3: } Z_3=\{5,10,20,40,80,160,320\}, \\ &\text{Set } Z_4=\{7,14,28,56,112,224\}, \\ &\text{Set 5: } Z_5=\{9,18,36,72,144,288\}, \\ &\text{Set 6: } Z_6=\{11,22,44,88,176,352\}, \\ &\text{Set 7: } Z_7=\{13,26,52,104,208\}, \\ &\text{Set 8: } Z_8=\{15,30,60,120,240\} \end{aligned} \quad (5)$$

Figure 3:
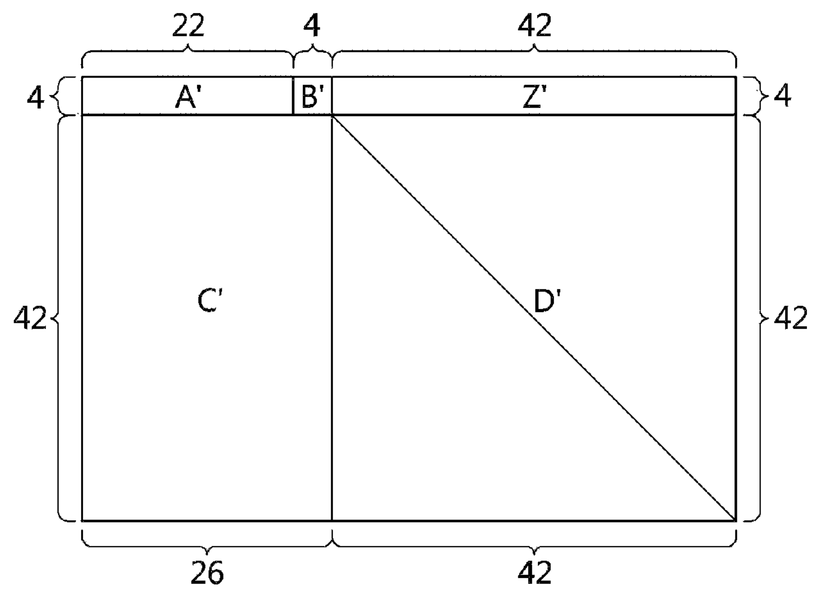
FIG. 3 and FIG. 4 are views that show examples of exponent matrices corresponding to the basic graphs illustrated in FIG. 1 and FIG. 2.
Figure 4:
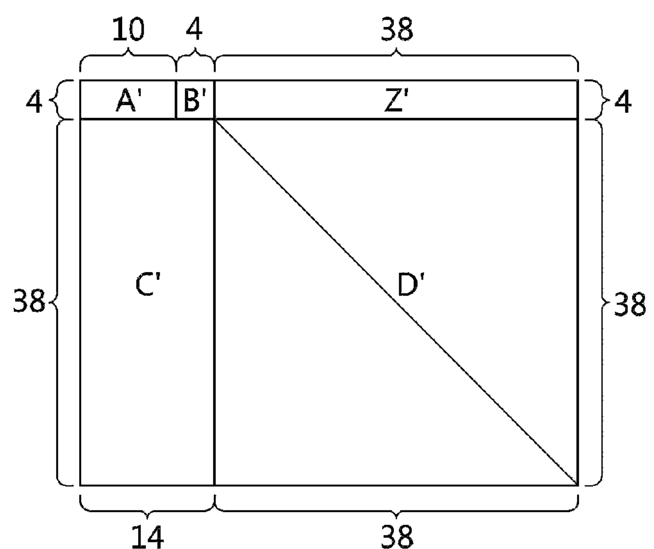

FIG. 3 and FIG. 4 are views that show examples of exponent matrices corresponding to the basic graphs illustrated in FIG. 1 and FIG. 2.

Referring to FIG. 3 and FIG. 4, FIG. 3 shows an exponent matrix corresponding to the basic graph of FIG. 1, and FIG. 4 shows an exponent matrix corresponding to the basic graph of FIG. 2. Here, elements '0's in the matrices shown in FIG. 1 and FIG. 2 are changed to '−1's in the matrices shown in FIG. 3 and FIG. 4, and elements '1's in the matrices shown in FIG. 1 and FIG. 2 are changed to integers, each of which falls within the range {0, 1, 2, . . . }, in the matrices shown in FIG. 3 and FIG. 4. Particularly, '1's in the diagonal matrix D in FIG. 1 and FIG. 2 are changed to '0's in D' in the matrices illustrated in FIG. 3 and FIG. 4.

In the examples illustrated in FIG. 3 and FIG. 4, the matrix D' is a matrix created by replacing elements '0's in D, which is a diagonal matrix, with '−1's and replacing elements '1's in D with '0's. That is, the matrix D' may be a square matrix in which the elements of the main diagonal thereof are '0's and the remaining elements are '−1's. In the examples illustrated in FIG. 3 and FIG. 4, the matrix Z' is a matrix created by replacing elements '0's in Z, which is a zero matrix, with '−1's. That is, the matrix Z' may be a matrix in which all elements are equal to '−1'.

In the example illustrated in FIG. 3, the exponent matrix is a 46×68 matrix, Z' is a 4×42 matrix in which all elements are equal to '−1', D' is a 42×42 matrix in which the elements of the main diagonal are equal to '0' and the remaining elements are equal to '−1', A' is a 4×22 matrix, the elements of which are integers that fall within the range {−1, 0, 1, 2, . . . }, B' is a 4×4 matrix, the elements of which are integers that fall within the range {−1, 0, 1, 2, . . . }, and C' is a 42×26 matrix, the elements of which are integers that fall within the range {−1, 0, 1, 2, . . . }. The exponent matrix having the above-described structure may be referred to as a BG#1 type.

In the example illustrated in FIG. 4, the exponent matrix is a 42×52 matrix, Z' is a 4×38 matrix in which all elements are equal to '−1', D' is a 38×38 matrix in which the elements of the main diagonal are equal to '0' and the remaining elements are equal to '−1', A' is a 4×10 matrix, the elements of which are integers that fall within the range {−1, 0, 1, 2, . . . }, B' is a 4×4 matrix, the elements of which are integers that fall within the range {−1, 0, 1, 2, . . . }, and C' is a 38×14 matrix, the elements of which are integers that fall within the range {−1, 0, 1, 2, . . . }. The exponent matrix having the above-described structure may be referred to as a BG#2 type.

On the other hand, assuming that the basic graph is known, the exponent matrix in Equation (3) may store only exponent values that are not equal to −1 in order to reduce the amount of memory required for storage or to improve storage efficiency. Here, the exponent values that are not equal to −1 may be read column by column and stored, or the exponent values that are not equal to −1 may be read row by row and stored.

For example, the exponent matrix corresponding to BG#1 in Table 1, FIG. 1, and FIG. 3 may be represented as the following.

[BG#1—the efficient storage form of Set 1 (row by row)] Value of V=[250 69 226 159 100 10 59 229 110 191 9 195 23 190 35 239 31 1 0 2 239 117 124 71 222 104 173 220 102 109 132 142 155 255 28 0 0 0 106 111 185 63 117 93 229 177 95 39 142 225 225 245 205 251 117 0 0 121 89 84 20 150 131 243 136 86 246 219 211 240 76 244 144 12 1 0 157 102 0 205 236 194 231 28 123 115 0 183 22 28 67 244 11 157 211 0 220 44 159 31 167 104 0 112 4 7 211 102 164 109 241 90 0 103 182 109 21 142 14 61 216 0 98 149 167 160 49 58 0 77 41 83 182 78 252 22 0 160 42 21 32 234 7 0 177 248 151 185 62 0 206 55 206 127 16 229 0 40 96 65 63 75 179 0 64 49 49 51 154 0 7 164 59 1 144 0 42 233 8 155 147 0 60 73 72 127 224 0 151 186 217 47 160 0 249 121 109 131 171 0 64 142 188 158 0 156 147 170 152 0 112 86 236 116 222 0 23 136 116 182 0 195 243 215 61 0 25 104 194 0 128 165 181 63 0 86 236 84 6 0 216 73 120 9 0 95 177 172 61 0 221 112 199 121 0 2 187 41 211 0 127 167 164 159 0 161 197 207 103 0 37 105 51 120 0 198 220 122 0 167 151 157 163 0 173 139 149 0 0 157 137 149 0 167 173 139 151 0 149 157 137 0 151 163 173 139 0 139 157 163 173 0 149 151 167 0]

Here, other exponent matrices may also be stored in the form of a sequence, as shown in the above example.

Figure 5:
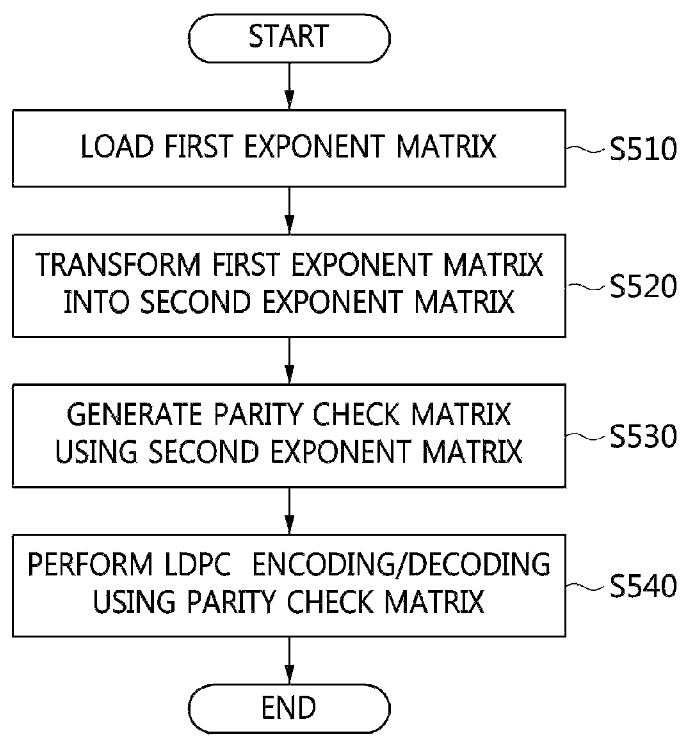
FIG. 5 is a flowchart that shows a channel coding/decoding method according to an embodiment of the present invention.

In order to explain the method for transforming a parity check matrix, proposed by the present invention, assume that the structure of the exponent matrix to be applied to each block size in FIG. 5 is the same as one of the following four Equations (6) to (9).

$$V=(V_{ij})=\begin{bmatrix} V_{11} & \cdots & V_{1k_b} & 0 & 0 & -1 & -1 & -1 & \cdots & -1 \\ V_{21} & \cdots & V_{2k_b} & a & 0 & 0 & -1 & -1 & \cdots & -1 \\ V_{31} & \cdots & V_{3k_b} & -1 & -1 & 0 & 0 & -1 & \cdots & -1 \\ V_{41} & \cdots & V_{4k_b} & 0 & -1 & -1 & 0 & -1 & \cdots & -1 \\ \vdots & \cdots & \vdots & \vdots & \vdots & \vdots & \vdots & 0 & -1 & -1 \\ \vdots & \cdots & \vdots & \vdots & \vdots & \vdots & \vdots & -1 & \ddots & -1 \\ \vdots & \cdots & \vdots & \vdots & \vdots & \vdots & \vdots & -1 & -1 & 0 \end{bmatrix} \quad (6)$$

-continued $$V=(V_{ij})=\begin{bmatrix} V_{11} & \cdots & V_{1k_b} & 0 & 0 & -1 & -1 & -1 & \cdots & -1 \\ V_{21} & \cdots & V_{2k_b} & -1 & 0 & 0 & -1 & -1 & \cdots & -1 \\ V_{31} & \cdots & V_{3k_b} & a & -1 & 0 & 0 & -1 & \cdots & -1 \\ V_{41} & \cdots & V_{4k_b} & 0 & -1 & -1 & 0 & -1 & \cdots & -1 \\ \vdots & \cdots & \vdots & \vdots & \vdots & \vdots & \vdots & 0 & -1 & -1 \\ \vdots & \cdots & \vdots & \vdots & \vdots & \vdots & \vdots & -1 & \ddots & -1 \\ \vdots & \cdots & \vdots & \vdots & \vdots & \vdots & \vdots & -1 & -1 & 0 \end{bmatrix} \quad (7)$$

$$V=(V_{ij})=\begin{bmatrix} V_{11} & \cdots & V_{1k_b} & a & 0 & -1 & -1 & -1 & \cdots & -1 \\ V_{21} & \cdots & V_{2k_b} & 0 & 0 & 0 & -1 & -1 & \cdots & -1 \\ V_{31} & \cdots & V_{3k_b} & -1 & -1 & 0 & 0 & -1 & \cdots & -1 \\ V_{41} & \cdots & V_{4k_b} & a & -1 & -1 & 0 & -1 & \cdots & -1 \\ \vdots & \cdots & \vdots & \vdots & \vdots & \vdots & \vdots & 0 & -1 & -1 \\ \vdots & \cdots & \vdots & \vdots & \vdots & \vdots & \vdots & -1 & \ddots & -1 \\ \vdots & \cdots & \vdots & \vdots & \vdots & \vdots & \vdots & -1 & -1 & 0 \end{bmatrix} \quad (8)$$

$$V=(V_{ij})=\begin{bmatrix} V_{11} & \cdots & V_{1k_b} & a & 0 & -1 & -1 & -1 & \cdots & -1 \\ V_{21} & \cdots & V_{2k_b} & -1 & 0 & 0 & -1 & -1 & \cdots & -1 \\ V_{31} & \cdots & V_{3k_b} & 0 & -1 & 0 & 0 & -1 & \cdots & -1 \\ V_{41} & \cdots & V_{4k_b} & a & -1 & -1 & 0 & -1 & \cdots & -1 \\ \vdots & \cdots & \vdots & \vdots & \vdots & \vdots & \vdots & 0 & -1 & -1 \\ \vdots & \cdots & \vdots & \vdots & \vdots & \vdots & \vdots & -1 & \ddots & -1 \\ \vdots & \cdots & \vdots & \vdots & \vdots & \vdots & \vdots & -1 & -1 & 0 \end{bmatrix} \quad (9)$$

The exponent matrices in Equations (6) to (9) have the structure illustrated in FIG. 3 or FIG. 4. That is, a 4×4 matrix that consists of elements in the $(k_b+1)$-th to $(k_b+4)$-th columns in the first row of the matrix shown in Equations (6) to (9), elements in the $(k_b+1)$-th to $(k_b+4)$-th columns in the second row thereof, elements in the $(k_b+1)$-th to $(k_b+4)$-th columns in the third row thereof, and elements in the $(k_b+1)$-th to $(k_b+4)$-th columns in the fourth row thereof corresponds to the matrix B' in FIG. 3 and FIG. 4.

In Equations (6) to (9), a is an integer that satisfies $1 \le a \le (Z_{max}-1)$ (where $Z_{max}$ is the maximum block size). Here, $Z_{max}$ may be the size of the largest block in the block size set defined in order to apply the exponent matrix $V=(V_{ij})$.

Here, an exponent matrix in which the first four elements in the $(k_b+1)$-th column-block consist of a single 'a', a single '−1', and two '0's, as shown in Equations (6) and (7), may be classified as type A, and an exponent matrix in which the first four elements in the $(k_b+1)$-th column-block consist of two 'a's, a single '−1', and a single '0', as shown in Equations (8) and (9), may be classified as type B.

The exponent matrix illustrated in FIG. 3, which corresponds to the base matrix in FIG. 1, may correspond to the exponent matrix structure in Equation (6) or (8) because the third element in the first column of the matrix B' in FIG. 3 is '−1'. Also, the exponent matrix illustrated in FIG. 4, which corresponds to the base matrix in FIG. 2, may correspond to the exponent matrix structure in Equation (7) or (9) because the second element in the first column of the matrix B' in FIG. 4 is '−1'.

Therefore, the exponent matrices having the structure illustrated in FIG. 3 or FIG. 4 may be classified as type A or type B.

According to an embodiment of the present invention, parity check matrices of LDPC code that have different formats (types) may be transformed into parity check matrices in a single unified format. Here, the format of a parity check matrix indicates the structure of a submatrix corresponding to the parity of the parity check matrix, and when the structures of the submatrices corresponding to the parity are the same, an LDPC encoding/decoding process may be identically applied.

According to an embodiment of the present invention, exponent matrices in the format of Equation (8) or (9) (type B) are transformed into exponent matrices in the format of Equation (6) or (7) (type A). Hereinafter, for the convenience of description, the process of transforming an exponent matrix in the format of Equation (8) into an exponent matrix in the format of Equation (6) will be described in detail.

Similarly, according to the present invention, it is possible to transform an exponent matrix in the format of Equation (6) into an exponent matrix in the format of Equation (8).

Also, it is possible to transform an exponent matrix in the format of Equation (9) into an exponent matrix in the format of Equation (7) and vice versa by applying the similar process.

In a parity check matrix, "column permutation" means the effect of rearranging only the order of codeword bits. Therefore, the performance of code is not affected by the application of a column permutation. That is, the algebraic characteristics of a parity check matrix are not changed even though a column permutation is applied thereto. The present invention considers a method and apparatus for encoding and decoding based on quasi-cyclic LDPC code. Accordingly, a column permutation may be applied using the characteristics of quasi-cyclic LDPC code.

When a modulo operation using $Z_{max}$ is performed after '−a' is applied to all of the exponents for the $(k_b+1)$-th column-block, the result has the same effect as the application of a circular column permutation to the parity check matrix. This process may be represented as the following Equation (10):

$$V'_{ij}=(V_{ij}-a) \bmod Z_{max} \text{ for } 0 \le V_{ij} \le Z_{max}-1 \tag{10}$$

where $V'_{ij}$ denotes elements of the column-permutated exponent matrix, $V_{ij}$ denotes elements of a first exponent matrix, mod denotes a modulo operator, $Z_{max}$ denotes the maximum block size, and a is a natural number greater than 0.

The above Equation (10) is applied only to the $(k_b+1)$-th column-block.

Here, because $V_{ij}=-1$ means a zero matrix, regardless of the column permutation that is applied thereto, the result always becomes a zero matrix. That is, regardless of the exponent value that is added thereto or deleted therefrom, $V_{ij}=-1$ is maintained. Therefore, when a modulo operation for $Z_{max}$ is applied after '−a' is applied to exponent values that are not equal to −1, among the exponent values for the $(k_b+1)$-th column block in Equation (8), the result may be represented as shown in the following Equation (11):

$$V' = \tag{11}$$

$$(V'_{ij}) = \begin{bmatrix} V_{11} & \dots & V_{1k_b} & 0 & 0 & -1 & -1 & -1 & \dots & -1 \\ V_{21} & \dots & V_{2k_b} & Z_{max}-a & 0 & 0 & -1 & -1 & \dots & -1 \\ V_{31} & \dots & V_{3k_b} & -1 & -1 & 0 & 0 & -1 & \dots & -1 \\ V_{41} & \dots & V_{4k_b} & 0 & -1 & -1 & 0 & -1 & \dots & -1 \\ \vdots & \dots & \vdots & \vdots & \vdots & \vdots & \vdots & 0 & -1 & -1 \\ \vdots & \dots & \vdots & \vdots & \vdots & \vdots & \vdots & -1 & \ddots & -1 \\ \vdots & \dots & \vdots & \vdots & \vdots & \vdots & \vdots & -1 & -1 & 0 \end{bmatrix}$$

The present invention considers LDPC encoding and decoding for predetermined block size sets in Equation (5). Because block sizes included in each block set in Equation (5) are multiples of the preceding block sizes therein, even though a modulo operation for $Z_{max}$ is applied as shown in Equation (10), the algebraic characteristic are not changed.

Then, the following Equation (12) is applied to the exponent matrix $V'=(V'_{ij})$, which is transformed as shown in Equation (11), whereby $V_w=(W_{ij})$ is created.

$$W_{ij} = \begin{cases} V'_{ij}, & V'_{ij} = -1, 0, \\ Z_{max} - V'_{ij}, & V'_{ij} > 0 \end{cases}. \tag{12}$$

where $W_{ij}$ denotes elements of a second exponent matrix, $V'_{ij}$ denotes elements of the column-permutated exponent matrix, and $Z_{max}$ denotes the maximum block size.

In Equation (12), $Z_{max}$ may also denote the maximum block size in the block size set defined for applying the exponent matrix.

The finally created $V_w=(W_{ij})$ may be represented as the following Equation (13):

$$V_W = \tag{13}$$

$$\begin{bmatrix} Z_{max} & -V_{11} & \dots & Z_{max} & -V_{1k_b} & 0 & 0 & -1 & -1 & -1 & \dots & -1 \\ Z_{max} & -V_{21} & \dots & Z_{max} & -V_{2k_b} & a & 0 & 0 & -1 & -1 & \dots & -1 \\ Z_{max} & -V_{31} & \dots & Z_{max} & -V_{3k_b} & -1 & -1 & 0 & 0 & -1 & \dots & -1 \\ Z_{max} & -V_{41} & \dots & Z_{max} & -V_{4k_b} & 0 & -1 & -1 & 0 & -1 & \dots & -1 \\ & \vdots & \dots & \vdots & \vdots & & \vdots & \vdots & \vdots & 0 & -1 & -1 \\ & \vdots & \dots & \vdots & \vdots & & \vdots & \vdots & \vdots & -1 & \ddots & -1 \\ & \vdots & \dots & \vdots & \vdots & & \vdots & \vdots & \vdots & -1 & -1 & 0 \end{bmatrix}$$

In the structure of Equation (13), the first four elements in the $(k_b+1)$-th column-block of $V_w=(W_{ij})$ are 0, a, −1 and 0, and these are the same as the first four elements in the $(k_b+1)$-th column-block of the exponent matrix in Equation (6). That is, it may be understood that the exponent matrix of Equation (8) of type B is transformed into the exponent matrix of Equation (6) of type A.

When the above-described embodiment of the present invention is applied, the exponent matrix of Equation (6) (type A) and the exponent matrix of Equation (8) (type B) may be transformed into each other, and the exponent matrix of Equation (7) (type A) and the exponent matrix of Equation (9) (type B) may be transformed into each other.

As described above, if the basic graph is known, the exponent matrix of Equation (13) may be stored using the method of storing only exponent values that are not equal to −1 in order to reduce the amount of memory required for storage and to improve storage efficiency. Here, the exponent values that are not equal to −1 may be read column by column or row by row and then stored.

For example, when the exponent matrix corresponding to BG#1 in Table 1, FIG. 1, and FIG. 3, which is stored row by row, is transformed using Equations (10) and (12) and stored column by column, it may be represented as the following:

[BG#1—the efficient storage form of the result of transformation of Set 1 (column by column)]

Value of $V_w$=[6 254 150 135 99 51 73 36 144 153 179 96 79 50 216 249 196 105 192 144 61 128 40 35 129 219 89 99 107 117 187 145 167 154 20 212 252 74 158 215 214 160 192 214 183 7 100 233 231 170 161 254 95 58 83 89 105

107 30 17 71 107 109 13 69 97 139 172 62 249 8 207 70 170 117 83 132 193 236 97 89 20 41 91 99 156 185 139 135 246 163 106 234 120 152 59 105 34 27 125 225 96 105 184 140 79 89 107 99 152 79 13 89 207 129 62 119 197 83 161 39 105 117 93 27 217 120 228 147 235 191 32 86 183 99 89 146 36 170 189 235 224 207 209 140 215 65 154 10 25 45 173 201 23 114 144 49 93 247 114 37 12 114 22 193 248 68 136 36 147 31 45 152 198 92 74 20 57 151 61 124 31 50 195 92 205 233 114 16 228 154 74 129 197 147 93 101 11 180 245 242 240 255 98 97 107 66 51 12 99 195 249 181 101 104 172 136 105 83 221 1 5 92 109 75 0 17 139 112 45 40 71 205 125 225 228 244 133 147 178 27 112 85 193 45 0 1 0 142 16 5 103 97 35 85 154 84 0 0 234 194 134 0 0 166 247 135 119 0 0 77 250 195 117 0 0 0 0 0 0 0 0 0 0 0 0 0 0 0 0 0 0 0 0 0 0 0 0 0 0 0 0 0 0 0 0 0 0 0 0 0 0 0 0 0 0 0 0]

Alternatively, when the exponent matrix corresponding to BG#1 in Table 1, FIG. 1, and FIG. 3, which is stored row by row, is transformed using Equations (10) and (12) and stored row by row, it may be represented as the following:

[BG#1—the efficient storage form of the result of transformation of Set 1 (row by row)]

Value of $V_w$=[6 187 30 97 156 246 197 27 146 65 247 61 233 66 221 17 225 0 0 254 17 139 132 185 34 152 83 36 154 147 124 114 101 1 228 1 0 0 150 145 71 193 139 163 27 79 161 217 114 31 31 11 51 5 139 0 0 135 167 172 236 106 125 13 120 170 10 37 45 16 180 12 112 244 0 0 99 154 0 51 20 62 25 228 133 142 0 73 234 228 189 12 245 99 45 0 36 212 97 225 89 152 0 144 252 249 45 154 92 147 16 166 0 153 74 147 235 114 242 195 40 0 158 107 89 96 207 198 0 179 215 173 74 178 5 234 0 96 214 235 224 22 249 0 79 8 105 71 194 0 50 201 50 129 240 27 0 216 160 191 193 181 77 0 192 207 207 205 103 0 249 92 197 255 112 0 214 23 248 101 109 0 196 183 184 129 32 0 105 70 39 209 97 0 7 135 147 125 85 0 192 114 68 98 0 100 109 86 104 0 144 170 20 140 35 0 233 120 140 74 0 61 13 41 195 0 231 152 62 0 128 91 75 193 0 170 20 172 250 0 40 183 136 247 0 161 79 85 195 0 35 144 57 135 0 254 69 215 45 0 129 89 92 97 0 95 59 49 154 0 219 151 205 136 0 58 36 134 0 89 105 99 93 0 83 117 107 0 0 99 119 107 0 89 83 117 105 0 107 99 119 0 105 93 83 117 0 117 99 93 84 0 107 105 89 0]

When a lifting method depending on the block size Z is applied to the exponent matrix of Equation (13), parity check matrices suitable for various block sizes may be created and applied to LDPC encoding and decoding.

$$w_{ij}(Z)=W_{ij}(\text{mod } Z) \tag{14}$$

where Z denotes a block size.

Finally, the parity check matrix may be represented as the following Equation (15):

$$H_W(Z)=(w_{ij}(Z))= \tag{15}$$

$$\begin{bmatrix} P^{Z_{max}-v_{11}(Z)} & \dots & P^{Z_{max}-v_{1k_b}(Z)} & I & I & O & O & O & \dots & O \\ P^{Z_{max}-v_{21}(Z)} & \dots & P^{Z_{max}-v_{2k_b}(Z)} & P^a & I & I & O & O & \dots & O \\ P^{Z_{max}-v_{31}(Z)} & \dots & P^{Z_{max}-v_{3k_b}(Z)} & O & O & I & I & O & \dots & O \\ P^{Z_{max}-v_{41}(Z)} & \dots & P^{Z_{max}-v_{4k_b}(Z)} & I & O & O & I & O & \dots & O \\ \vdots & \dots & \vdots & \vdots & \vdots & \vdots & \vdots & I & O & O \\ \vdots & \dots & \vdots & \vdots & \vdots & \vdots & \vdots & O & \ddots & O \\ \vdots & \dots & \vdots & \vdots & \vdots & \vdots & \vdots & O & O & I \end{bmatrix}$$

where P denotes a circulant permutation matrix, I denotes an identity matrix, and O denotes a zero matrix.

FIG. 5 is a flowchart that shows a channel coding/decoding method according to an embodiment of the present invention.

Referring to FIG. 5, in the channel coding/decoding method according to an embodiment of the present invention, a first exponent matrix is loaded at step S510.

Also, in the channel coding/decoding method according to an embodiment of the present invention, the first exponent matrix is transformed into a second exponent matrix at step S520.

Here, step S520 may include performing a circular column permutation on one column of the first exponent matrix and thereby creating a column-permutated exponent matrix (Equation (10)); and creating conversion values for elements that are greater than 0 in the column-permutated exponent matrix and creating the second exponent matrix using the conversion values (Equation (12)).

Here, the one column may be the ($k_b$+1)-th column of the first exponent matrix (where $k_b$ is a natural number that is acquired by subtracting the number of rows in the first exponent matrix from the number of columns therein).

Here, the first exponent matrix ($V=(V_{ij})$) and the second exponent matrix ($V_w=(W_{ij})$) may be classified as two types, which are a first type (type A) and a second type (type B), depending on the first four elements in the ($k_b$+1)-th column of the first exponent matrix.

Here, when the first four elements include only one natural number a, which is greater than 0, the exponent matrix may be classified as the first type, and when the first four elements include two natural numbers (a), the exponent matrix may be classified as the second type.

Here, when the first exponent matrix is the first type, the second exponent matrix is the second type, and when the first exponent matrix is the second type, the second exponent matrix is the first type.

Here, a circular column permutation may be performed using the natural number a, which is greater than 0.

Here, the circular column permutation may be performed using Equation (10).

Here, the conversion value may be created by subtracting the element that is greater than 0 in the column-permutated exponent matrix from the maximum block size ($Z_{max}$).

Here, the second exponent matrix may be created using Equation (12).

Also, in the channel coding/decoding method according to an embodiment of the present invention, a parity check matrix corresponding to the required block size is created using the second exponent matrix at step S530.

Here, at step S530, the parity check matrix may be created using Equation (14), and the created parity check matrix may be represented as shown in Equation (15).

Also, in the channel coding/decoding method according to an embodiment of the present invention, LDPC encoding/decoding is performed using the parity check matrix at step S540.

Figure 6:
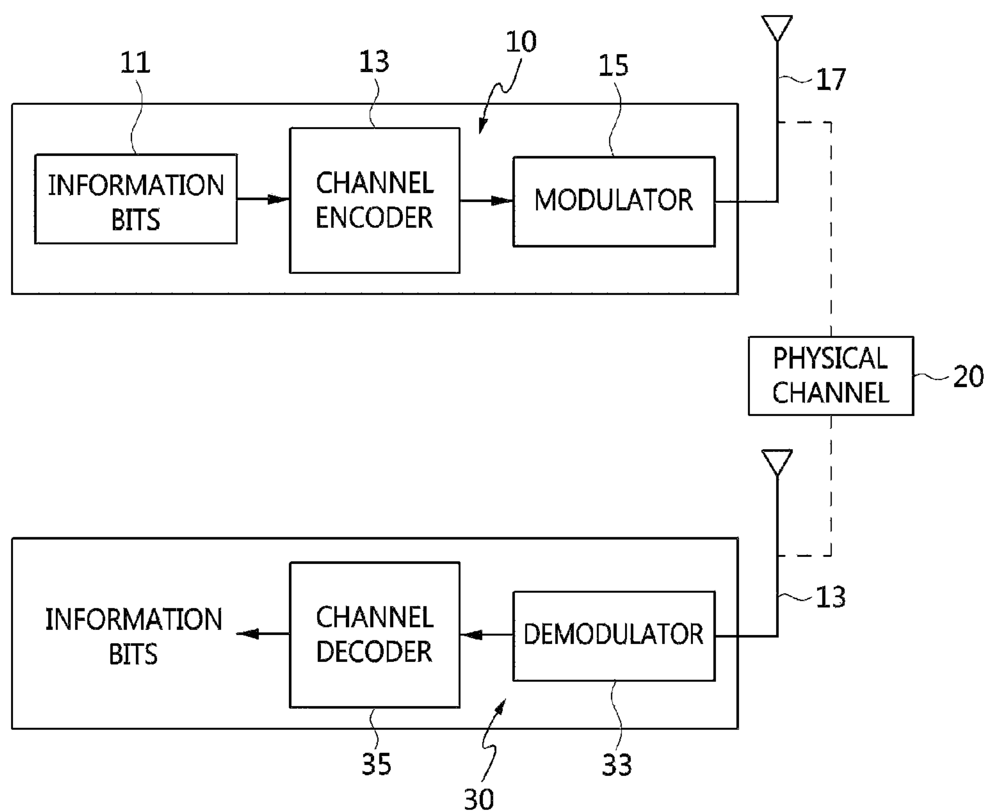
FIG. 6 is a block diagram that shows a communication system according to an embodiment of the present invention.

FIG. 6 is a block diagram that shows a communication system according to an embodiment of the present invention.

Referring to FIG. 6, in the communication system according to an embodiment of the present invention, a transmitter 10 and a receiver 30 communicate with each other via a physical channel 20.

The transmitter 10 creates n bits of codeword by encoding k bits of information bits 11 in a channel encoder 13. The codeword is modulated by a modulator 15 and transmitted through an antenna 17. The signal transmitted via the physical channel 20 is received by the antenna 31 of the receiver 30. In the receiver 30, the process performed in the transmitter 10 is performed in reverse order. That is, the received data is demodulated by a demodulator 33 and decoded by a channel decoder 35, whereby the information bits may be reconstructed.

The transmission/reception process described above includes minimal descriptive information in order to describe the characteristics of the present invention, and those skilled in the art to which the present invention pertains may understand that additional processes may be added for data transmission.

Particularly, the channel encoder and the channel decoder illustrated in FIG. 6 may transform the parity check matrix of given LDPC code and thereby create a new parity check matrix having similar algebraic characteristics, and may efficiently perform LDPC encoding/decoding through such transformation.

Figure 7:
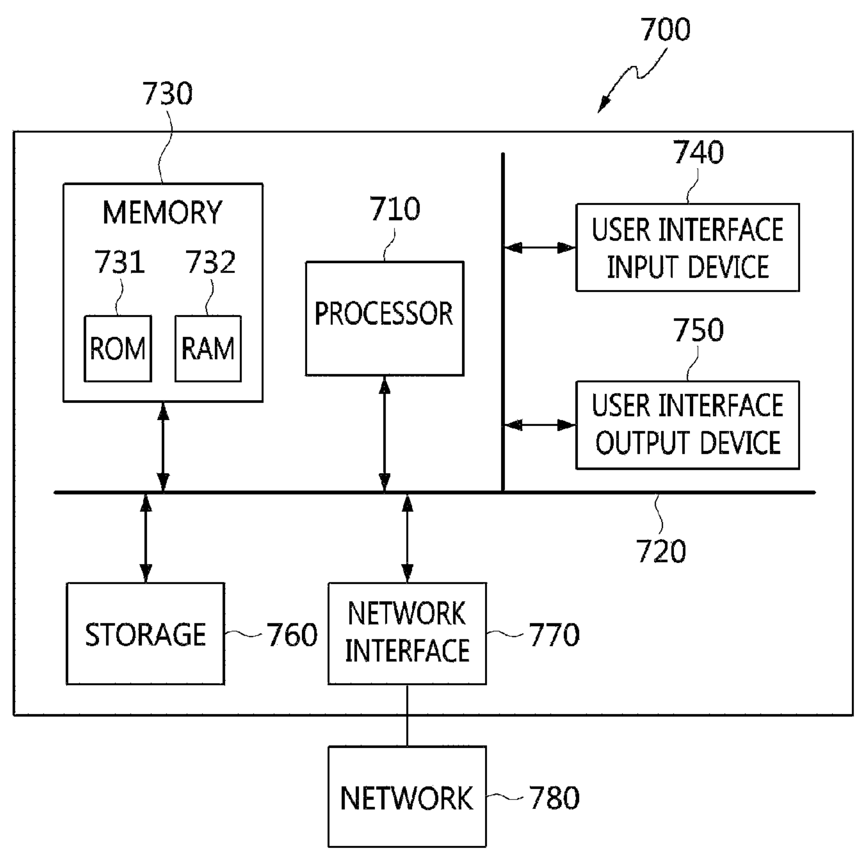
FIG. 7 is a block diagram that shows an example of the channel encoder or the channel decoder illustrated in FIG. 6.

FIG. 7 is a block diagram that shows an example of the channel encoder (or channel decoder) illustrated in FIG. 6.

Referring to FIG. 7, an example of the channel encoder (or channel decoder) may be implemented in a computer system 700. As illustrated in FIG. 7, the computer system 700 may include one or more processors 710, memory 730, a user-interface input device 740, a user-interface output device 750, and storage 760, which communicate with each other via a bus 720. The computer system 700 may further include a network interface 770 connected with a network 780. The processor 710 may be a central processing unit (CPU) or a semiconductor device for executing processing instructions stored in the memory 730 or the storage 760. The memory 730 and the storage 760 may be various types of volatile or nonvolatile storage media. For example, the memory 730 may include ROM 731 or RAM 732.

Here, the memory 730 may store data pertaining to the first exponent matrix corresponding to the original parity check matrix.

Here, the processor 710 may create a parity check matrix corresponding to the second exponent matrix, which is created by transforming the first exponent matrix, and may perform LDPC encoding (or LDPC decoding) using the created parity check matrix.

Here, the second exponent matrix is created using conversion values for elements that are greater than 0 in a column-permutated exponent matrix, and the column-permutated exponent matrix may be created by performing a circular column permutation on one column of the first exponent matrix.

Here, the one column may be the $(k_b+1)$-th column of the first exponent matrix (where $k_b$ is a natural number acquired by subtracting the number of rows in the first exponent matrix from the number of columns therein).

Here, the first exponent matrix and the second exponent matrix may be classified as two types, which are a first type (type A) and a second type (type B), depending on the first four elements in the $(k_b+1)$-th column of the first exponent matrix.

Here, when the first four elements include only one natural number a, which is greater than 0, the exponent matrix may be classified as the first type, and when the first four elements include two natural numbers (a), the exponent matrix may be classified as the second type.

Here, when the first exponent matrix is the first type, the second exponent matrix is the second type, and when the first exponent matrix is the second type, the second exponent matrix is the first type.

Here, a circular column permutation may be performed using the natural number a, which is greater than 0.

Here, the circular column permutation may be performed using Equation (10).

Here, the second exponent matrix may be created using Equation (12).

Accordingly, an embodiment of the present invention may be implemented as a nonvolatile computer-readable storage medium in which methods implemented using a computer or instructions executable in a computer are recorded. When the computer-readable instructions are executed by a processor, the computer-readable instructions may perform a method according to at least one aspect of the present invention.

Table 2 shows an example of the matrices A, B and C illustrated in FIG. 1, and Table 3 shows an example of the matrices A, B and C illustrated in FIG. 2.

That is, a basic graph may be formed in such a way that the matrices Z and D illustrated in FIG. 1 are added on the right side of the matrix illustrated in Table 2. Also, a basic graph may be formed in such a way that the matrices Z and D illustrated in FIG. 2 are added on the right side of the matrix illustrated in Table 3.

TABLE 2

| | | | | | | | | | | | | | | | | | | | | | | | | | |
|---|---|---|---|---|---|---|---|---|---|---|---|---|---|---|---|---|---|---|---|---|---|---|---|---|---|
| 1 | 1 | 1 | 1 | 0 | 1 | 1 | 0 | 0 | 1 | 1 | 1 | 1 | 1 | 0 | 1 | 1 | 0 | 1 | 1 | 1 | 1 | 1 | 1 | 0 | 0 |
| 1 | 0 | 1 | 1 | 1 | 1 | 0 | 1 | 1 | 1 | 0 | 1 | 1 | 0 | 1 | 1 | 1 | 1 | 0 | 1 | 0 | 1 | 1 | 1 | 1 | 0 |
| 1 | 1 | 1 | 0 | 1 | 1 | 1 | 1 | 1 | 1 | 1 | 0 | 0 | 1 | 1 | 1 | 0 | 1 | 1 | 1 | 1 | 0 | 0 | 0 | 1 | 1 |
| 1 | 1 | 0 | 1 | 1 | 0 | 1 | 1 | 1 | 0 | 1 | 1 | 1 | 1 | 1 | 0 | 1 | 1 | 1 | 0 | 1 | 1 | 1 | 0 | 0 | 1 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 1 | 0 | 0 | 0 | 0 | 0 | 0 | 0 | 0 | 1 | 0 | 0 | 0 | 1 | 0 | 0 | 0 | 0 | 1 | 1 | 0 | 0 | 0 |
| 1 | 0 | 0 | 0 | 0 | 0 | 1 | 0 | 0 | 0 | 1 | 1 | 0 | 1 | 0 | 0 | 0 | 1 | 1 | 0 | 1 | 0 | 0 | 0 | 0 | 0 |
| 1 | 1 | 0 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 |
| 1 | 1 | 0 | 1 | 0 | 0 | 0 | 0 | 0 | 0 | 0 | 0 | 1 | 0 | 0 | 0 | 1 | 0 | 0 | 1 | 0 | 1 | 1 | 0 | 1 | 0 |
| 1 | 1 | 0 | 0 | 0 | 0 | 0 | 0 | 0 | 0 | 1 | 1 | 0 | 1 | 0 | 0 | 0 | 1 | 1 | 0 | 1 | 0 | 0 | 0 | 0 | 0 |
| 0 | 1 | 1 | 0 | 1 | 0 | 0 | 1 | 1 | 0 | 0 | 0 | 0 | 0 | 1 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 1 | 0 | 0 | 0 | 1 | 0 | 0 | 0 | 0 | 1 | 1 | 1 | 0 | 0 |
| 1 | 1 | 0 | 0 | 0 | 0 | 0 | 0 | 0 | 0 | 1 | 1 | 0 | 1 | 0 | 0 | 0 | 0 | 1 | 0 | 0 | 0 | 0 | 0 | 0 | 0 |
| 1 | 0 | 0 | 1 | 0 | 0 | 0 | 1 | 0 | 0 | 0 | 0 | 0 | 0 | 0 | 0 | 0 | 0 | 0 | 0 | 1 | 0 | 0 | 1 | 0 | 0 |
| 1 | 0 | 0 | 0 | 0 | 0 | 0 | 0 | 0 | 0 | 0 | 0 | 1 | 0 | 0 | 1 | 1 | 1 | 0 | 0 | 0 | 1 | 0 | 0 | 0 | 0 |
| 1 | 1 | 0 | 0 | 0 | 0 | 0 | 0 | 0 | 0 | 1 | 0 | 0 | 1 | 0 | 0 | 0 | 0 | 1 | 0 | 0 | 0 | 0 | 0 | 0 | 1 |
| 0 | 1 | 0 | 1 | 0 | 0 | 0 | 0 | 0 | 0 | 0 | 1 | 0 | 0 | 0 | 0 | 0 | 0 | 0 | 0 | 1 | 0 | 1 | 0 | 0 | 0 |
| 1 | 0 | 0 | 0 | 0 | 0 | 0 | 0 | 0 | 0 | 0 | 0 | 0 | 0 | 1 | 0 | 1 | 1 | 0 | 0 | 0 | 1 | 0 | 0 | 0 | 0 |
| 0 | 1 | 0 | 0 | 0 | 0 | 0 | 0 | 0 | 0 | 0 | 0 | 1 | 1 | 0 | 0 | 0 | 0 | 1 | 1 | 0 | 0 | 0 | 0 | 0 | 0 |
| 1 | 1 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 |
| 1 | 0 | 0 | 1 | 0 | 0 | 0 | 0 | 0 | 1 | 0 | 1 | 0 | 0 | 0 | 0 | 0 | 0 | 0 | 0 | 0 | 0 | 1 | 0 | 0 | 0 |
| 0 | 1 | 0 | 0 | 0 | 1 | 0 | 0 | 0 | 0 | 0 | 0 | 0 | 0 | 0 | 0 | 1 | 0 | 0 | 0 | 1 | 1 | 0 | 0 | 0 | 0 |
| 1 | 0 | 0 | 0 | 0 | 0 | 0 | 0 | 0 | 0 | 0 | 0 | 1 | 1 | 0 | 0 | 0 | 1 | 0 | 0 | 0 | 0 | 0 | 0 | 0 | 0 |
| 0 | 1 | 1 | 0 | 0 | 0 | 0 | 0 | 0 | 0 | 1 | 0 | 0 | 0 | 0 | 0 | 0 | 0 | 1 | 0 | 0 | 0 | 0 | 0 | 0 | 0 |

TABLE 2-continued

| | | | | | | | | | | | | | | | | | | | | | | | | |
|---|---|---|---|---|---|---|---|---|---|---|---|---|---|---|---|---|---|---|---|---|---|---|---|---|
| 1 | 0 | 0 | 1 | 1 | 0 | 0 | 0 | 0 | 0 | 0 | 1 | 0 | 0 | 0 | 0 | 0 | 0 | 0 | 0 | 0 | 1 | 0 | 0 | 0 |
| 0 | 1 | 0 | 0 | 0 | 0 | 1 | 1 | 0 | 0 | 0 | 0 | 0 | 0 | 1 | 0 | 0 | 0 | 0 | 0 | 0 | 0 | 0 | 0 | 0 |
| 1 | 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 0 | 1 | 0 | 0 | 0 | 0 | 1 | 0 | 1 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 1 | 0 | 1 | 0 | 0 | 0 | 0 |
| 0 | 1 | 0 | 0 | 0 | 0 | 0 | 0 | 0 | 0 | 0 | 0 | 0 | 0 | 1 | 0 | 0 | 0 | 1 | 0 | 0 | 0 | 0 | 0 | 1 |
| 1 | 0 | 0 | 0 | 0 | 0 | 0 | 0 | 0 | 0 | 1 | 0 | 0 | 1 | 0 | 0 | 0 | 0 | 0 | 0 | 0 | 0 | 0 | 1 | 0 |
| 0 | 1 | 0 | 0 | 0 | 0 | 0 | 1 | 0 | 0 | 0 | 0 | 0 | 0 | 0 | 0 | 0 | 0 | 0 | 0 | 0 | 1 | 0 | 0 | 1 |
| 1 | 0 | 0 | 0 | 0 | 0 | 0 | 0 | 0 | 0 | 0 | 0 | 1 | 0 | 1 | 0 | 0 | 0 | 0 | 0 | 0 | 0 | 0 | 1 | 0 |
| 0 | 1 | 1 | 0 | 0 | 0 | 0 | 0 | 0 | 0 | 0 | 1 | 0 | 0 | 0 | 0 | 0 | 0 | 0 | 0 | 1 | 0 | 0 | 0 | 0 |
| 1 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 |
| 0 | 1 | 0 | 0 | 0 | 0 | 1 | 0 | 0 | 0 | 0 | 0 | 1 | 0 | 0 | 0 | 0 | 0 | 0 | 0 | 0 | 1 | 0 | 0 | 0 |
| 1 | 0 | 0 | 0 | 0 | 0 | 0 | 0 | 0 | 0 | 0 | 0 | 0 | 0 | 1 | 1 | 0 | 0 | 1 | 0 | 0 | 0 | 0 | 0 | 0 |
| 0 | 1 | 0 | 0 | 0 | 0 | 0 | 0 | 0 | 0 | 0 | 0 | 0 | 1 | 0 | 0 | 0 | 0 | 0 | 0 | 0 | 0 | 1 | 0 | 0 |
| 1 | 0 | 0 | 0 | 0 | 0 | 0 | 0 | 0 | 1 | 1 | 0 | 1 | 0 | 0 | 0 | 0 | 0 | 0 | 0 | 0 | 0 | 0 | 0 | 0 |
| 0 | 1 | 0 | 1 | 0 | 0 | 0 | 1 | 0 | 0 | 0 | 0 | 0 | 0 | 0 | 0 | 0 | 0 | 0 | 1 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 1 | 0 | 0 | 0 | 0 | 0 | 0 | 0 |
| 0 | 1 | 0 | 1 | 0 | 0 | 0 | 0 | 0 | 1 | 0 | 0 | 0 | 0 | 0 | 0 | 0 | 0 | 1 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 |
| 0 | 1 | 0 | 0 | 0 | 0 | 0 | 0 | 0 | 0 | 0 | 0 | 0 | 0 | 0 | 0 | 1 | 0 | 1 | 0 | 0 | 0 | 0 | 0 | 1 |
| 1 | 0 | 0 | 0 | 0 | 0 | 0 | 1 | 0 | 1 | 0 | 0 | 0 | 0 | 0 | 0 | 0 | 0 | 0 | 0 | 0 | 1 | 0 | 0 | 0 |
| 0 | 1 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 |

TABLE 3

| | | | | | | | | | | | | | |
|---|---|---|---|---|---|---|---|---|---|---|---|---|---|
| 1 | 1 | 1 | 1 | 0 | 0 | 1 | 0 | 0 | 1 | 1 | 1 | 0 | 0 |
| 1 | 0 | 0 | 1 | 1 | 1 | 1 | 1 | 1 | 1 | 0 | 1 | 1 | 0 |
| 1 | 1 | 0 | 1 | 1 | 0 | 0 | 0 | 1 | 0 | 1 | 0 | 1 | 1 |
| 0 | 1 | 1 | 0 | 1 | 1 | 1 | 1 | 1 | 1 | 1 | 0 | 0 | 1 |
| 1 | 1 | 0 | 0 | 0 | 0 | 0 | 0 | 0 | 0 | 0 | 1 | 0 | 0 |
| 1 | 1 | 0 | 0 | 0 | 1 | 0 | 1 | 0 | 0 | 0 | 1 | 0 | 0 |
| 1 | 0 | 0 | 0 | 0 | 1 | 0 | 1 | 0 | 1 | 0 | 1 | 0 | 0 |
| 0 | 1 | 0 | 0 | 0 | 1 | 0 | 1 | 0 | 0 | 0 | 1 | 0 | 1 |
| 1 | 1 | 0 | 0 | 0 | 0 | 0 | 0 | 0 | 0 | 0 | 0 | 1 | 0 |
| 0 | 1 | 0 | 0 | 0 | 0 | 0 | 0 | 1 | 0 | 1 | 1 | 0 | 0 |
| 1 | 1 | 0 | 0 | 0 | 0 | 1 | 1 | 0 | 0 | 0 | 0 | 0 | 0 |
| 1 | 0 | 0 | 0 | 0 | 0 | 0 | 1 | 0 | 1 | 0 | 0 | 0 | 1 |
| 0 | 1 | 0 | 1 | 0 | 0 | 0 | 0 | 0 | 0 | 0 | 1 | 0 | 0 |
| 1 | 1 | 0 | 0 | 0 | 0 | 0 | 0 | 1 | 0 | 0 | 0 | 0 | 1 |
| 0 | 1 | 0 | 0 | 0 | 0 | 1 | 0 | 0 | 0 | 0 | 1 | 0 | 1 |
| 1 | 0 | 0 | 0 | 0 | 0 | 0 | 0 | 0 | 0 | 1 | 1 | 0 | 0 |
| 0 | 1 | 0 | 0 | 0 | 0 | 0 | 0 | 0 | 1 | 0 | 1 | 1 | 0 |
| 0 | 1 | 0 | 0 | 0 | 1 | 0 | 0 | 0 | 0 | 0 | 1 | 1 | 0 |
| 1 | 0 | 0 | 0 | 0 | 0 | 1 | 1 | 0 | 0 | 0 | 0 | 0 | 0 |
| 1 | 1 | 0 | 0 | 0 | 0 | 0 | 0 | 0 | 0 | 1 | 0 | 0 | 0 |
| 0 | 1 | 0 | 0 | 1 | 0 | 0 | 0 | 0 | 0 | 0 | 1 | 0 | 0 |
| 1 | 0 | 0 | 0 | 0 | 0 | 0 | 0 | 1 | 0 | 0 | 0 | 0 | 1 |
| 0 | 1 | 1 | 0 | 0 | 0 | 0 | 0 | 0 | 0 | 0 | 0 | 0 | 0 |
| 1 | 0 | 0 | 1 | 0 | 1 | 0 | 0 | 0 | 0 | 0 | 0 | 0 | 0 |
| 0 | 1 | 1 | 0 | 0 | 0 | 0 | 0 | 0 | 1 | 0 | 0 | 0 | 0 |
| 1 | 0 | 0 | 0 | 0 | 1 | 0 | 0 | 0 | 0 | 0 | 0 | 0 | 0 |
| 0 | 0 | 1 | 0 | 0 | 0 | 0 | 1 | 0 | 0 | 0 | 0 | 1 | 1 |
| 1 | 0 | 0 | 0 | 0 | 0 | 1 | 0 | 0 | 0 | 0 | 0 | 0 | 0 |
| 0 | 1 | 1 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 |

TABLE 3-continued

| | | | | | | | | | | | | | |
|---|---|---|---|---|---|---|---|---|---|---|---|---|---|
| 0 | 0 | 1 | 0 | 0 | 1 | 0 | 1 | 0 | 1 | 0 | 0 | 0 | 0 |
| 0 | 1 | 0 | 0 | 0 | 0 | 0 | 0 | 0 | 0 | 0 | 0 | 0 | 1 |
| 1 | 0 | 0 | 0 | 0 | 1 | 0 | 0 | 0 | 0 | 0 | 0 | 1 | 0 |
| 0 | 0 | 1 | 0 | 0 | 0 | 0 | 1 | 0 | 0 | 1 | 0 | 0 | 0 |
| 1 | 0 | 0 | 0 | 0 | 0 | 0 | 0 | 0 | 0 | 0 | 0 | 1 | 1 |
| 0 | 1 | 0 | 0 | 0 | 1 | 0 | 0 | 0 | 0 | 0 | 1 | 0 | 0 |
| 1 | 0 | 1 | 0 | 0 | 0 | 0 | 1 | 0 | 0 | 0 | 0 | 0 | 0 |
| 0 | 0 | 0 | 0 | 0 | 0 | 0 | 0 | 0 | 0 | 1 | 0 | 0 | 1 |
| 0 | 1 | 0 | 0 | 0 | 1 | 0 | 0 | 0 | 0 | 0 | 1 | 0 | 0 |
| 1 | 0 | 0 | 0 | 0 | 0 | 0 | 1 | 0 | 0 | 0 | 0 | 1 | 0 |
| 0 | 0 | 1 | 0 | 0 | 0 | 0 | 0 | 0 | 0 | 1 | 0 | 0 | 1 |
| 0 | 1 | 0 | 0 | 0 | 1 | 0 | 0 | 0 | 0 | 0 | 1 | 0 | 0 |

Tables 4 to 11 show examples of the matrices A', B' and C' illustrated in FIG. 3.

That is, the matrices Z' and D' illustrated in FIG. 3 are added on the right side of the matrix shown in any one of Tables 4 to 11, whereby an exponent matrix may be formed.

Referring to Tables 4 to 11, ‘0’ or natural numbers are located at the positions at which ‘1’s are located in FIG. 1.

Table 4, Table 5, Table 6, Table 7, Table 8, Table 9, Table 10, and Table 11 may correspond to Set 1, Set 2, Set 3, Set 4, Set 5, Set 6, Set 7, and Set 8 in Equation (5), respectively.

Referring to the number of natural numbers (a) in the leftmost column of the 4×4 matrix in the top-right corner of Tables 4 to 11, Table 4 is type B, Table 5 is type B, Table 6 is type B, Table 7 is type B, Table 8 is type B, Table 9 is type B, Table 10 is type A, and Table 11 is type B.

TABLE 4

| | | | | | | | | | | | | | |
|---|---|---|---|---|---|---|---|---|---|---|---|---|---|
| 250 | 69 | 226 | 159 | −1 | 100 | 10 | −1 | −1 | 59 | 229 | 110 | 191 | 9 |
| 2 | −1 | 239 | 117 | 124 | 71 | −1 | 222 | 104 | 173 | −1 | 220 | 102 | −1 |
| 106 | 111 | 185 | −1 | 63 | 117 | 93 | 229 | 177 | 95 | 39 | −1 | −1 | 142 |
| 121 | 89 | −1 | 84 | 20 | −1 | 150 | 131 | 243 | −1 | 136 | 86 | 246 | 219 |
| 157 | 102 | −1 | −1 | −1 | −1 | −1 | −1 | −1 | −1 | −1 | −1 | −1 | −1 |
| 205 | 236 | −1 | 194 | −1 | −1 | −1 | −1 | −1 | −1 | −1 | −1 | 231 | −1 |
| 183 | −1 | −1 | −1 | −1 | −1 | 22 | −1 | −1 | −1 | 28 | 67 | −1 | 244 |
| 220 | 44 | −1 | −1 | 159 | −1 | −1 | 31 | 167 | −1 | −1 | −1 | −1 | −1 |
| 112 | 4 | −1 | 7 | −1 | −1 | −1 | −1 | −1 | −1 | −1 | −1 | 211 | −1 |
| 103 | 182 | −1 | −1 | −1 | −1 | −1 | −1 | −1 | −1 | 109 | 21 | −1 | 142 |
| −1 | 98 | 149 | −1 | 167 | −1 | −1 | 160 | 49 | −1 | −1 | −1 | −1 | −1 |
| 77 | 41 | −1 | −1 | −1 | −1 | −1 | −1 | −1 | −1 | −1 | −1 | 83 | −1 |
| 160 | 42 | −1 | −1 | −1 | −1 | −1 | −1 | −1 | −1 | 21 | 32 | −1 | 234 |
| 177 | −1 | −1 | 248 | −1 | −1 | −1 | 151 | −1 | −1 | −1 | −1 | −1 | −1 |
| 206 | −1 | −1 | −1 | −1 | −1 | −1 | −1 | −1 | −1 | −1 | −1 | 55 | −1 |
| 40 | 96 | −1 | −1 | −1 | −1 | −1 | −1 | −1 | −1 | 65 | −1 | −1 | 63 |
| −1 | 64 | −1 | 49 | −1 | −1 | −1 | −1 | −1 | −1 | −1 | 49 | −1 | −1 |
| 7 | −1 | −1 | −1 | −1 | −1 | −1 | −1 | −1 | −1 | −1 | −1 | −1 | −1 |

TABLE 4-continued

| | | | | | | | | | | | | | |
|---|---|---|---|---|---|---|---|---|---|---|---|---|---|
| −1 | 42 | −1 | −1 | −1 | −1 | −1 | −1 | −1 | −1 | −1 | −1 | 233 | 8 |
| 60 | 73 | −1 | −1 | −1 | −1 | −1 | 72 | 127 | −1 | 224 | −1 | −1 | −1 |
| 151 | −1 | −1 | 186 | −1 | −1 | −1 | −1 | −1 | 217 | −1 | 47 | −1 | −1 |
| −1 | 249 | −1 | −1 | −1 | 121 | −1 | −1 | −1 | −1 | −1 | −1 | −1 | −1 |
| 64 | −1 | −1 | −1 | −1 | −1 | −1 | −1 | −1 | −1 | −1 | −1 | 142 | 188 |
| −1 | 156 | 147 | −1 | −1 | −1 | −1 | −1 | −1 | −1 | 170 | −1 | −1 | −1 |
| 112 | −1 | −1 | 86 | 236 | −1 | −1 | −1 | −1 | −1 | −1 | 116 | −1 | −1 |
| −1 | 23 | −1 | −1 | −1 | −1 | 136 | 116 | −1 | −1 | −1 | −1 | −1 | −1 |
| 195 | −1 | 243 | −1 | 215 | −1 | −1 | −1 | −1 | −1 | −1 | −1 | −1 | −1 |
| −1 | 25 | −1 | −1 | −1 | −1 | 104 | −1 | 194 | −1 | −1 | −1 | −1 | −1 |
| 128 | −1 | −1 | −1 | 165 | −1 | −1 | −1 | −1 | −1 | −1 | −1 | −1 | −1 |
| −1 | 86 | −1 | −1 | −1 | −1 | −1 | −1 | −1 | −1 | −1 | −1 | −1 | −1 |
| 216 | −1 | −1 | −1 | −1 | −1 | −1 | −1 | −1 | −1 | 73 | −1 | −1 | 120 |
| −1 | 95 | −1 | −1 | −1 | −1 | −1 | 177 | −1 | −1 | −1 | −1 | −1 | −1 |
| 221 | −1 | −1 | −1 | −1 | −1 | −1 | −1 | −1 | −1 | −1 | −1 | 112 | −1 |
| −1 | 2 | 187 | −1 | −1 | −1 | −1 | −1 | −1 | −1 | −1 | 41 | −1 | −1 |
| 127 | −1 | −1 | −1 | −1 | −1 | −1 | 167 | −1 | −1 | −1 | −1 | −1 | −1 |
| −1 | 161 | −1 | −1 | −1 | −1 | 197 | −1 | −1 | −1 | −1 | −1 | 207 | −1 |
| 37 | −1 | −1 | −1 | −1 | −1 | −1 | −1 | −1 | −1 | −1 | −1 | −1 | −1 |
| −1 | 198 | −1 | −1 | −1 | −1 | −1 | −1 | −1 | −1 | −1 | −1 | −1 | 220 |
| 167 | −1 | −1 | −1 | −1 | −1 | −1 | −1 | −1 | 151 | 157 | −1 | 163 | −1 |
| −1 | 173 | −1 | 139 | −1 | −1 | −1 | 149 | −1 | −1 | −1 | −1 | −1 | −1 |
| 157 | −1 | −1 | −1 | −1 | −1 | −1 | −1 | 137 | −1 | −1 | −1 | −1 | −1 |
| −1 | 167 | −1 | 173 | −1 | −1 | −1 | −1 | −1 | 139 | −1 | −1 | −1 | −1 |
| 149 | −1 | −1 | −1 | 157 | −1 | −1 | −1 | −1 | −1 | −1 | −1 | −1 | −1 |
| −1 | 151 | −1 | −1 | −1 | −1 | −1 | −1 | −1 | −1 | −1 | −1 | −1 | −1 |
| 139 | −1 | −1 | −1 | −1 | −1 | −1 | 157 | −1 | 163 | −1 | −1 | −1 | −1 |
| −1 | 149 | −1 | −1 | −1 | −1 | 151 | −1 | −1 | −1 | 167 | −1 | −1 | −1 |

| | | | | | | | | | | | |
|---|---|---|---|---|---|---|---|---|---|---|---|
| −1 | 195 | 23 | −1 | 190 | 35 | 239 | 31 | 1 | 0 | −1 | −1 |
| 109 | 132 | 142 | 155 | −1 | 255 | −1 | 28 | 0 | 0 | 0 | −1 |
| 225 | 225 | −1 | 245 | 205 | 251 | 117 | −1 | −1 | −1 | 0 | 0 |
| 211 | −1 | 240 | 76 | 244 | −1 | 144 | 12 | 1 | −1 | −1 | 0 |
| −1 | −1 | −1 | −1 | −1 | −1 | −1 | −1 | −1 | −1 | −1 | −1 |
| −1 | −1 | 28 | −1 | −1 | −1 | −1 | 123 | 115 | −1 | −1 | −1 |
| −1 | −1 | −1 | 11 | 157 | −1 | 211 | −1 | −1 | −1 | −1 | −1 |
| 104 | −1 | −1 | −1 | −1 | −1 | −1 | −1 | −1 | −1 | −1 | −1 |
| −1 | −1 | 102 | −1 | −1 | 164 | −1 | 109 | 241 | −1 | 90 | −1 |
| −1 | −1 | −1 | 14 | 61 | −1 | 216 | −1 | −1 | −1 | −1 | −1 |
| 58 | −1 | −1 | −1 | −1 | −1 | −1 | −1 | −1 | −1 | −1 | −1 |
| −1 | −1 | 182 | −1 | −1 | −1 | −1 | 78 | 252 | 22 | −1 | −1 |
| −1 | −1 | −1 | −1 | 7 | −1 | −1 | −1 | −1 | −1 | −1 | −1 |
| −1 | −1 | −1 | −1 | −1 | −1 | 185 | −1 | −1 | 62 | −1 | −1 |
| −1 | 206 | 127 | 16 | −1 | −1 | −1 | 229 | −1 | −1 | −1 | −1 |
| −1 | −1 | −1 | −1 | 75 | −1 | −1 | −1 | −1 | −1 | −1 | 179 |
| −1 | −1 | −1 | −1 | −1 | −1 | 51 | −1 | 154 | −1 | −1 | −1 |
| 164 | −1 | 59 | 1 | −1 | −1 | −1 | 144 | −1 | −1 | −1 | −1 |
| −1 | −1 | −1 | −1 | 155 | 147 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 160 | −1 | −1 | −1 |
| −1 | −1 | 109 | −1 | −1 | −1 | 131 | 171 | −1 | −1 | −1 | −1 |
| −1 | −1 | −1 | 158 | −1 | −1 | −1 | −1 | −1 | −1 | −1 | −1 |
| −1 | −1 | −1 | −1 | 152 | −1 | −1 | −1 | −1 | −1 | −1 | −1 |
| −1 | −1 | −1 | −1 | −1 | −1 | −1 | −1 | 222 | −1 | −1 | −1 |
| 182 | −1 | −1 | −1 | −1 | −1 | −1 | −1 | −1 | −1 | −1 | −1 |
| −1 | 61 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 181 | −1 | 63 | −1 | −1 | −1 | −1 |
| 236 | −1 | −1 | −1 | 84 | −1 | −1 | −1 | −1 | −1 | −1 | 6 |
| −1 | −1 | −1 | −1 | −1 | −1 | −1 | −1 | −1 | −1 | 9 | −1 |
| −1 | −1 | −1 | −1 | −1 | −1 | −1 | −1 | 172 | −1 | −1 | 61 |
| 199 | −1 | −1 | −1 | −1 | −1 | −1 | −1 | −1 | −1 | 121 | −1 |
| −1 | −1 | −1 | −1 | −1 | −1 | −1 | 211 | −1 | −1 | −1 | −1 |
| −1 | 164 | −1 | 159 | −1 | −1 | −1 | −1 | −1 | −1 | −1 | −1 |
| −1 | −1 | −1 | −1 | −1 | −1 | −1 | −1 | 103 | −1 | −1 | −1 |
| 105 | 51 | −1 | −1 | 120 | −1 | −1 | −1 | −1 | −1 | −1 | −1 |
| −1 | −1 | −1 | −1 | −1 | −1 | −1 | −1 | −1 | 122 | −1 | −1 |
| −1 | −1 | −1 | −1 | −1 | −1 | −1 | −1 | −1 | −1 | −1 | −1 |
| −1 | −1 | −1 | −1 | −1 | 0 | −1 | −1 | −1 | −1 | −1 | −1 |
| −1 | −1 | −1 | 149 | −1 | −1 | −1 | −1 | −1 | −1 | −1 | −1 |
| −1 | −1 | −1 | −1 | 151 | −1 | −1 | −1 | −1 | −1 | −1 | −1 |
| −1 | −1 | −1 | −1 | −1 | −1 | −1 | −1 | −1 | −1 | 137 | −1 |
| −1 | −1 | 163 | −1 | 173 | −1 | −1 | −1 | −1 | −1 | −1 | 139 |
| −1 | −1 | −1 | −1 | −1 | −1 | −1 | −1 | 173 | −1 | −1 | −1 |
| −1 | −1 | −1 | −1 | −1 | −1 | −1 | −1 | −1 | −1 | −1 | −1 |

TABLE 5

| | | | | | | | | | | | | | |
|---|---|---|---|---|---|---|---|---|---|---|---|---|---|
| 307 | 19 | 50 | 369 | −1 | 181 | 216 | −1 | −1 | 317 | 288 | 109 | 17 | 357 |
| 76 | −1 | 76 | 73 | 288 | 144 | −1 | 331 | 331 | 178 | −1 | 295 | 342 | −1 |
| 205 | 250 | 328 | −1 | 332 | 256 | 161 | 267 | 160 | 63 | 129 | −1 | −1 | 200 |
| 276 | 87 | −1 | 0 | 275 | −1 | 199 | 153 | 56 | −1 | 132 | 305 | 231 | 341 |
| 332 | 181 | −1 | −1 | −1 | −1 | −1 | −1 | −1 | −1 | −1 | −1 | −1 | −1 |
| 195 | 14 | −1 | 115 | −1 | −1 | −1 | −1 | −1 | −1 | −1 | −1 | 166 | −1 |
| 278 | −1 | −1 | −1 | −1 | −1 | 257 | −1 | −1 | −1 | 1 | 351 | −1 | 92 |
| 9 | 62 | −1 | −1 | 316 | −1 | −1 | 333 | 290 | −1 | −1 | −1 | −1 | −1 |
| 307 | 179 | −1 | 165 | −1 | −1 | −1 | −1 | −1 | −1 | −1 | −1 | 18 | −1 |
| 366 | 232 | −1 | −1 | −1 | −1 | −1 | −1 | −1 | −1 | 321 | 133 | −1 | 57 |
| −1 | 101 | 339 | −1 | 274 | −1 | −1 | 111 | 383 | −1 | −1 | −1 | −1 | −1 |
| 48 | 102 | −1 | −1 | −1 | −1 | −1 | −1 | −1 | −1 | −1 | −1 | 8 | −1 |
| 77 | 186 | −1 | −1 | −1 | −1 | −1 | −1 | −1 | −1 | 174 | 232 | −1 | 50 |
| 313 | −1 | −1 | 177 | −1 | −1 | −1 | 266 | −1 | −1 | −1 | −1 | −1 | −1 |
| 142 | −1 | −1 | −1 | −1 | −1 | −1 | −1 | −1 | −1 | −1 | −1 | 248 | −1 |
| 241 | 2 | −1 | −1 | −1 | −1 | −1 | −1 | −1 | −1 | 210 | −1 | −1 | 318 |
| −1 | 13 | −1 | 338 | −1 | −1 | −1 | −1 | −1 | −1 | −1 | 57 | −1 | −1 |
| 260 | −1 | −1 | −1 | −1 | −1 | −1 | −1 | −1 | −1 | −1 | −1 | −1 | −1 |
| −1 | 130 | −1 | −1 | −1 | −1 | −1 | −1 | −1 | −1 | −1 | −1 | 163 | 280 |
| 145 | 213 | −1 | −1 | −1 | −1 | −1 | 344 | 242 | −1 | 197 | −1 | −1 | −1 |
| 187 | −1 | −1 | 206 | −1 | −1 | −1 | −1 | −1 | 264 | −1 | 341 | −1 | −1 |
| −1 | 205 | −1 | −1 | −1 | 102 | −1 | −1 | −1 | −1 | −1 | −1 | −1 | −1 |
| 30 | −1 | −1 | −1 | −1 | −1 | −1 | −1 | −1 | −1 | −1 | −1 | 11 | 233 |
| −1 | 24 | 89 | −1 | −1 | −1 | −1 | −1 | −1 | −1 | 61 | −1 | −1 | −1 |
| 298 | −1 | −1 | 158 | 235 | −1 | −1 | −1 | −1 | −1 | −1 | 339 | −1 | −1 |
| −1 | 72 | −1 | −1 | −1 | −1 | 17 | 383 | −1 | −1 | −1 | −1 | −1 | −1 |
| 71 | −1 | 81 | −1 | 76 | −1 | −1 | −1 | −1 | −1 | −1 | −1 | −1 | −1 |
| −1 | 194 | −1 | −1 | −1 | −1 | 194 | −1 | 101 | −1 | −1 | −1 | −1 | −1 |
| 222 | −1 | −1 | −1 | 19 | −1 | −1 | −1 | −1 | −1 | −1 | −1 | −1 | −1 |
| −1 | 252 | −1 | −1 | −1 | −1 | −1 | −1 | −1 | −1 | −1 | −1 | −1 | −1 |
| 159 | −1 | −1 | −1 | −1 | −1 | −1 | −1 | −1 | −1 | 229 | −1 | −1 | 260 |
| −1 | 100 | −1 | −1 | −1 | −1 | −1 | 215 | −1 | −1 | −1 | −1 | −1 | −1 |
| 102 | −1 | −1 | −1 | −1 | −1 | −1 | −1 | −1 | −1 | −1 | −1 | 201 | −1 |
| −1 | 323 | 8 | −1 | −1 | −1 | −1 | −1 | −1 | −1 | −1 | 361 | −1 | −1 |
| 230 | −1 | −1 | −1 | −1 | −1 | −1 | 148 | −1 | −1 | −1 | −1 | −1 | −1 |
| −1 | 320 | −1 | −1 | −1 | −1 | 335 | −1 | −1 | −1 | −1 | −1 | 2 | −1 |
| 210 | −1 | −1 | −1 | −1 | −1 | −1 | −1 | −1 | −1 | −1 | −1 | −1 | −1 |
| −1 | 269 | −1 | −1 | −1 | −1 | −1 | −1 | −1 | −1 | −1 | −1 | −1 | 82 |
| 185 | −1 | −1 | −1 | −1 | −1 | −1 | −1 | −1 | 177 | 289 | −1 | 214 | −1 |
| −1 | 258 | −1 | 93 | −1 | −1 | −1 | 346 | −1 | −1 | −1 | −1 | −1 | −1 |
| 175 | −1 | −1 | −1 | −1 | −1 | −1 | −1 | 37 | −1 | −1 | −1 | −1 | −1 |
| −1 | 52 | −1 | 314 | −1 | −1 | −1 | −1 | −1 | 139 | −1 | −1 | −1 | −1 |
| 113 | −1 | −1 | −1 | 14 | −1 | −1 | −1 | −1 | −1 | −1 | −1 | −1 | −1 |
| −1 | 113 | −1 | −1 | −1 | −1 | −1 | −1 | −1 | −1 | −1 | −1 | −1 | −1 |
| 80 | −1 | −1 | −1 | −1 | −1 | −1 | 78 | −1 | 163 | −1 | −1 | −1 | −1 |
| −1 | 135 | −1 | −1 | −1 | −1 | 149 | −1 | −1 | −1 | 15 | −1 | −1 | −1 |

| | | | | | | | | | | | |
|---|---|---|---|---|---|---|---|---|---|---|---|
| −1 | 215 | 106 | −1 | 242 | 180 | 330 | 346 | 1 | 0 | −1 | −1 |
| 217 | 99 | 354 | 114 | −1 | 331 | −1 | 112 | 0 | 0 | 0 | −1 |
| 88 | 53 | −1 | 131 | 240 | 205 | 13 | −1 | −1 | −1 | 0 | 0 |
| 212 | −1 | 304 | 300 | 271 | −1 | 39 | 357 | 1 | −1 | −1 | 0 |
| −1 | −1 | −1 | −1 | −1 | −1 | −1 | −1 | −1 | −1 | −1 | −1 |
| −1 | −1 | 241 | −1 | −1 | −1 | −1 | 51 | 157 | −1 | −1 | −1 |
| −1 | −1 | −1 | 253 | 18 | −1 | 225 | −1 | −1 | −1 | −1 | −1 |
| 114 | −1 | −1 | −1 | −1 | −1 | −1 | −1 | −1 | −1 | −1 | −1 |
| −1 | −1 | 39 | −1 | −1 | 224 | −1 | 368 | 67 | −1 | 170 | −1 |
| −1 | −1 | −1 | 303 | 63 | −1 | 82 | −1 | −1 | −1 | −1 | −1 |
| 354 | −1 | −1 | −1 | −1 | −1 | −1 | −1 | −1 | −1 | −1 | −1 |
| −1 | −1 | 47 | −1 | −1 | −1 | −1 | 188 | 334 | 115 | −1 | −1 |
| −1 | −1 | −1 | −1 | 74 | −1 | −1 | −1 | −1 | −1 | −1 | −1 |
| −1 | −1 | −1 | −1 | −1 | −1 | 115 | −1 | −1 | 370 | −1 | −1 |
| −1 | 137 | 89 | 347 | −1 | −1 | −1 | 12 | −1 | −1 | −1 | −1 |
| −1 | −1 | −1 | −1 | 55 | −1 | −1 | −1 | −1 | −1 | −1 | 269 |
| −1 | −1 | −1 | −1 | −1 | −1 | 289 | −1 | 57 | −1 | −1 | −1 |
| 303 | −1 | 81 | 358 | −1 | −1 | −1 | 375 | −1 | −1 | −1 | −1 |
| −1 | −1 | −1 | −1 | 132 | 4 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 59 | −1 | −1 | −1 |
| −1 | −1 | 328 | −1 | −1 | −1 | 213 | 97 | −1 | −1 | −1 | −1 |
| −1 | −1 | −1 | 22 | −1 | −1 | −1 | −1 | −1 | −1 | −1 | −1 |
| −1 | −1 | −1 | −1 | 27 | −1 | −1 | −1 | −1 | −1 | −1 | −1 |
| −1 | −1 | −1 | −1 | −1 | −1 | −1 | −1 | 234 | −1 | −1 | −1 |
| 312 | −1 | −1 | −1 | −1 | −1 | −1 | −1 | −1 | −1 | −1 | −1 |
| −1 | 136 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 244 | −1 | 274 | −1 | −1 | −1 | −1 |
| 5 | −1 | −1 | −1 | 147 | −1 | −1 | −1 | −1 | −1 | −1 | 78 |
| −1 | −1 | −1 | −1 | −1 | −1 | −1 | −1 | −1 | −1 | 90 | −1 |
| −1 | −1 | −1 | −1 | −1 | −1 | −1 | −1 | 258 | −1 | −1 | 256 |
| 175 | −1 | −1 | −1 | −1 | −1 | −1 | −1 | −1 | −1 | 287 | −1 |

TABLE 5-continued

| | | | | | | | | | | | |
|---|---|---|---|---|---|---|---|---|---|---|---|
| −1 | −1 | −1 | −1 | −1 | −1 | −1 | 105 | −1 | −1 | −1 | −1 |
| −1 | 202 | −1 | 312 | −1 | −1 | −1 | −1 | −1 | −1 | −1 | −1 |
| −1 | −1 | −1 | −1 | −1 | −1 | −1 | −1 | 266 | −1 | −1 | −1 |
| 313 | 297 | −1 | −1 | 21 | −1 | −1 | −1 | −1 | −1 | −1 | −1 |
| −1 | −1 | −1 | −1 | −1 | −1 | −1 | −1 | −1 | 115 | −1 | −1 |
| −1 | −1 | −1 | −1 | −1 | −1 | −1 | −1 | −1 | −1 | −1 | −1 |
| −1 | −1 | −1 | −1 | −1 | 297 | −1 | −1 | −1 | −1 | −1 | −1 |
| −1 | −1 | −1 | 312 | −1 | −1 | −1 | −1 | −1 | −1 | −1 | −1 |
| −1 | −1 | −1 | −1 | 288 | −1 | −1 | −1 | −1 | −1 | −1 | −1 |
| −1 | −1 | −1 | −1 | −1 | −1 | −1 | −1 | −1 | −1 | 218 | −1 |
| −1 | −1 | 132 | −1 | 114 | −1 | −1 | −1 | −1 | −1 | −1 | 168 |
| −1 | −1 | −1 | −1 | −1 | −1 | −1 | −1 | 274 | −1 | −1 | −1 |
| −1 | −1 | −1 | −1 | −1 | −1 | −1 | −1 | −1 | −1 | −1 | −1 |

TABLE 6

| | | | | | | | | | | | | | |
|---|---|---|---|---|---|---|---|---|---|---|---|---|---|
| 73 | 15 | 103 | 49 | −1 | 240 | 39 | −1 | −1 | 15 | 162 | 215 | 164 | 133 |
| 303 | −1 | 294 | 27 | 261 | 161 | −1 | 133 | 4 | 80 | −1 | 129 | 300 | −1 |
| 68 | 7 | 80 | −1 | 280 | 38 | 227 | 202 | 200 | 71 | 106 | −1 | −1 | 295 |
| 220 | 208 | −1 | 30 | 197 | −1 | 61 | 175 | 79 | −1 | 281 | 303 | 253 | 164 |
| 233 | 205 | −1 | −1 | −1 | −1 | −1 | −1 | −1 | −1 | −1 | −1 | −1 | −1 |
| 83 | 292 | −1 | 50 | −1 | −1 | −1 | −1 | −1 | −1 | −1 | −1 | 318 | −1 |
| 289 | −1 | −1 | −1 | −1 | −1 | 21 | −1 | −1 | −1 | 293 | 13 | −1 | 232 |
| 12 | 88 | −1 | −1 | 207 | −1 | −1 | 50 | 25 | −1 | −1 | −1 | −1 | −1 |
| 295 | 133 | −1 | 130 | −1 | −1 | −1 | −1 | −1 | −1 | −1 | −1 | 231 | −1 |
| 189 | 244 | −1 | −1 | −1 | −1 | −1 | −1 | −1 | −1 | 36 | 286 | −1 | 151 |
| −1 | 14 | 80 | −1 | 211 | −1 | −1 | 75 | 161 | −1 | −1 | −1 | −1 | −1 |
| 16 | 147 | −1 | −1 | −1 | −1 | −1 | −1 | −1 | −1 | −1 | −1 | 290 | −1 |
| 229 | 235 | −1 | −1 | −1 | −1 | −1 | −1 | −1 | −1 | 169 | 48 | −1 | 105 |
| 39 | −1 | −1 | 302 | −1 | −1 | −1 | 303 | −1 | −1 | −1 | −1 | −1 | −1 |
| 78 | −1 | −1 | −1 | −1 | −1 | −1 | −1 | −1 | −1 | −1 | −1 | 299 | −1 |
| 229 | 290 | −1 | −1 | −1 | −1 | −1 | −1 | −1 | −1 | 60 | −1 | −1 | 130 |
| −1 | 69 | −1 | 140 | −1 | −1 | −1 | −1 | −1 | −1 | −1 | 45 | −1 | −1 |
| 257 | −1 | −1 | −1 | −1 | −1 | −1 | −1 | −1 | −1 | −1 | −1 | −1 | −1 |
| −1 | 260 | −1 | −1 | −1 | −1 | −1 | −1 | −1 | −1 | −1 | −1 | 294 | 291 |
| 64 | 181 | −1 | −1 | −1 | −1 | −1 | 101 | 270 | −1 | 41 | −1 | −1 | −1 |
| 301 | −1 | −1 | 162 | −1 | −1 | −1 | −1 | −1 | 40 | −1 | 130 | −1 | −1 |
| −1 | 79 | −1 | −1 | −1 | 175 | −1 | −1 | −1 | −1 | −1 | −1 | −1 | −1 |
| 177 | −1 | −1 | −1 | −1 | −1 | −1 | −1 | −1 | −1 | −1 | −1 | 20 | 55 |
| −1 | 249 | 50 | −1 | −1 | −1 | −1 | −1 | −1 | −1 | 133 | −1 | −1 | −1 |
| 289 | −1 | −1 | 280 | 110 | −1 | −1 | −1 | −1 | −1 | −1 | 187 | −1 | −1 |
| −1 | 172 | −1 | −1 | −1 | −1 | 295 | 96 | −1 | −1 | −1 | −1 | −1 | −1 |
| 270 | −1 | 110 | −1 | 318 | −1 | −1 | −1 | −1 | −1 | −1 | −1 | −1 | −1 |
| −1 | 210 | −1 | −1 | −1 | −1 | 29 | −1 | 304 | −1 | −1 | −1 | −1 | −1 |
| 11 | −1 | −1 | −1 | 293 | −1 | −1 | −1 | −1 | −1 | −1 | −1 | −1 | −1 |
| −1 | 27 | −1 | −1 | −1 | −1 | −1 | −1 | −1 | −1 | −1 | −1 | −1 | −1 |
| 91 | −1 | −1 | −1 | −1 | −1 | −1 | −1 | −1 | −1 | 23 | −1 | −1 | 105 |
| −1 | 222 | −1 | −1 | −1 | −1 | −1 | 308 | −1 | −1 | −1 | −1 | −1 | −1 |
| 210 | −1 | −1 | −1 | −1 | −1 | −1 | −1 | −1 | −1 | −1 | −1 | 22 | −1 |
| −1 | 170 | 20 | −1 | −1 | −1 | −1 | −1 | −1 | −1 | −1 | 140 | −1 | −1 |
| 187 | −1 | −1 | −1 | −1 | −1 | −1 | 296 | −1 | −1 | −1 | −1 | −1 | −1 |
| −1 | 207 | −1 | −1 | −1 | −1 | 158 | −1 | −1 | −1 | −1 | −1 | 55 | −1 |
| 259 | −1 | −1 | −1 | −1 | −1 | −1 | −1 | −1 | −1 | −1 | −1 | −1 | −1 |
| 1 | 298 | −1 | −1 | −1 | −1 | −1 | −1 | −1 | −1 | −1 | −1 | −1 | 15 |
| 151 | −1 | −1 | −1 | −1 | −1 | −1 | −1 | −1 | 179 | 64 | −1 | 181 | −1 |
| −1 | 102 | −1 | 77 | −1 | −1 | −1 | 192 | −1 | −1 | −1 | −1 | −1 | −1 |
| 32 | −1 | −1 | −1 | −1 | −1 | −1 | −1 | 80 | −1 | −1 | −1 | −1 | −1 |
| −1 | 154 | −1 | 47 | −1 | −1 | −1 | −1 | −1 | 124 | −1 | −1 | −1 | −1 |
| 226 | −1 | −1 | −1 | 65 | −1 | −1 | −1 | −1 | −1 | −1 | −1 | −1 | −1 |
| −1 | 228 | −1 | −1 | −1 | −1 | −1 | −1 | −1 | −1 | −1 | −1 | −1 | −1 |
| 234 | −1 | −1 | −1 | −1 | −1 | −1 | 227 | −1 | 259 | −1 | −1 | −1 | −1 |
| −1 | 101 | −1 | −1 | −1 | −1 | 228 | −1 | −1 | −1 | 126 | −1 | −1 | −1 |

| | | | | | | | | | | | |
|---|---|---|---|---|---|---|---|---|---|---|---|
| −1 | 298 | 110 | −1 | 113 | 16 | 189 | 32 | 1 | 0 | −1 | −1 |
| 76 | 266 | 72 | 83 | −1 | 260 | −1 | 301 | 0 | 0 | 0 | −1 |
| 283 | 301 | −1 | 184 | 246 | 230 | 276 | −1 | −1 | −1 | 0 | 0 |
| 53 | −1 | 44 | 28 | 77 | −1 | 319 | 68 | 1 | −1 | −1 | 0 |
| −1 | −1 | −1 | −1 | −1 | −1 | −1 | −1 | −1 | −1 | −1 | −1 |
| −1 | −1 | 201 | −1 | −1 | −1 | −1 | 267 | 279 | −1 | −1 | −1 |
| −1 | −1 | −1 | 102 | 138 | −1 | 235 | −1 | −1 | −1 | −1 | −1 |
| 76 | −1 | −1 | −1 | −1 | −1 | −1 | −1 | −1 | −1 | −1 | −1 |
| −1 | −1 | 296 | −1 | −1 | 110 | −1 | 269 | 245 | −1 | 154 | −1 |
| −1 | −1 | −1 | 267 | 135 | −1 | 209 | −1 | −1 | −1 | −1 | −1 |
| 311 | −1 | −1 | −1 | −1 | −1 | −1 | −1 | −1 | −1 | −1 | −1 |
| −1 | −1 | 289 | −1 | −1 | −1 | −1 | 177 | 43 | 280 | −1 | −1 |
| −1 | −1 | −1 | −1 | 52 | −1 | −1 | −1 | −1 | −1 | −1 | −1 |
| −1 | −1 | −1 | −1 | −1 | −1 | 160 | −1 | −1 | 37 | −1 | −1 |

TABLE 6-continued

| −1 | 54 | 61 | 179 | −1 | −1 | −1 | 258 | −1 | −1 | −1 | −1 |
|---|---|---|---|---|---|---|---|---|---|---|---|
| −1 | −1 | −1 | −1 | 184 | −1 | −1 | −1 | −1 | −1 | −1 | 51 |
| −1 | −1 | −1 | −1 | −1 | −1 | 115 | −1 | 300 | −1 | −1 | −1 |
| 147 | −1 | 128 | 51 | −1 | −1 | −1 | 228 | −1 | −1 | −1 | −1 |
| −1 | −1 | −1 | −1 | 141 | 295 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 10 | −1 | −1 | −1 |
| −1 | −1 | 132 | −1 | −1 | −1 | 283 | 103 | −1 | −1 | −1 | −1 |
| −1 | −1 | −1 | 316 | −1 | −1 | −1 | −1 | −1 | −1 | −1 | −1 |
| −1 | −1 | −1 | −1 | 105 | −1 | −1 | −1 | −1 | −1 | −1 | −1 |
| −1 | −1 | −1 | −1 | −1 | −1 | −1 | −1 | 281 | −1 | −1 | −1 |
| 46 | −1 | −1 | −1 | −1 | −1 | −1 | −1 | −1 | −1 | −1 | −1 |
| −1 | 67 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 50 | −1 | 234 | −1 | −1 | −1 | −1 |
| 308 | −1 | −1 | −1 | 117 | −1 | −1 | −1 | −1 | −1 | −1 | 29 |
| −1 | −1 | −1 | −1 | −1 | −1 | −1 | −1 | −1 | −1 | 135 | −1 |
| −1 | −1 | −1 | −1 | −1 | −1 | −1 | −1 | 66 | −1 | −1 | 162 |
| 271 | −1 | −1 | −1 | −1 | −1 | −1 | −1 | −1 | −1 | 217 | −1 |
| −1 | −1 | −1 | −1 | −1 | −1 | −1 | 33 | −1 | −1 | −1 | −1 |
| −1 | 5 | −1 | 44 | −1 | −1 | −1 | −1 | −1 | −1 | −1 | −1 |
| −1 | −1 | −1 | −1 | −1 | −1 | −1 | −1 | 285 | −1 | −1 | −1 |
| 179 | 178 | −1 | −1 | 160 | −1 | −1 | −1 | −1 | −1 | −1 | −1 |
| −1 | −1 | −1 | −1 | −1 | −1 | −1 | −1 | −1 | 115 | −1 | −1 |
| −1 | −1 | −1 | −1 | −1 | −1 | −1 | −1 | −1 | −1 | −1 | −1 |
| −1 | −1 | −1 | −1 | −1 | 208 | −1 | −1 | −1 | −1 | −1 | −1 |
| −1 | −1 | −1 | 197 | −1 | −1 | −1 | −1 | −1 | −1 | −1 | −1 |
| −1 | −1 | −1 | −1 | 207 | −1 | −1 | −1 | −1 | −1 | −1 | −1 |
| −1 | −1 | −1 | −1 | −1 | −1 | −1 | −1 | −1 | −1 | 126 | −1 |
| −1 | −1 | 69 | −1 | 176 | −1 | −1 | −1 | −1 | −1 | −1 | 102 |
| −1 | −1 | −1 | −1 | −1 | −1 | −1 | −1 | 260 | −1 | −1 | −1 |
| −1 | −1 | −1 | −1 | −1 | −1 | −1 | −1 | −1 | −1 | −1 | −1 |

TABLE 7

| 223 | 16 | 94 | 91 | −1 | 74 | 10 | −1 | −1 | 0 | 205 | 216 | 21 | 215 |
|---|---|---|---|---|---|---|---|---|---|---|---|---|---|
| 141 | −1 | 45 | 151 | 46 | 119 | −1 | 157 | 133 | 87 | −1 | 206 | 93 | −1 |
| 207 | 203 | 31 | −1 | 176 | 180 | 186 | 95 | 153 | 177 | 70 | −1 | −1 | 77 |
| 201 | 18 | −1 | 165 | 5 | −1 | 45 | 142 | 16 | −1 | 34 | 155 | 213 | 147 |
| 170 | 10 | −1 | −1 | −1 | −1 | −1 | −1 | −1 | −1 | −1 | −1 | −1 | −1 |
| 164 | 59 | −1 | 86 | −1 | −1 | −1 | −1 | −1 | −1 | −1 | −1 | 80 | −1 |
| 158 | −1 | −1 | −1 | −1 | −1 | 119 | −1 | −1 | −1 | 113 | 21 | −1 | 63 |
| 17 | 76 | −1 | −1 | 104 | −1 | −1 | 100 | 150 | −1 | −1 | −1 | −1 | −1 |
| 33 | 95 | −1 | 4 | −1 | −1 | −1 | −1 | −1 | −1 | −1 | −1 | 217 | −1 |
| 9 | 37 | −1 | −1 | −1 | −1 | −1 | −1 | −1 | −1 | 213 | 105 | −1 | 89 |
| −1 | 82 | 165 | −1 | 174 | −1 | −1 | 19 | 194 | −1 | −1 | −1 | −1 | −1 |
| 57 | 11 | −1 | −1 | −1 | −1 | −1 | −1 | −1 | −1 | −1 | −1 | 2 | −1 |
| 142 | 175 | −1 | −1 | −1 | −1 | −1 | −1 | −1 | −1 | 136 | 3 | −1 | 28 |
| 81 | −1 | −1 | 56 | −1 | −1 | −1 | 72 | −1 | −1 | −1 | −1 | −1 | −1 |
| 14 | −1 | −1 | −1 | −1 | −1 | −1 | −1 | −1 | −1 | −1 | −1 | 175 | −1 |
| 90 | 120 | −1 | −1 | −1 | −1 | −1 | −1 | −1 | −1 | 131 | −1 | −1 | 209 |
| −1 | 154 | −1 | 164 | −1 | −1 | −1 | −1 | −1 | −1 | −1 | 43 | −1 | −1 |
| 56 | −1 | −1 | −1 | −1 | −1 | −1 | −1 | −1 | −1 | −1 | −1 | −1 | −1 |
| −1 | 199 | −1 | −1 | −1 | −1 | −1 | −1 | −1 | −1 | −1 | −1 | 110 | 200 |
| 8 | 6 | −1 | −1 | −1 | −1 | −1 | 103 | 198 | −1 | 8 | −1 | −1 | −1 |
| 105 | −1 | −1 | 210 | −1 | −1 | −1 | −1 | −1 | 121 | −1 | 214 | −1 | −1 |
| −1 | 192 | −1 | −1 | −1 | 131 | −1 | −1 | −1 | −1 | −1 | −1 | −1 | −1 |
| 53 | −1 | −1 | −1 | −1 | −1 | −1 | −1 | −1 | −1 | −1 | −1 | 0 | 3 |
| −1 | 88 | 203 | −1 | −1 | −1 | −1 | −1 | −1 | −1 | 168 | −1 | −1 | −1 |
| 49 | −1 | −1 | 157 | 64 | −1 | −1 | −1 | −1 | −1 | −1 | 193 | −1 | −1 |
| −1 | 1 | −1 | −1 | −1 | −1 | 166 | 65 | −1 | −1 | −1 | −1 | −1 | −1 |
| 107 | −1 | 176 | −1 | 212 | −1 | −1 | −1 | −1 | −1 | −1 | −1 | −1 | −1 |
| −1 | 208 | −1 | −1 | −1 | −1 | 141 | −1 | 174 | −1 | −1 | −1 | −1 | −1 |
| 146 | −1 | −1 | −1 | 153 | −1 | −1 | −1 | −1 | −1 | −1 | −1 | −1 | −1 |
| −1 | 150 | −1 | −1 | −1 | −1 | −1 | −1 | −1 | −1 | −1 | −1 | −1 | −1 |
| 34 | −1 | −1 | −1 | −1 | −1 | −1 | −1 | −1 | −1 | 130 | −1 | −1 | 210 |
| −1 | 175 | −1 | −1 | −1 | −1 | −1 | 49 | −1 | −1 | −1 | −1 | −1 | −1 |
| 192 | −1 | −1 | −1 | −1 | −1 | −1 | −1 | −1 | −1 | −1 | −1 | 209 | −1 |
| −1 | 114 | 49 | −1 | −1 | −1 | −1 | −1 | −1 | −1 | −1 | 161 | −1 | −1 |
| 82 | −1 | −1 | −1 | −1 | −1 | −1 | 186 | −1 | −1 | −1 | −1 | −1 | −1 |
| −1 | 192 | −1 | −1 | −1 | −1 | 173 | −1 | −1 | −1 | −1 | −1 | 26 | −1 |
| 222 | −1 | −1 | −1 | −1 | −1 | −1 | −1 | −1 | −1 | −1 | −1 | −1 | −1 |
| −1 | 81 | −1 | −1 | −1 | −1 | −1 | −1 | −1 | −1 | −1 | −1 | −1 | 195 |
| 123 | −1 | −1 | −1 | −1 | −1 | −1 | −1 | −1 | 90 | 73 | −1 | 10 | −1 |
| −1 | 12 | −1 | 77 | −1 | −1 | −1 | 49 | −1 | −1 | −1 | −1 | −1 | −1 |
| 67 | −1 | −1 | −1 | −1 | −1 | −1 | −1 | 45 | −1 | −1 | −1 | −1 | −1 |
| −1 | 23 | −1 | 215 | −1 | −1 | −1 | −1 | −1 | 60 | −1 | −1 | −1 | −1 |

TABLE 7-continued

| | | | | | | | | | | | | | |
|---|---|---|---|---|---|---|---|---|---|---|---|---|---|
| 114 | −1 | −1 | −1 | 91 | −1 | −1 | −1 | −1 | −1 | −1 | −1 | −1 | −1 |
| −1 | 206 | −1 | −1 | −1 | −1 | −1 | −1 | −1 | −1 | −1 | −1 | −1 | −1 |
| 84 | −1 | −1 | −1 | −1 | −1 | −1 | 4 | −1 | 9 | −1 | −1 | −1 | −1 |
| −1 | 184 | −1 | −1 | −1 | −1 | 121 | −1 | −1 | −1 | 251 | −1 | −1 | −1 |

| | | | | | | | | | | | |
|---|---|---|---|---|---|---|---|---|---|---|---|
| −1 | 14 | 70 | −1 | 141 | 198 | 104 | 81 | 1 | 0 | −1 | −1 |
| 79 | 9 | 118 | 194 | −1 | 31 | −1 | 187 | 0 | 0 | 0 | −1 |
| 214 | 77 | −1 | 198 | 117 | 223 | 90 | −1 | −1 | −1 | 0 | 0 |
| 69 | −1 | 96 | 74 | 99 | −1 | 30 | 158 | 1 | −1 | −1 | 0 |
| −1 | −1 | −1 | −1 | −1 | −1 | −1 | −1 | −1 | −1 | −1 | −1 |
| −1 | −1 | 182 | −1 | −1 | −1 | −1 | 130 | 153 | −1 | −1 | −1 |
| −1 | −1 | −1 | 51 | 136 | −1 | 116 | −1 | −1 | −1 | −1 | −1 |
| 158 | −1 | −1 | −1 | −1 | −1 | −1 | −1 | −1 | −1 | −1 | −1 |
| −1 | −1 | 204 | −1 | −1 | 39 | −1 | 58 | 44 | −1 | 201 | −1 |
| −1 | −1 | −1 | 185 | 109 | −1 | 218 | −1 | −1 | −1 | −1 | −1 |
| 103 | −1 | −1 | −1 | −1 | −1 | −1 | −1 | −1 | −1 | −1 | −1 |
| −1 | −1 | 35 | −1 | −1 | −1 | −1 | 32 | 84 | 201 | −1 | −1 |
| −1 | −1 | −1 | −1 | 182 | −1 | −1 | −1 | −1 | −1 | −1 | −1 |
| −1 | −1 | −1 | −1 | −1 | −1 | 217 | −1 | −1 | 78 | −1 | −1 |
| −1 | 211 | 191 | 51 | −1 | −1 | −1 | 43 | −1 | −1 | −1 | −1 |
| −1 | −1 | −1 | −1 | 209 | −1 | −1 | −1 | −1 | −1 | −1 | 81 |
| −1 | −1 | −1 | −1 | −1 | −1 | 189 | −1 | 101 | −1 | −1 | −1 |
| 110 | −1 | 200 | 63 | −1 | −1 | −1 | 4 | −1 | −1 | −1 | −1 |
| −1 | −1 | −1 | −1 | 143 | 186 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 183 | −1 | −1 | −1 |
| −1 | 1 | 220 | −1 | −1 | −1 | 50 | 106 | −1 | −1 | −1 | −1 |
| −1 | −1 | −1 | 148 | −1 | −1 | −1 | −1 | −1 | −1 | −1 | −1 |
| −1 | −1 | −1 | −1 | 122 | −1 | −1 | −1 | −1 | −1 | −1 | −1 |
| −1 | −1 | −1 | −1 | −1 | −1 | −1 | −1 | 124 | −1 | −1 | −1 |
| 81 | −1 | −1 | −1 | −1 | −1 | −1 | −1 | −1 | −1 | −1 | −1 |
| −1 | 127 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 217 | −1 | 114 | −1 | −1 | −1 | −1 |
| 11 | −1 | −1 | −1 | 53 | −1 | −1 | −1 | −1 | −1 | −1 | 68 |
| −1 | −1 | −1 | −1 | −1 | −1 | −1 | −1 | −1 | −1 | 123 | −1 |
| −1 | −1 | −1 | −1 | −1 | −1 | −1 | −1 | 177 | −1 | −1 | 128 |
| 58 | −1 | −1 | −1 | −1 | −1 | −1 | −1 | −1 | −1 | 30 | −1 |
| −1 | −1 | −1 | −1 | −1 | −1 | −1 | 137 | −1 | −1 | −1 | −1 |
| −1 | 68 | −1 | 150 | −1 | −1 | −1 | −1 | −1 | −1 | −1 | −1 |
| −1 | −1 | −1 | −1 | −1 | −1 | −1 | −1 | 187 | −1 | −1 | −1 |
| 157 | 0 | −1 | −1 | 6 | −1 | −1 | −1 | −1 | −1 | −1 | −1 |
| −1 | −1 | −1 | −1 | −1 | −1 | −1 | −1 | −1 | 138 | −1 | −1 |
| −1 | −1 | −1 | −1 | −1 | −1 | −1 | −1 | −1 | −1 | −1 | −1 |
| −1 | −1 | −1 | −1 | −1 | 114 | −1 | −1 | −1 | −1 | −1 | −1 |
| −1 | −1 | −1 | 96 | −1 | −1 | −1 | −1 | −1 | −1 | −1 | −1 |
| −1 | −1 | −1 | −1 | 167 | −1 | −1 | −1 | −1 | −1 | −1 | −1 |
| −1 | −1 | −1 | −1 | −1 | −1 | −1 | −1 | −1 | −1 | 78 | −1 |
| −1 | −1 | 22 | −1 | 134 | −1 | −1 | −1 | −1 | −1 | −1 | 161 |
| −1 | −1 | −1 | −1 | −1 | −1 | −1 | −1 | 12 | −1 | −1 | −1 |
| −1 | −1 | −1 | −1 | −1 | −1 | −1 | −1 | −1 | −1 | −1 | −1 |

TABLE 8

| | | | | | | | | | | | | | |
|---|---|---|---|---|---|---|---|---|---|---|---|---|---|
| 211 | 198 | 188 | 186 | −1 | 219 | 4 | −1 | −1 | 29 | 144 | 116 | 216 | 115 |
| 179 | −1 | 162 | 223 | 256 | 160 | −1 | 76 | 202 | 117 | −1 | 109 | 15 | −1 |
| 258 | 167 | 220 | −1 | 133 | 243 | 202 | 218 | 63 | 0 | 3 | −1 | −1 | 74 |
| 187 | 145 | −1 | 166 | 108 | −1 | 82 | 132 | 197 | −1 | 41 | 162 | 57 | 36 |
| 246 | 235 | −1 | −1 | −1 | −1 | −1 | −1 | −1 | −1 | −1 | −1 | −1 | −1 |
| 261 | 181 | −1 | 72 | −1 | −1 | −1 | −1 | −1 | −1 | −1 | −1 | 283 | −1 |
| 80 | −1 | −1 | −1 | −1 | −1 | 144 | −1 | −1 | −1 | 169 | 90 | −1 | 59 |
| 169 | 189 | −1 | −1 | 154 | −1 | −1 | 184 | 104 | −1 | −1 | −1 | −1 | −1 |
| 54 | 0 | −1 | 252 | −1 | −1 | −1 | −1 | −1 | −1 | −1 | −1 | 41 | −1 |
| 162 | 159 | −1 | −1 | −1 | −1 | −1 | −1 | −1 | −1 | 93 | 134 | −1 | 45 |
| −1 | 178 | 1 | −1 | 28 | −1 | −1 | 267 | 234 | −1 | −1 | −1 | −1 | −1 |
| 55 | 23 | −1 | −1 | −1 | −1 | −1 | −1 | −1 | −1 | −1 | −1 | 274 | −1 |
| 225 | 162 | −1 | −1 | −1 | −1 | −1 | −1 | −1 | −1 | 244 | 151 | −1 | 238 |
| 231 | −1 | −1 | 0 | −1 | −1 | −1 | 216 | −1 | −1 | −1 | −1 | −1 | −1 |
| 0 | −1 | −1 | −1 | −1 | −1 | −1 | −1 | −1 | −1 | −1 | −1 | 186 | −1 |
| 170 | 0 | −1 | −1 | −1 | −1 | −1 | −1 | −1 | −1 | 183 | −1 | −1 | 108 |
| −1 | 270 | −1 | 13 | −1 | −1 | −1 | −1 | −1 | −1 | −1 | 99 | −1 | −1 |
| 153 | −1 | −1 | −1 | −1 | −1 | −1 | −1 | −1 | −1 | −1 | −1 | −1 | −1 |
| −1 | 161 | −1 | −1 | −1 | −1 | −1 | −1 | −1 | −1 | −1 | −1 | 151 | 0 |
| 0 | 0 | −1 | −1 | −1 | −1 | −1 | 118 | 144 | −1 | 0 | −1 | −1 | −1 |
| 265 | −1 | −1 | 81 | −1 | −1 | −1 | −1 | −1 | 90 | −1 | 144 | −1 | −1 |
| −1 | 64 | −1 | −1 | −1 | 46 | −1 | −1 | −1 | −1 | −1 | −1 | −1 | −1 |
| 72 | −1 | −1 | −1 | −1 | −1 | −1 | −1 | −1 | −1 | −1 | −1 | 189 | 72 |

TABLE 8-continued

| −1 | 180 | 0 | −1 | −1 | −1 | −1 | −1 | −1 | −1 | 0 | −1 | −1 | −1 |
|---|---|---|---|---|---|---|---|---|---|---|---|---|---|
| 236 | −1 | −1 | 199 | 0 | −1 | −1 | −1 | −1 | −1 | −1 | 266 | −1 | −1 |
| −1 | 205 | −1 | −1 | −1 | −1 | 0 | 0 | −1 | −1 | −1 | −1 | −1 | −1 |
| 0 | −1 | 0 | −1 | 0 | −1 | −1 | −1 | −1 | −1 | −1 | −1 | −1 | −1 |
| −1 | 45 | −1 | −1 | −1 | −1 | 36 | −1 | 72 | −1 | −1 | −1 | −1 | −1 |
| 275 | −1 | −1 | −1 | 0 | −1 | −1 | −1 | −1 | −1 | −1 | −1 | −1 | −1 |
| −1 | 0 | −1 | −1 | −1 | −1 | −1 | −1 | −1 | −1 | −1 | −1 | −1 | −1 |
| 0 | −1 | −1 | −1 | −1 | −1 | −1 | −1 | −1 | −1 | 90 | −1 | −1 | 252 |
| −1 | 144 | −1 | −1 | −1 | −1 | −1 | 144 | −1 | −1 | −1 | −1 | −1 | −1 |
| 0 | −1 | −1 | −1 | −1 | −1 | −1 | −1 | −1 | −1 | −1 | −1 | 211 | −1 |
| −1 | 0 | 0 | −1 | −1 | −1 | −1 | −1 | −1 | −1 | −1 | 76 | −1 | −1 |
| 197 | −1 | −1 | −1 | −1 | −1 | −1 | 0 | −1 | −1 | −1 | −1 | −1 | −1 |
| −1 | 199 | −1 | −1 | −1 | −1 | 278 | −1 | −1 | −1 | −1 | −1 | 0 | −1 |
| 216 | −1 | −1 | −1 | −1 | −1 | −1 | −1 | −1 | −1 | −1 | −1 | −1 | −1 |
| −1 | 72 | −1 | −1 | −1 | −1 | −1 | −1 | −1 | −1 | −1 | −1 | −1 | 144 |
| 190 | −1 | −1 | −1 | −1 | −1 | −1 | −1 | −1 | 0 | 0 | −1 | 0 | −1 |
| −1 | 153 | −1 | 0 | −1 | −1 | −1 | 165 | −1 | −1 | −1 | −1 | −1 | −1 |
| 216 | −1 | −1 | −1 | −1 | −1 | −1 | −1 | 144 | −1 | −1 | −1 | −1 | −1 |
| −1 | 0 | −1 | 0 | −1 | −1 | −1 | −1 | −1 | 0 | −1 | −1 | −1 | −1 |
| 27 | −1 | −1 | −1 | 0 | −1 | −1 | −1 | −1 | −1 | −1 | −1 | −1 | −1 |
| −1 | 52 | −1 | −1 | −1 | −1 | −1 | −1 | −1 | −1 | −1 | −1 | −1 | −1 |
| 18 | −1 | −1 | −1 | −1 | −1 | −1 | 0 | −1 | 0 | −1 | −1 | −1 | −1 |
| −1 | 168 | −1 | −1 | −1 | −1 | 0 | −1 | −1 | −1 | 144 | −1 | −1 | −1 |

| −1 | 233 | 144 | −1 | 95 | 216 | 73 | 261 | 1 | 0 | −1 | −1 |
|---|---|---|---|---|---|---|---|---|---|---|---|
| 72 | 152 | 158 | 147 | −1 | 156 | −1 | 119 | 0 | 0 | 0 | −1 |
| 229 | 0 | −1 | 216 | 269 | 200 | 234 | −1 | −1 | −1 | 0 | 0 |
| 115 | −1 | 242 | 165 | 0 | −1 | 113 | 108 | 1 | −1 | −1 | 0 |
| −1 | −1 | −1 | −1 | −1 | −1 | −1 | −1 | −1 | −1 | −1 | −1 |
| −1 | −1 | 254 | −1 | −1 | −1 | −1 | 79 | 144 | −1 | −1 | −1 |
| −1 | −1 | −1 | 177 | 151 | −1 | 108 | −1 | −1 | −1 | −1 | −1 |
| 164 | −1 | −1 | −1 | −1 | −1 | −1 | −1 | −1 | −1 | −1 | −1 |
| −1 | −1 | 98 | −1 | −1 | 46 | −1 | 15 | 230 | −1 | 54 | −1 |
| −1 | −1 | −1 | 132 | 76 | −1 | 209 | −1 | −1 | −1 | −1 | −1 |
| 201 | −1 | −1 | −1 | −1 | −1 | −1 | −1 | −1 | −1 | −1 | −1 |
| −1 | −1 | 181 | −1 | −1 | −1 | −1 | 273 | 39 | 26 | −1 | −1 |
| −1 | −1 | −1 | −1 | 243 | −1 | −1 | −1 | −1 | −1 | −1 | −1 |
| −1 | −1 | −1 | −1 | −1 | −1 | 47 | −1 | −1 | 36 | −1 | −1 |
| −1 | 253 | 16 | 0 | −1 | −1 | −1 | 79 | −1 | −1 | −1 | −1 |
| −1 | −1 | −1 | −1 | 68 | −1 | −1 | −1 | −1 | −1 | −1 | 64 |
| −1 | −1 | −1 | −1 | −1 | −1 | 54 | −1 | 0 | −1 | −1 | −1 |
| 137 | −1 | 0 | 0 | −1 | −1 | −1 | 162 | −1 | −1 | −1 | −1 |
| −1 | −1 | −1 | −1 | 241 | 144 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 228 | −1 | −1 | −1 |
| −1 | −1 | 266 | −1 | −1 | −1 | 9 | 18 | −1 | −1 | −1 | −1 |
| −1 | −1 | −1 | 257 | −1 | −1 | −1 | −1 | −1 | −1 | −1 | −1 |
| −1 | −1 | −1 | −1 | 165 | −1 | −1 | −1 | −1 | −1 | −1 | −1 |
| −1 | −1 | −1 | −1 | −1 | −1 | −1 | −1 | 0 | −1 | −1 | −1 |
| 183 | −1 | −1 | −1 | −1 | −1 | −1 | −1 | −1 | −1 | −1 | −1 |
| −1 | 277 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 155 | −1 | 62 | −1 | −1 | −1 | −1 |
| 180 | −1 | −1 | −1 | 0 | −1 | −1 | −1 | −1 | −1 | −1 | 42 |
| −1 | −1 | −1 | −1 | −1 | −1 | −1 | −1 | −1 | −1 | 173 | −1 |
| −1 | −1 | −1 | −1 | −1 | −1 | −1 | −1 | 166 | −1 | −1 | 19 |
| 36 | −1 | −1 | −1 | −1 | −1 | −1 | −1 | −1 | −1 | 162 | −1 |
| −1 | −1 | −1 | −1 | −1 | −1 | −1 | 18 | −1 | −1 | −1 | −1 |
| −1 | 108 | −1 | 0 | −1 | −1 | −1 | −1 | −1 | −1 | −1 | −1 |
| −1 | −1 | −1 | −1 | −1 | −1 | −1 | −1 | 205 | −1 | −1 | −1 |
| 16 | 0 | −1 | −1 | 0 | −1 | −1 | −1 | −1 | −1 | −1 | −1 |
| −1 | −1 | −1 | −1 | −1 | −1 | −1 | −1 | −1 | 0 | −1 | −1 |
| −1 | −1 | −1 | −1 | −1 | −1 | −1 | −1 | −1 | −1 | −1 | −1 |
| −1 | −1 | −1 | −1 | −1 | 117 | −1 | −1 | −1 | −1 | −1 | −1 |
| −1 | −1 | −1 | 2 | −1 | −1 | −1 | −1 | −1 | −1 | −1 | −1 |
| −1 | −1 | −1 | −1 | 183 | −1 | −1 | −1 | −1 | −1 | −1 | −1 |
| −1 | −1 | −1 | −1 | −1 | −1 | −1 | −1 | −1 | −1 | 35 | −1 |
| −1 | −1 | 243 | −1 | 0 | −1 | −1 | −1 | −1 | −1 | −1 | 270 |
| −1 | −1 | −1 | −1 | −1 | −1 | −1 | −1 | 57 | −1 | −1 | −1 |
| −1 | −1 | −1 | −1 | −1 | −1 | −1 | −1 | −1 | −1 | −1 | −1 |

TABLE 9

| 294 | 118 | 167 | 330 | −1 | 207 | 165 | −1 | −1 | 243 | 250 | 1 | 339 | 201 |
|---|---|---|---|---|---|---|---|---|---|---|---|---|---|
| 77 | −1 | 225 | 96 | 338 | 268 | −1 | 112 | 302 | 50 | −1 | 167 | 253 | −1 |
| 226 | 35 | 213 | −1 | 302 | 111 | 265 | 128 | 237 | 294 | 127 | −1 | −1 | 110 |
| 97 | 94 | −1 | 49 | 279 | −1 | 139 | 166 | 91 | −1 | 106 | 246 | 345 | 269 |

TABLE 9-continued

| 42 | 256 | −1 | −1 | −1 | −1 | −1 | −1 | −1 | −1 | −1 | −1 | −1 | −1 |
|---|---|---|---|---|---|---|---|---|---|---|---|---|---|
| 219 | 130 | −1 | 251 | −1 | −1 | −1 | −1 | −1 | −1 | −1 | −1 | 322 | −1 |
| 294 | −1 | −1 | −1 | −1 | −1 | 73 | −1 | −1 | −1 | 330 | 99 | −1 | 172 |
| 3 | 103 | −1 | −1 | 224 | −1 | −1 | 297 | 215 | −1 | −1 | −1 | −1 | −1 |
| 348 | 75 | −1 | 22 | −1 | −1 | −1 | −1 | −1 | −1 | −1 | −1 | 312 | −1 |
| 156 | 88 | −1 | −1 | −1 | −1 | −1 | −1 | −1 | −1 | 293 | 111 | −1 | 92 |
| −1 | 175 | 253 | −1 | 27 | −1 | −1 | 231 | 49 | −1 | −1 | −1 | −1 | −1 |
| 25 | 322 | −1 | −1 | −1 | −1 | −1 | −1 | −1 | −1 | −1 | −1 | 200 | −1 |
| 123 | 217 | −1 | −1 | −1 | −1 | −1 | −1 | −1 | −1 | 142 | 110 | −1 | 176 |
| 311 | −1 | −1 | 251 | −1 | −1 | −1 | 265 | −1 | −1 | −1 | −1 | −1 | −1 |
| 22 | −1 | −1 | −1 | −1 | −1 | −1 | −1 | −1 | −1 | −1 | −1 | 322 | −1 |
| 176 | 348 | −1 | −1 | −1 | −1 | −1 | −1 | −1 | −1 | 15 | −1 | −1 | 81 |
| −1 | 190 | −1 | 293 | −1 | −1 | −1 | −1 | −1 | −1 | −1 | 332 | −1 | −1 |
| 110 | −1 | −1 | −1 | −1 | −1 | −1 | −1 | −1 | −1 | −1 | −1 | −1 | −1 |
| −1 | 47 | −1 | −1 | −1 | −14 | −1 | −1 | −1 | −1 | −1 | −1 | 286 | 246 |
| 87 | 110 | −1 | −1 | −1 | −1 | −1 | 147 | 258 | −1 | 204 | −1 | −1 | −1 |
| 89 | −1 | −1 | 65 | −1 | −1 | −1 | −1 | −1 | 155 | −1 | 244 | −1 | −1 |
| −1 | 162 | −1 | −1 | −1 | 264 | −1 | −1 | −1 | −1 | −1 | −1 | −1 | −1 |
| 280 | −1 | −1 | −1 | −1 | −1 | −1 | −1 | −1 | −1 | −1 | −1 | 157 | 236 |
| −1 | 18 | 6 | −1 | −1 | −1 | −1 | −1 | −1 | −1 | 181 | −1 | −1 | −1 |
| 38 | −1 | −1 | 170 | 249 | −1 | −1 | −1 | −1 | −1 | −1 | 288 | −1 | −1 |
| −1 | 279 | −1 | −1 | −1 | −1 | 255 | 111 | −1 | −1 | −1 | −1 | −1 | −1 |
| 325 | −1 | 326 | −1 | 226 | −1 | −1 | −1 | −1 | −1 | −1 | −1 | −1 | −1 |
| −1 | 91 | −1 | −1 | −1 | −1 | 326 | −1 | 268 | −1 | −1 | −1 | −1 | −1 |
| 102 | −1 | −1 | −1 | −1 | −1 | −1 | −1 | −1 | −1 | −1 | −1 | −1 | −1 |
| −1 | 273 | −1 | −1 | −1 | −1 | −1 | −1 | −1 | −1 | −1 | −1 | −1 | −1 |
| 171 | −1 | −1 | −1 | −1 | −1 | −1 | −1 | −1 | −1 | 16 | −1 | −1 | 95 |
| −1 | 101 | −1 | −1 | −1 | −1 | −1 | 297 | −1 | −1 | −1 | −1 | −1 | −1 |
| 351 | −1 | −1 | −1 | −1 | −1 | −1 | −1 | −1 | −1 | −1 | −1 | 265 | −1 |
| −1 | 56 | 304 | −1 | −1 | −1 | −1 | −1 | −1 | −1 | −1 | 141 | −1 | −1 |
| 60 | −1 | −1 | −1 | −1 | −1 | −1 | 320 | −1 | −1 | −1 | −1 | −1 | −1 |
| −1 | 100 | −1 | −1 | −1 | −1 | 210 | −1 | −1 | −1 | −1 | −1 | 195 | −1 |
| 135 | −1 | −1 | −1 | −1 | −1 | −1 | −1 | −1 | −1 | −1 | −1 | −1 | −1 |
| −1 | 319 | −1 | −1 | −1 | −1 | −1 | −1 | −1 | −1 | −1 | −1 | −1 | 236 |
| 164 | −1 | −1 | −1 | −1 | −1 | −1 | −1 | −1 | 196 | 209 | −1 | 246 | −1 |
| −1 | 236 | −1 | 264 | −1 | −1 | −1 | 37 | −1 | −1 | −1 | −1 | −1 | −1 |
| 304 | −1 | −1 | −1 | −1 | −1 | −1 | −1 | 237 | −1 | −1 | −1 | −1 | −1 |
| −1 | 123 | −1 | 77 | −1 | −1 | −1 | −1 | −1 | 25 | −1 | −1 | −1 | −1 |
| 288 | −1 | −1 | −1 | 83 | −1 | −1 | −1 | −1 | −1 | −1 | −1 | −1 | −1 |
| −1 | 210 | −1 | −1 | −1 | −1 | −1 | −1 | −1 | −1 | −1 | −1 | −1 | −1 |
| 79 | −1 | −1 | −1 | −1 | −1 | −1 | 244 | −1 | 293 | −1 | −1 | −1 | −1 |
| −1 | 82 | −1 | −1 | −1 | −1 | 67 | −1 | −1 | −1 | 235 | −1 | −1 | −1 |

| −1 | 53 | 347 | −1 | 304 | 167 | 47 | 188 | 1 | 0 | −1 | −1 |
|---|---|---|---|---|---|---|---|---|---|---|---|
| 334 | 242 | 257 | 133 | −1 | 9 | −1 | 302 | 0 | 0 | 0 | −1 |
| 286 | 125 | −1 | 131 | 163 | 210 | 7 | −1 | −1 | −1 | 0 | 0 |
| 185 | −1 | 249 | 215 | 143 | −1 | 121 | 121 | 1 | −1 | −1 | 0 |
| −1 | −1 | −1 | −1 | −1 | −1 | −1 | −1 | −1 | −1 | −1 | −1 |
| −1 | −1 | 295 | −1 | −1 | −1 | −1 | 258 | 283 | −1 | −1 | −1 |
| −1 | −1 | −1 | 150 | 284 | −1 | 305 | −1 | −1 | −1 | −1 | −1 |
| 39 | −1 | −1 | −1 | −1 | −1 | −1 | −1 | −1 | −1 | −1 | −1 |
| −1 | −1 | 224 | −1 | −1 | 17 | −1 | 59 | 314 | −1 | 244 | −1 |
| −1 | −1 | −1 | 152 | 23 | −1 | 337 | −1 | −1 | −1 | −1 | −1 |
| 267 | −1 | −1 | −1 | −1 | −1 | −1 | −1 | −1 | −1 | −1 | −1 |
| −1 | −1 | 351 | −1 | −1 | −1 | −1 | 166 | 338 | 192 | −1 | −1 |
| −1 | −1 | −1 | −1 | 76 | −1 | −1 | −1 | −1 | −1 | −1 | −1 |
| −1 | −1 | −1 | −1 | −1 | −1 | 94 | −1 | −1 | 81 | −1 | −1 |
| −1 | 277 | 156 | 66 | −1 | −1 | −1 | 78 | −1 | −1 | −1 | −1 |
| −1 | −1 | −1 | −1 | 176 | −1 | −1 | −1 | −1 | −1 | −1 | 113 |
| −1 | −1 | −1 | −1 | −1 | −1 | 331 | −1 | 114 | −1 | −1 | −1 |
| 228 | −1 | 247 | 116 | −1 | −1 | −1 | 190 | −1 | −1 | −1 | −1 |
| −1 | −1 | −1 | −1 | 181 | 73 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 30 | −1 | −1 | −1 |
| −1 | −1 | 346 | −1 | −1 | −1 | 143 | 109 | −1 | −1 | −1 | −1 |
| −1 | −1 | −1 | 113 | −1 | −1 | −1 | −1 | −1 | −1 | −1 | −1 |
| −1 | −1 | −1 | −1 | 304 | −1 | −1 | −1 | −1 | −1 | −1 | −1 |
| −1 | −1 | −1 | −1 | −1 | −1 | −1 | −1 | 194 | −1 | −1 | −1 |
| 54 | −1 | −1 | −1 | −1 | −1 | −1 | −1 | −1 | −1 | −1 | −1 |
| −1 | 99 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 40 | −1 | 167 | −1 | −1 | −1 | −1 |
| 104 | −1 | −1 | −1 | 243 | −1 | −1 | −1 | −1 | −1 | −1 | 107 |
| −1 | −1 | −1 | −1 | −1 | −1 | −1 | −1 | −1 | −1 | 212 | −1 |
| −1 | −1 | −1 | −1 | −1 | −1 | −1 | −1 | 279 | −1 | −1 | 222 |
| 338 | −1 | −1 | −1 | −1 | −1 | −1 | −1 | −1 | −1 | 83 | −1 |
| −1 | −1 | −1 | −1 | −1 | −1 | −1 | 101 | −1 | −1 | −1 | −1 |
| −1 | 112 | −1 | 54 | −1 | −1 | −1 | −1 | −1 | −1 | −1 | −1 |
| −1 | −1 | −1 | −1 | −1 | −1 | −1 | −1 | 268 | −1 | −1 | −1 |
| 15 | 35 | −1 | −1 | 188 | −1 | −1 | −1 | −1 | −1 | −1 | −1 |

TABLE 9-continued

| | | | | | | | | | | | |
|---|---|---|---|---|---|---|---|---|---|---|---|
| −1 | −1 | −1 | −1 | −1 | −1 | −1 | −1 | −1 | 85 | −1 | −1 |
| −1 | −1 | −1 | −1 | −1 | −1 | −1 | −1 | −1 | −1 | −1 | −1 |
| −1 | −1 | −1 | −1 | −1 | 272 | −1 | −1 | −1 | −1 | −1 | −1 |
| −1 | −1 | −1 | 135 | −1 | −1 | −1 | −1 | −1 | −1 | −1 | −1 |
| −1 | −1 | −1 | −1 | 272 | −1 | −1 | −1 | −1 | −1 | −1 | −1 |
| −1 | −1 | −1 | −1 | −1 | −1 | −1 | −1 | −1 | −1 | 17 | −1 |
| −1 | −1 | 3 | −1 | 53 | −1 | −1 | −1 | −1 | −1 | −1 | 167 |
| −1 | −1 | −1 | −1 | −1 | −1 | −1 | −1 | 222 | −1 | −1 | −1 |
| −1 | −1 | −1 | −1 | −1 | −1 | −1 | −1 | −1 | −1 | −1 | −1 |

TABLE 10

| | | | | | | | | | | | | | |
|---|---|---|---|---|---|---|---|---|---|---|---|---|---|
| 0 | 0 | 0 | 0 | −1 | 0 | 0 | −1 | −1 | 0 | 0 | 0 | 0 | 0 |
| 22 | −1 | 11 | 124 | 0 | 10 | −1 | 0 | 0 | 2 | −1 | 16 | 60 | −1 |
| 132 | 37 | 21 | −1 | 180 | 4 | 149 | 48 | 38 | 122 | 195 | −1 | −1 | 155 |
| 4 | 6 | −1 | 33 | 113 | −1 | 49 | 21 | 6 | −1 | 151 | 83 | 154 | 87 |
| 24 | 204 | −1 | −1 | −1 | −1 | −1 | −1 | −1 | −1 | −1 | −1 | −1 | −1 |
| 185 | 100 | −1 | 24 | −1 | −1 | −1 | −1 | −1 | −1 | −1 | −1 | 65 | −1 |
| 6 | −1 | −1 | −1 | −1 | −1 | 27 | −1 | −1 | −1 | 163 | 50 | −1 | 48 |
| 145 | 88 | −1 | −1 | 112 | −1 | −1 | 153 | 159 | −1 | −1 | −1 | −1 | −1 |
| 172 | 2 | −1 | 131 | −1 | −1 | −1 | −1 | −1 | −1 | −1 | −1 | 141 | −1 |
| 6 | 10 | −1 | −1 | −1 | −1 | −1 | −1 | −1 | −1 | 145 | 53 | −1 | 201 |
| −1 | 126 | 77 | −1 | 156 | −1 | −1 | 16 | 12 | −1 | −1 | −1 | −1 | −1 |
| 184 | 394 | −1 | −1 | −1 | −1 | −1 | −1 | −1 | −1 | −1 | −1 | 123 | −1 |
| 6 | 20 | −1 | −1 | −1 | −1 | −1 | −1 | −1 | −1 | 203 | 153 | −1 | 104 |
| 52 | −1 | −1 | 147 | −1 | −1 | −1 | −1 | −1 | −1 | −1 | −1 | −1 | −1 |
| 1 | −1 | −1 | −1 | −1 | −1 | −1 | −1 | −1 | −1 | −1 | −1 | 202 | −1 |
| 173 | 6 | −1 | −1 | −1 | −1 | −1 | −1 | −1 | −1 | 81 | −1 | −1 | 182 |
| −1 | 88 | −1 | 198 | −1 | −1 | −1 | −1 | −1 | −1 | −1 | 160 | −1 | −1 |
| 91 | −1 | −1 | −1 | −1 | −1 | −1 | −1 | −1 | −1 | −1 | −1 | −1 | −1 |
| −1 | 1 | −1 | −1 | −1 | −1 | −1 | −1 | −1 | −1 | −1 | −1 | 41 | 167 |
| 12 | 6 | −1 | −1 | −1 | −1 | −1 | 166 | 184 | −1 | 191 | −1 | −1 | −1 |
| 6 | −1 | −1 | 12 | −1 | −1 | −1 | −1 | −1 | 15 | −1 | 5 | −1 | −1 |
| −1 | 6 | −1 | −1 | −1 | 86 | −1 | −1 | −1 | −1 | −1 | −1 | −1 | −1 |
| 44 | −1 | −1 | −1 | −1 | −1 | −1 | −1 | −1 | −1 | −1 | −1 | 58 | 130 |
| −1 | 45 | 18 | −1 | −1 | −1 | −1 | −1 | −1 | −1 | 132 | −1 | −1 | −1 |
| 9 | −1 | −1 | 125 | 191 | −1 | −1 | −1 | −1 | −1 | −1 | 28 | −1 | −1 |
| −1 | 4 | −1 | −1 | −1 | −1 | 74 | 16 | −1 | −1 | −1 | −1 | −1 | −1 |
| 21 | −1 | 142 | −1 | 192 | −1 | −1 | −1 | −1 | −1 | −1 | −1 | −1 | −1 |
| −1 | 98 | −1 | −1 | −1 | −1 | 140 | −1 | 22 | −1 | −1 | −1 | −1 | −1 |
| 4 | −1 | −1 | −1 | −1 | −1 | −1 | −1 | −1 | −1 | −1 | −1 | −1 | −1 |
| −1 | 92 | −1 | −1 | −1 | −1 | −1 | −1 | −1 | −1 | −1 | −1 | −1 | −1 |
| 2 | −1 | −1 | −1 | −1 | −1 | −1 | −1 | −1 | −1 | 88 | −1 | −1 | 112 |
| −1 | 4 | −1 | −1 | −1 | −1 | −1 | 49 | −1 | −1 | −1 | −1 | −1 | −1 |
| 6 | −1 | −1 | −1 | −1 | −1 | −1 | −1 | −1 | −1 | −1 | −1 | 126 | −1 |
| −1 | 10 | 30 | −1 | −1 | −1 | −1 | −1 | −1 | −1 | −1 | 6 | −1 | −1 |
| 4 | −1 | −1 | −1 | −1 | −1 | −1 | 153 | −1 | −1 | −1 | −1 | −1 | −1 |
| −1 | 4 | −1 | −1 | −1 | −1 | 45 | −1 | −1 | −1 | −1 | −1 | 168 | −1 |
| 6 | −1 | −1 | −1 | −1 | −1 | −1 | −1 | −1 | −1 | −1 | −1 | −1 | −1 |
| −1 | 82 | −1 | −1 | −1 | −1 | −1 | −1 | −1 | −1 | −1 | −1 | −1 | 2 |
| 91 | −1 | −1 | −1 | −1 | −1 | −1 | −1 | −1 | 64 | 198 | −1 | 100 | −1 |
| −1 | 4 | −1 | 28 | −1 | −1 | −1 | 109 | −1 | −1 | −1 | −1 | −1 | −1 |
| 10 | −1 | −1 | −1 | −1 | −1 | −1 | −1 | 84 | −1 | −1 | −1 | −1 | −1 |
| −1 | 2 | −1 | 75 | −1 | −1 | −1 | −1 | −1 | 142 | −1 | −1 | −1 | −1 |
| 163 | −1 | −1 | −1 | 10 | −1 | −1 | −1 | −1 | −1 | −1 | −1 | −1 | −1 |
| −1 | 1 | −1 | −1 | −1 | −1 | −1 | −1 | −1 | −1 | −1 | −1 | −1 | −1 |
| 4 | −1 | −1 | −1 | −1 | −1 | −1 | 6 | −1 | 142 | −1 | −1 | −1 | −1 |
| −1 | 181 | −1 | −1 | −1 | −1 | 45 | −1 | −1 | −1 | 153 | −1 | −1 | −1 |

| | | | | | | | | | | | |
|---|---|---|---|---|---|---|---|---|---|---|---|
| −1 | 0 | 0 | −1 | 0 | 0 | 0 | 0 | 0 | 0 | −1 | −1 |
| 0 | 6 | 30 | 0 | −1 | 168 | −1 | 31 | 105 | 0 | 0 | −1 |
| 28 | 85 | −1 | 47 | 179 | 42 | 66 | −1 | −1 | −1 | 0 | 0 |
| 5 | −1 | 92 | 173 | 120 | −1 | 2 | 142 | 0 | −1 | −1 | 0 |
| −1 | −1 | −1 | −1 | −1 | −1 | −1 | −1 | −1 | −1 | −1 | −1 |
| −1 | −1 | 207 | −1 | −1 | −1 | −1 | 161 | 72 | −1 | −1 | −1 |
| −1 | −1 | −1 | 24 | 38 | −1 | 91 | −1 | −1 | −1 | −1 | −1 |
| 76 | −1 | −1 | −1 | −1 | −1 | −1 | −1 | −1 | −1 | −1 | −1 |
| −1 | −1 | 96 | −1 | −1 | 99 | −1 | 101 | 35 | −1 | 116 | −1 |
| −1 | −1 | −1 | 4 | 164 | −1 | 173 | −1 | −1 | −1 | −1 | −1 |
| 70 | −1 | −1 | −1 | −1 | −1 | −1 | −1 | −1 | −1 | −1 | −1 |
| −1 | −1 | 16 | −1 | −1 | −1 | −1 | 104 | 109 | 124 | −1 | −1 |
| −1 | −1 | −1 | −1 | 207 | −1 | −1 | −1 | −1 | −1 | −1 | −1 |
| −1 | −1 | −1 | −1 | −1 | −1 | 16 | −1 | −1 | 46 | −1 | −1 |
| −1 | 118 | 130 | 1 | −1 | −1 | −1 | 2 | −1 | −1 | −1 | −1 |
| −1 | −1 | −1 | −1 | 53 | −1 | −1 | −1 | −1 | −1 | −1 | 46 |
| −1 | −1 | −1 | −1 | −1 | −1 | 122 | −1 | 182 | −1 | −1 | −1 |
| 184 | −1 | 30 | 3 | −1 | −1 | −1 | 155 | −1 | −1 | −1 | −1 |

TABLE 10-continued

| | | | | | | | | | | | |
|---|---|---|---|---|---|---|---|---|---|---|---|
| −1 | −1 | −1 | −1 | 68 | 148 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 30 | −1 | −1 | −1 |
| −1 | −1 | 96 | −1 | −1 | −1 | 42 | 199 | −1 | −1 | −1 | −1 |
| −1 | −1 | −1 | 131 | −1 | −1 | −1 | −1 | −1 | −1 | −1 | −1 |
| −1 | −1 | −1 | −1 | 100 | −1 | −1 | −1 | −1 | −1 | −1 | −1 |
| −1 | −1 | −1 | −1 | −1 | −1 | −1 | −1 | 6 | −1 | −1 | −1 |
| 28 | −1 | −1 | −1 | −1 | −1 | −1 | −1 | −1 | −1 | −1 | −1 |
| −1 | 197 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 40 | −1 | 93 | −1 | −1 | −1 | −1 |
| 136 | −1 | −1 | −1 | 106 | −1 | −1 | −1 | −1 | −1 | −1 | 6 |
| −1 | −1 | −1 | −1 | −1 | −1 | −1 | −1 | −1 | −1 | 20 | −1 |
| −1 | −1 | −1 | −1 | −1 | −1 | −1 | −1 | 125 | −1 | −1 | 194 |
| 63 | −1 | −1 | −1 | −1 | −1 | −1 | −1 | −1 | −1 | 20 | −1 |
| −1 | −1 | −1 | −1 | −1 | −1 | −1 | 92 | −1 | −1 | −1 | −1 |
| −1 | 197 | −1 | 155 | −1 | −1 | −1 | −1 | −1 | −1 | −1 | −1 |
| −1 | −1 | −1 | −1 | −1 | −1 | −1 | −1 | 185 | −1 | −1 | −1 |
| 200 | 177 | −1 | −1 | 43 | −1 | −1 | −1 | −1 | −1 | −1 | −1 |
| −1 | −1 | −1 | −1 | −1 | −1 | −1 | −1 | −1 | 135 | −1 | −1 |
| −1 | −1 | −1 | −1 | −1 | −1 | −1 | −1 | −1 | −1 | −1 | −1 |
| −1 | −1 | −1 | −1 | −1 | 188 | −1 | −1 | −1 | −1 | −1 | −1 |
| −1 | −1 | −1 | 12 | −1 | −1 | −1 | −1 | −1 | −1 | −1 | −1 |
| −1 | −1 | −1 | −1 | 128 | −1 | −1 | −1 | −1 | −1 | −1 | −1 |
| −1 | −1 | −1 | −1 | −1 | −1 | −1 | −1 | −1 | −1 | 162 | −1 |
| −1 | −1 | 163 | −1 | 99 | −1 | −1 | −1 | −1 | −1 | −1 | 98 |
| −1 | −1 | −1 | −1 | −1 | −1 | −1 | −1 | 3 | −1 | −1 | −1 |
| −1 | −1 | −1 | −1 | −1 | −1 | −1 | −1 | −1 | −1 | −1 | −1 |

TABLE 11

| | | | | | | | | | | | | | |
|---|---|---|---|---|---|---|---|---|---|---|---|---|---|
| 135 | 227 | 126 | 134 | −1 | 84 | 83 | −1 | −1 | 53 | 225 | 205 | 128 | 75 |
| 96 | −1 | 236 | 136 | 221 | 128 | −1 | 92 | 172 | 56 | −1 | 11 | 189 | −1 |
| 189 | 4 | 225 | −1 | 151 | 236 | 117 | 179 | 92 | 24 | 68 | −1 | −1 | 6 |
| 128 | 23 | −1 | 162 | 220 | −1 | 43 | 186 | 96 | −1 | −1 | 216 | 22 | 24 |
| 64 | 211 | −1 | −1 | −1 | −1 | −1 | −1 | −1 | −1 | −1 | −1 | −1 | −1 |
| 2 | 171 | −1 | 47 | −1 | −1 | −1 | −1 | −1 | −1 | −1 | −1 | 143 | −1 |
| 199 | −1 | −1 | −1 | −1 | −1 | 22 | −1 | −1 | −1 | 23 | 100 | −1 | 92 |
| 77 | 146 | −1 | −1 | 209 | −1 | −1 | 32 | 166 | −1 | −1 | −1 | −1 | −1 |
| 181 | 105 | −1 | 141 | −1 | −1 | −1 | −1 | −1 | −1 | −1 | −1 | 223 | −1 |
| 169 | 12 | −1 | −1 | −1 | −1 | −1 | −1 | −1 | −1 | 206 | 221 | −1 | 17 |
| −1 | 116 | 151 | −1 | 70 | −1 | −1 | 230 | 115 | −1 | −1 | −1 | −1 | −1 |
| 45 | 115 | −1 | −1 | −1 | −1 | −1 | −1 | −1 | −1 | −1 | −1 | 134 | −1 |
| 186 | 215 | −1 | −1 | −1 | −1 | −1 | −1 | −1 | −1 | 124 | 180 | −1 | 98 |
| 220 | −1 | −1 | 185 | −1 | −1 | −1 | 154 | −1 | −1 | −1 | −1 | −1 | −1 |
| 124 | −1 | −1 | −1 | −1 | −1 | −1 | −1 | −1 | −1 | −1 | −1 | 144 | −1 |
| 39 | 138 | −1 | −1 | −1 | −1 | −1 | −1 | −1 | −1 | 220 | −1 | −1 | 173 |
| −1 | 78 | −1 | 152 | −1 | −1 | −1 | −1 | −1 | −1 | −1 | 84 | −1 | −1 |
| 183 | −1 | −1 | −1 | −1 | −1 | −1 | −1 | −1 | −1 | −1 | −1 | −1 | −1 |
| −1 | 183 | −1 | −1 | −1 | −1 | −1 | −1 | −1 | −1 | −1 | −1 | 215 | 180 |
| 179 | 108 | −1 | −1 | −1 | −1 | −1 | 159 | 138 | −1 | 196 | −1 | −1 | −1 |
| 77 | −1 | −1 | 187 | −1 | −1 | −1 | −1 | −1 | 203 | −1 | 167 | −1 | −1 |
| −1 | 197 | −1 | −1 | −1 | 122 | −1 | −1 | −1 | −1 | −1 | −1 | −1 | −1 |
| 25 | −1 | −1 | −1 | −1 | −1 | −1 | −1 | −1 | −1 | −1 | −1 | 47 | 126 |
| −1 | 185 | 127 | −1 | −1 | −1 | −1 | −1 | −1 | −1 | 117 | −1 | −1 | −1 |
| 32 | −1 | −1 | 178 | 2 | −1 | −1 | −1 | −1 | −1 | −1 | 156 | −1 | −1 |
| −1 | 27 | −1 | −1 | −1 | −1 | 141 | 11 | −1 | −1 | −1 | −1 | −1 | −1 |
| 163 | −1 | 131 | −1 | 169 | −1 | −1 | −1 | −1 | −1 | −1 | −1 | −1 | −1 |
| −1 | 165 | −1 | −1 | −1 | −1 | 232 | −1 | 9 | −1 | −1 | −1 | −1 | −1 |
| 32 | −1 | −1 | −1 | 43 | −1 | −1 | −1 | −1 | −1 | −1 | −1 | −1 | −1 |
| −1 | 232 | −1 | −1 | −1 | −1 | −1 | −1 | −1 | −1 | −1 | −1 | −1 | −1 |
| 170 | −1 | −1 | −1 | −1 | −1 | −1 | −1 | −1 | −1 | 199 | −1 | −1 | 26 |
| −1 | 73 | −1 | −1 | −1 | −1 | −1 | 149 | −1 | −1 | −1 | −1 | −1 | −1 |
| 103 | −1 | −1 | −1 | −1 | −1 | −1 | −1 | −1 | −1 | −1 | −1 | 110 | −1 |
| −1 | 199 | 132 | −1 | −1 | −1 | −1 | −1 | −1 | −1 | −1 | 172 | −1 | −1 |
| 161 | −1 | −1 | −1 | −1 | −1 | −1 | 237 | −1 | −1 | −1 | −1 | −1 | −1 |
| −1 | 231 | −1 | −1 | −1 | −1 | 174 | −1 | −1 | −1 | −1 | −1 | 145 | −1 |
| 11 | −1 | −1 | −1 | −1 | −1 | −1 | −1 | −1 | −1 | −1 | −1 | −1 | −1 |
| −1 | 59 | −1 | −1 | −1 | −1 | −1 | −1 | −1 | −1 | −1 | −1 | −1 | 204 |
| 121 | −1 | −1 | −1 | −1 | −1 | −1 | −1 | −1 | 90 | 26 | −1 | 140 | −1 |
| −1 | 115 | −1 | 188 | −1 | −1 | −1 | 168 | −1 | −1 | −1 | −1 | −1 | −1 |
| 4 | −1 | −1 | −1 | −1 | −1 | −1 | −1 | 103 | −1 | −1 | −1 | −1 | −1 |
| −1 | 53 | −1 | 189 | −1 | −1 | −1 | −1 | −1 | 215 | −1 | −1 | −1 | −1 |
| 222 | −1 | −1 | −1 | 170 | −1 | −1 | −1 | −1 | −1 | −1 | −1 | −1 | −1 |
| −1 | 22 | −1 | −1 | −1 | −1 | −1 | −1 | −1 | −1 | −1 | −1 | −1 | −1 |

TABLE 11-continued

| | | | | | | | | | | | | | |
|---|---|---|---|---|---|---|---|---|---|---|---|---|---|
| 191 | −1 | −1 | −1 | −1 | −1 | −1 | 211 | −1 | 187 | −1 | −1 | −1 | −1 |
| −1 | 177 | −1 | −1 | −1 | −1 | 114 | −1 | −1 | −1 | 93 | −1 | −1 | −1 |
| | | −1 | 135 | 217 | −1 | 220 | 90 | 105 | 137 | 1 | 0 | −1 | −1 |
| | | 95 | 85 | 153 | 87 | −1 | 163 | −1 | 216 | 0 | 0 | 0 | −1 |
| | | 101 | 33 | −1 | 96 | 125 | 67 | 230 | −1 | −1 | −1 | 0 | 0 |
| | | 167 | −1 | 200 | 32 | 235 | −1 | 172 | 219 | 1 | −1 | −1 | 0 |
| | | −1 | −1 | −1 | −1 | −1 | −1 | −1 | −1 | −1 | −1 | −1 | −1 |
| | | −1 | −1 | 210 | −1 | −1 | −1 | −1 | 180 | 180 | −1 | −1 | −1 |
| | | −1 | −1 | −1 | 207 | 52 | −1 | 13 | −1 | −1 | −1 | −1 | −1 |
| | | 18 | −1 | −1 | −1 | −1 | −1 | −1 | −1 | −1 | −1 | −1 | −1 |
| | | −1 | −1 | 177 | −1 | −1 | 145 | −1 | 199 | 153 | −1 | 38 | −1 |
| | | −1 | −1 | −1 | 212 | 92 | −1 | 205 | −1 | −1 | −1 | −1 | −1 |
| | | 84 | −1 | −1 | −1 | −1 | −1 | −1 | −1 | −1 | −1 | −1 | −1 |
| | | −1 | −1 | −1 | −1 | −1 | −1 | −1 | 152 | 165 | 107 | −1 | −1 |
| | | −1 | −1 | −1 | −1 | 80 | −1 | −1 | −1 | −1 | −1 | −1 | −1 |
| | | −1 | −1 | −1 | −1 | −1 | −1 | 178 | −1 | −1 | 150 | −1 | −1 |
| | | −1 | 182 | 95 | 72 | −1 | −1 | −1 | 76 | −1 | −1 | −1 | −1 |
| | | −1 | −1 | −1 | −1 | 142 | −1 | −1 | −1 | −1 | −1 | −1 | 49 |
| | | −1 | −1 | −1 | −1 | −1 | −1 | 5 | −1 | 205 | −1 | −1 | −1 |
| | | 112 | −1 | 106 | 219 | −1 | −1 | −1 | 129 | −1 | −1 | −1 | −1 |
| | | −1 | −1 | −1 | −1 | 143 | 14 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | −1 | −1 | −1 | 130 | −1 | −1 | −1 |
| | | −1 | −1 | 215 | −1 | −1 | −1 | 65 | 216 | −1 | −1 | −1 | −1 |
| | | −1 | −1 | −1 | 178 | −1 | −1 | −1 | −1 | −1 | −1 | −1 | −1 |
| | | −1 | −1 | −1 | −1 | 199 | −1 | −1 | −1 | −1 | −1 | −1 | −1 |
| | | −1 | −1 | −1 | −1 | −1 | −1 | −1 | −1 | 58 | −1 | −1 | −1 |
| | | 181 | −1 | −1 | −1 | −1 | −1 | −1 | −1 | −1 | −1 | −1 | −1 |
| | | −1 | 98 | −1 | −1 | −1 | −1 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | 200 | −1 | 205 | −1 | −1 | −1 | −1 |
| | | 32 | −1 | −1 | −1 | 118 | −1 | −1 | −1 | −1 | −1 | −1 | 103 |
| | | −1 | −1 | −1 | −1 | −1 | −1 | −1 | −1 | −1 | −1 | 105 | −1 |
| | | −1 | −1 | −1 | −1 | −1 | −1 | −1 | −1 | 175 | −1 | −1 | 108 |
| | | 151 | −1 | −1 | −1 | −1 | −1 | −1 | −1 | −1 | −1 | 211 | −1 |
| | | −1 | −1 | −1 | −1 | −1 | −1 | −1 | 65 | −1 | −1 | −1 | −1 |
| | | −1 | 142 | −1 | 180 | −1 | −1 | −1 | −1 | −1 | −1 | −1 | −1 |
| | | −1 | −1 | −1 | −1 | −1 | −1 | −1 | −1 | 100 | −1 | −1 | −1 |
| | | 207 | 42 | −1 | −1 | 100 | −1 | −1 | −1 | −1 | −1 | −1 | −1 |
| | | −1 | −1 | −1 | −1 | −1 | −1 | −1 | −1 | −1 | 161 | −1 | −1 |
| | | −1 | −1 | −1 | −1 | −1 | −1 | −1 | −1 | −1 | −1 | −1 | −1 |
| | | −1 | −1 | −1 | −1 | −1 | 52 | −1 | −1 | −1 | −1 | −1 | −1 |
| | | −1 | −1 | −1 | 30 | −1 | −1 | −1 | −1 | −1 | −1 | −1 | −1 |
| | | −1 | −1 | −1 | −1 | 24 | −1 | −1 | −1 | −1 | −1 | −1 | −1 |
| | | −1 | −1 | −1 | −1 | −1 | −1 | −1 | −1 | −1 | −1 | 71 | −1 |
| | | −1 | −1 | 127 | −1 | 49 | −1 | −1 | −1 | −1 | −1 | −1 | 125 |
| | | −1 | −1 | −1 | −1 | −1 | −1 | −1 | −1 | 148 | −1 | −1 | −1 |
| | | −1 | −1 | −1 | −1 | −1 | −1 | −1 | −1 | −1 | −1 | −1 | −1 |

Tables 12 to 19 show examples of the matrices A', B' and C' illustrated in FIG. 4.

That is, the matrices Z' and D' illustrated in FIG. 4 are added on the right side of the matrix shown in any one of Tables 12 to 19, whereby an exponent matrix may be formed.

Referring to Tables 12 to 19, ‘0’ or natural numbers are located at positions at which ‘1’s are located in FIG. 2.

Table 12, Table 13, Table 14, Table 15, Table 16, Table 17, Table 18, and Table 19 may correspond to Set 1, Set 2, Set 3, Set 4, Set 5, Set 6, Set 7, and Set 8 in Equation (5), respectively.

Referring to the number of natural numbers (a) in the leftmost column of the 4×4 matrix in the top-right corner of Tables 12 to 19, Table 12 is type A, Table 13 is type A, Table 14 is type A, Table 15 is type B, Table 16 is type A, Table 17 is type A, Table 18 is type A, and Table 19 is type B.

TABLE 12

| | | | | | | | | | | | | | |
|---|---|---|---|---|---|---|---|---|---|---|---|---|---|
| 9 | 117 | 204 | 26 | −1 | −1 | 189 | −1 | −1 | 205 | 0 | 0 | −1 | −1 |
| 167 | −1 | −1 | 166 | 253 | 125 | 226 | 156 | 224 | 252 | −1 | 0 | 0 | −1 |
| 81 | 114 | −1 | 44 | 52 | −1 | −1 | −1 | 240 | −1 | 1 | −1 | 0 | 0 |
| −1 | 8 | 58 | −1 | 158 | 104 | 209 | 54 | 18 | 128 | 0 | −1 | −1 | 0 |
| 179 | 214 | −1 | −1 | −1 | −1 | −1 | −1 | −1 | −1 | −1 | 71 | −1 | −1 |
| 231 | 41 | −1 | −1 | −1 | 194 | −1 | 159 | −1 | −1 | −1 | 103 | −1 | −1 |
| 155 | −1 | −1 | −1 | −1 | 228 | −1 | 45 | −1 | 28 | −1 | 158 | −1 | −1 |
| −1 | 129 | −1 | −1 | −1 | 147 | −1 | 140 | −1 | −1 | −1 | 3 | −1 | 116 |
| 142 | 94 | −1 | −1 | −1 | −1 | −1 | −1 | −1 | −1 | −1 | −1 | 230 | −1 |
| −1 | 203 | −1 | −1 | −1 | −1 | −1 | −1 | 205 | −1 | 61 | 247 | −1 | −1 |
| 11 | 185 | −1 | −1 | −1 | −1 | 0 | 117 | −1 | −1 | −1 | −1 | −1 | −1 |
| 11 | −1 | −1 | −1 | −1 | −1 | −1 | 236 | −1 | 210 | −1 | −1 | −1 | 56 |
| −1 | 63 | −1 | 111 | −1 | −1 | −1 | −1 | −1 | −1 | −1 | 14 | −1 | −1 |
| 83 | 2 | −1 | −1 | −1 | −1 | −1 | −1 | 38 | −1 | −1 | −1 | −1 | 222 |

TABLE 12-continued

| | | | | | | | | | | | | | |
|---|---|---|---|---|---|---|---|---|---|---|---|---|---|
| −1 | 115 | −1 | −1 | −1 | −1 | 145 | −1 | −1 | −1 | −1 | 3 | −1 | 232 |
| 51 | −1 | −1 | −1 | −1 | −1 | −1 | −1 | −1 | −1 | 175 | 213 | −1 | −1 |
| −1 | 203 | −1 | −1 | −1 | −1 | −1 | −1 | −1 | 142 | −1 | 8 | 242 | −1 |
| −1 | 254 | −1 | −1 | −1 | 124 | −1 | −1 | −1 | −1 | −1 | 114 | 64 | −1 |
| 220 | −1 | −1 | −1 | −1 | −1 | 194 | 50 | −1 | −1 | −1 | −1 | −1 | −1 |
| 87 | 20 | −1 | −1 | −1 | −1 | −1 | −1 | −1 | −1 | 185 | −1 | −1 | −1 |
| −1 | 26 | −1 | −1 | 105 | −1 | −1 | −1 | −1 | −1 | −1 | 29 | −1 | −1 |
| 76 | −1 | −1 | −1 | −1 | −1 | −1 | −1 | 42 | −1 | −1 | −1 | −1 | 210 |
| −1 | 222 | 63 | −1 | −1 | −1 | −1 | −1 | −1 | −1 | −1 | −1 | −1 | −1 |
| 23 | −1 | −1 | 235 | −1 | 238 | −1 | −1 | −1 | −1 | −1 | −1 | −1 | −1 |
| −1 | 46 | 139 | −1 | −1 | −1 | −1 | −1 | −1 | 8 | −1 | −1 | −1 | −1 |
| 228 | −1 | −1 | −1 | −1 | 156 | −1 | −1 | −1 | −1 | −1 | −1 | −1 | −1 |
| −1 | −1 | 29 | −1 | −1 | −1 | −1 | 143 | −1 | −1 | −1 | −1 | 160 | 122 |
| 8 | −1 | −1 | −1 | −1 | −1 | 151 | −1 | −1 | −1 | −1 | −1 | −1 | −1 |
| −1 | 98 | 101 | −1 | −1 | 135 | −1 | −1 | −1 | −1 | −1 | −1 | −1 | −1 |
| 18 | −1 | −1 | −1 | 28 | −1 | −1 | −1 | −1 | −1 | −1 | −1 | −1 | −1 |
| −1 | −1 | 71 | −1 | −1 | 240 | −1 | 9 | −1 | 84 | −1 | −1 | −1 | 1 |
| −1 | 106 | −1 | −1 | −1 | −1 | −1 | −1 | −1 | −1 | −1 | −1 | −1 | −1 |
| 242 | −1 | −1 | −1 | −1 | 44 | −1 | −1 | −1 | −1 | −1 | −1 | 166 | −1 |
| −1 | −1 | 132 | −1 | −1 | −1 | −1 | 164 | −1 | −1 | 235 | −1 | −1 | −1 |
| 147 | −1 | −1 | −1 | −1 | −1 | −1 | −1 | −1 | −1 | −1 | −1 | 85 | 36 |
| −1 | 57 | −1 | −1 | −1 | 40 | −1 | −1 | −1 | −1 | −1 | 63 | −1 | −1 |
| 140 | −1 | 38 | −1 | −1 | −1 | −1 | 154 | −1 | −1 | −1 | −1 | −1 | −1 |
| −1 | −1 | −1 | −1 | −1 | −1 | −1 | −1 | −1 | −1 | 219 | −1 | −1 | 151 |
| −1 | 31 | −1 | −1 | −1 | 66 | −1 | −1 | −1 | −1 | −1 | 38 | −1 | −1 |
| 239 | −1 | −1 | −1 | −1 | −1 | −1 | 172 | −1 | −1 | −1 | −1 | 34 | −1 |
| −1 | −1 | 0 | −1 | −1 | −1 | −1 | −1 | −1 | −1 | 75 | −1 | −1 | 120 |
| −1 | 129 | −1 | −1 | −1 | 229 | −1 | −1 | −1 | −1 | −1 | 118 | −1 | −1 |

TABLE 13

| | | | | | | | | | | | | | |
|---|---|---|---|---|---|---|---|---|---|---|---|---|---|
| 174 | 97 | 166 | 66 | −1 | −1 | 71 | −1 | −1 | 172 | 0 | 0 | −1 | −1 |
| 27 | −1 | −1 | 36 | 48 | 92 | 31 | 187 | 185 | 3 | −1 | 0 | 0 | −1 |
| 25 | 114 | −1 | 117 | 110 | −1 | −1 | −1 | 114 | −1 | 1 | −1 | 0 | 0 |
| −1 | 136 | 175 | −1 | 113 | 72 | 123 | 118 | 28 | 186 | 0 | −1 | −1 | 0 |
| 72 | 74 | −1 | −1 | −1 | −1 | −1 | −1 | −1 | −1 | −1 | 29 | −1 | −1 |
| 10 | 44 | −1 | −1 | −1 | 121 | −1 | 80 | −1 | −1 | −1 | 48 | −1 | −1 |
| 129 | −1 | −1 | −1 | −1 | 92 | −1 | 100 | −1 | 49 | −1 | 184 | −1 | −1 |
| −1 | 80 | −1 | −1 | −1 | 186 | −1 | 16 | −1 | −1 | −1 | 102 | −1 | 143 |
| 118 | 70 | −1 | −1 | −1 | −1 | −1 | −1 | −1 | −1 | −1 | −1 | 152 | −1 |
| −1 | 28 | −1 | −1 | −1 | −1 | −1 | −1 | 132 | −1 | 185 | 178 | −1 | −1 |
| 59 | 104 | −1 | −1 | −1 | −1 | 22 | 52 | −1 | −1 | −1 | −1 | −1 | −1 |
| 32 | −1 | −1 | −1 | −1 | −1 | −1 | 92 | −1 | 174 | −1 | −1 | −1 | 154 |
| −1 | 39 | −1 | 93 | −1 | −1 | −1 | −1 | −1 | −1 | −1 | 11 | −1 | −1 |
| 49 | 125 | −1 | −1 | −1 | −1 | −1 | −1 | 35 | −1 | −1 | −1 | −1 | 166 |
| −1 | 19 | −1 | −1 | −1 | −1 | 118 | −1 | −1 | −1 | −1 | 21 | −1 | 163 |
| 68 | −1 | −1 | −1 | −1 | −1 | −1 | −1 | −1 | −1 | 63 | 81 | −1 | −1 |
| −1 | 87 | −1 | −1 | −1 | −1 | −1 | −1 | −1 | 177 | −1 | 135 | 64 | −1 |
| −1 | 158 | −1 | −1 | −1 | 23 | −1 | −1 | −1 | −1 | −1 | 9 | 6 | −1 |
| 186 | −1 | −1 | −1 | −1 | −1 | 6 | 46 | −1 | −1 | −1 | −1 | −1 | −1 |
| 58 | 42 | −1 | −1 | −1 | −1 | −1 | −1 | −1 | −1 | 156 | −1 | −1 | −1 |
| −1 | 76 | −1 | −1 | 61 | −1 | −1 | −1 | −1 | −1 | −1 | 153 | −1 | −1 |
| 157 | −1 | −1 | −1 | −1 | −1 | −1 | −1 | 175 | −1 | −1 | −1 | −1 | 67 |
| −1 | 20 | 52 | −1 | −1 | −1 | −1 | −1 | −1 | −1 | −1 | −1 | −1 | −1 |
| 106 | −1 | 1 | 86 | −1 | 95 | −1 | −1 | −1 | −1 | −1 | −1 | −1 | −1 |
| −1 | 182 | 153 | −1 | −1 | −1 | −1 | 1 | −1 | 64 | −1 | −1 | −1 | −1 |
| 45 | −1 | −1 | −1 | −1 | 21 | −1 | −1 | −1 | −1 | −1 | −1 | −1 | −1 |
| −1 | −1 | 67 | −1 | −1 | −1 | −1 | 137 | −1 | −1 | −1 | −1 | 55 | 85 |
| 103 | −1 | −1 | −1 | −1 | −1 | 50 | −1 | −1 | −1 | −1 | −1 | −1 | −1 |
| −1 | 70 | 111 | −1 | −1 | 168 | −1 | −1 | −1 | −1 | −1 | −1 | −1 | −1 |
| 110 | −1 | −1 | −1 | 17 | −1 | −1 | −1 | −1 | −1 | −1 | −1 | −1 | −1 |
| −1 | −1 | 120 | −1 | −1 | 154 | −1 | 52 | −1 | 56 | −1 | −1 | −1 | −1 |
| −1 | 3 | −1 | −1 | −1 | −1 | −1 | −1 | −1 | −1 | −1 | −1 | −1 | 170 |
| 84 | −1 | −1 | −1 | 1 | 8 | −1 | −1 | −1 | −1 | −1 | −1 | 17 | −1 |
| −1 | −1 | 165 | −1 | −1 | −1 | −1 | 179 | −1 | −1 | 124 | −1 | −1 | −1 |
| 173 | −1 | −1 | −1 | −1 | −1 | −1 | −1 | −1 | −1 | −1 | −1 | 177 | 12 |
| −1 | 77 | −1 | −1 | −1 | 184 | −1 | −1 | −1 | −1 | −1 | 18 | −1 | −1 |
| 25 | −1 | 151 | −1 | −1 | −1 | −1 | 170 | −1 | −1 | −1 | −1 | −1 | −1 |
| −1 | −1 | −1 | −1 | −1 | −1 | −1 | −1 | −1 | −1 | 37 | −1 | −1 | 31 |
| −1 | 84 | −1 | −1 | −1 | 151 | −1 | −1 | −1 | −1 | −1 | 190 | −1 | −1 |
| 93 | −1 | −1 | −1 | −1 | −1 | −1 | 132 | −1 | −1 | −1 | −1 | 57 | −1 |
| −1 | −1 | 103 | −1 | −1 | −1 | −1 | −1 | −1 | −1 | 107 | −1 | −1 | 163 |
| −1 | 147 | −1 | −1 | −1 | 7 | −1 | −1 | −1 | −1 | −1 | 60 | −1 | −1 |

TABLE 14

| | | | | | | | | | | | | | |
|---|---|---|---|---|---|---|---|---|---|---|---|---|---|
| 0 | 0 | 0 | 0 | −1 | −1 | 0 | −1 | −1 | 0 | 0 | 0 | −1 | −1 |
| 137 | −1 | −1 | 124 | 0 | 0 | 88 | 0 | 0 | 55 | −1 | 0 | 0 | −1 |
| 20 | 94 | −1 | 99 | 9 | −1 | −1 | −1 | 108 | −1 | 1 | −1 | 0 | 0 |
| −1 | 38 | 15 | −1 | 102 | 146 | 12 | 57 | 53 | 46 | 0 | −1 | −1 | 0 |
| 0 | 136 | −1 | −1 | −1 | −1 | −1 | −1 | −1 | −1 | −1 | 157 | −1 | −1 |
| 0 | 131 | −1 | −1 | −1 | 142 | −1 | 141 | −1 | −1 | −1 | 64 | −1 | −1 |
| 0 | −1 | −1 | −1 | −1 | 124 | −1 | 99 | −1 | 45 | −1 | 148 | −1 | −1 |
| −1 | 0 | −1 | −1 | −1 | 45 | −1 | 148 | −1 | −1 | −1 | 96 | −1 | 78 |
| 0 | 65 | −1 | −1 | −1 | −1 | −1 | −1 | −1 | −1 | −1 | −1 | 87 | −1 |
| −1 | 0 | −1 | −1 | −1 | −1 | −1 | −1 | 97 | −1 | 51 | 85 | −1 | −1 |
| 0 | 17 | −1 | −1 | −1 | −1 | 156 | 20 | −1 | −1 | −1 | −1 | −1 | −1 |
| 0 | −1 | −1 | −1 | −1 | −1 | −1 | 7 | −1 | 4 | −1 | −1 | −1 | 2 |
| −1 | 0 | −1 | 113 | −1 | −1 | −1 | −1 | −1 | −1 | −1 | 48 | −1 | −1 |
| 0 | 112 | −1 | −1 | −1 | −1 | −1 | −1 | 102 | −1 | −1 | −1 | −1 | 26 |
| −1 | 0 | −1 | −1 | −1 | −1 | 138 | −1 | −1 | −1 | −1 | 57 | −1 | 27 |
| 0 | −1 | −1 | −1 | −1 | −1 | −1 | −1 | −1 | −1 | 73 | 99 | −1 | −1 |
| −1 | 0 | −1 | −1 | −1 | −1 | −1 | −1 | −1 | 79 | −1 | 111 | 143 | −1 |
| −1 | 0 | −1 | −1 | −1 | 24 | −1 | −1 | −1 | −1 | −1 | 109 | 18 | −1 |
| 0 | −1 | −1 | −1 | −1 | −1 | 18 | 86 | −1 | −1 | −1 | −1 | −1 | −1 |
| 0 | 158 | −1 | −1 | −1 | −1 | −1 | −1 | −1 | −1 | 154 | −1 | −1 | −1 |
| −1 | 0 | −1 | −1 | 148 | −1 | −1 | −1 | −1 | −1 | −1 | 104 | −1 | −1 |
| 0 | −1 | −1 | −1 | −1 | −1 | −1 | −1 | 17 | −1 | −1 | −1 | −1 | 33 |
| −1 | 0 | 4 | −1 | −1 | −1 | −1 | −1 | −1 | −1 | −1 | −1 | −1 | −1 |
| 0 | −1 | −1 | 75 | −1 | 158 | −1 | −1 | −1 | −1 | −1 | −1 | −1 | −1 |
| −1 | 0 | 69 | −1 | −1 | −1 | −1 | −1 | −1 | 87 | −1 | −1 | −1 | −1 |
| 0 | −1 | −1 | −1 | −1 | 65 | −1 | −1 | −1 | −1 | −1 | −1 | −1 | −1 |
| −1 | −1 | 0 | −1 | −1 | −1 | −1 | 100 | −1 | −1 | −1 | −1 | 13 | 7 |
| 0 | −1 | −1 | −1 | −1 | −1 | 32 | −1 | −1 | −1 | −1 | −1 | −1 | −1 |
| −1 | 0 | 126 | −1 | −1 | 110 | −1 | −1 | −1 | −1 | −1 | −1 | −1 | −1 |
| 0 | −1 | −1 | −1 | 154 | −1 | −1 | −1 | −1 | −1 | −1 | −1 | −1 | −1 |
| −1 | −1 | 0 | −1 | −1 | 35 | −1 | 51 | −1 | 134 | −1 | −1 | −1 | −1 |
| −1 | 0 | −1 | −1 | −1 | −1 | −1 | −1 | −1 | −1 | −1 | −1 | −1 | 20 |
| 0 | −1 | −1 | −1 | −1 | 20 | −1 | −1 | −1 | −1 | −1 | −1 | 122 | −1 |
| −1 | −1 | 0 | −1 | −1 | −1 | −1 | 88 | −1 | −1 | 13 | −1 | −1 | −1 |
| 0 | −1 | −1 | −1 | −1 | −1 | −1 | −1 | −1 | −1 | −1 | −1 | 19 | 78 |
| −1 | 0 | −1 | −1 | −1 | 157 | −1 | −1 | −1 | −1 | −1 | 6 | −1 | −1 |
| 0 | −1 | 63 | −1 | −1 | −1 | −1 | 82 | −1 | −1 | −1 | −1 | −1 | −1 |
| −1 | −1 | −1 | −1 | −1 | −1 | −1 | −1 | −1 | −1 | 0 | −1 | −1 | 144 |
| −1 | 0 | −1 | −1 | −1 | 93 | −1 | −1 | −1 | −1 | −1 | 19 | −1 | −1 |
| 0 | −1 | −1 | −1 | −1 | −1 | −1 | 24 | −1 | −1 | −1 | −1 | 138 | −1 |
| −1 | −1 | 0 | −1 | −1 | −1 | −1 | −1 | −1 | −1 | 36 | −1 | −1 | 143 |
| −1 | 0 | −1 | −1 | −1 | 2 | −1 | −1 | −1 | −1 | −1 | 55 | −1 | −1 |

TABLE 15

| | | | | | | | | | | | | | |
|---|---|---|---|---|---|---|---|---|---|---|---|---|---|
| 72 | 110 | 23 | 181 | −1 | −1 | 95 | −1 | −1 | 8 | 1 | 0 | −1 | −1 |
| 53 | −1 | −1 | 156 | 115 | 156 | 115 | 200 | 29 | 31 | −1 | 0 | 0 | −1 |
| 152 | 131 | −1 | 46 | 191 | −1 | −1 | −1 | 91 | −1 | 0 | −1 | 0 | 0 |
| −1 | 185 | 6 | −1 | 36 | 124 | 124 | 110 | 156 | 133 | 1 | −1 | −1 | 0 |
| 200 | 16 | −1 | −1 | −1 | −1 | −1 | −1 | −1 | −1 | −1 | 101 | −1 | −1 |
| 185 | 138 | −1 | −1 | −1 | 170 | −1 | 219 | −1 | −1 | −1 | 193 | −1 | −1 |
| 123 | −1 | −1 | −1 | −1 | 55 | −1 | 31 | −1 | 222 | −1 | 209 | −1 | −1 |
| −1 | 103 | −1 | −1 | −1 | 13 | −1 | 105 | −1 | −1 | −1 | 150 | −1 | 181 |
| 147 | 43 | −1 | −1 | −1 | −1 | −1 | −1 | −1 | −1 | −1 | −1 | 152 | −1 |
| −1 | 2 | −1 | −1 | −1 | −1 | −1 | −1 | 30 | −1 | 184 | 83 | −1 | −1 |
| 174 | 150 | −1 | −1 | −1 | −1 | 8 | 56 | −1 | −1 | −1 | −1 | −1 | −1 |
| 99 | 4 | −1 | −1 | −1 | −1 | −1 | 138 | −1 | 110 | −1 | −1 | −1 | 99 |
| −1 | 46 | −1 | 217 | −1 | −1 | −1 | −1 | −1 | −1 | −1 | 109 | −1 | −1 |
| 37 | 113 | −1 | −1 | −1 | −1 | −1 | −1 | 143 | −1 | −1 | −1 | −1 | 140 |
| −1 | 36 | −1 | −1 | −1 | −1 | 95 | −1 | −1 | −1 | −1 | 40 | −1 | 116 |
| 116 | −1 | −1 | −1 | −1 | −1 | −1 | −1 | −1 | −1 | 200 | 110 | −1 | −1 |
| −1 | 75 | −1 | −1 | −1 | −1 | −1 | −1 | −1 | 158 | −1 | 134 | 97 | −1 |
| −1 | 48 | −1 | −1 | −1 | 132 | −1 | −1 | −1 | −1 | −1 | 206 | 2 | −1 |
| 68 | −1 | −1 | −1 | −1 | −1 | 16 | 156 | −1 | −1 | −1 | −1 | −1 | −1 |
| 35 | 138 | −1 | −1 | −1 | −1 | −1 | −1 | −1 | −1 | 86 | −1 | −1 | −1 |
| −1 | 6 | −1 | −1 | 20 | −1 | −1 | −1 | −1 | −1 | −1 | 141 | −1 | −1 |
| 80 | −1 | −1 | −1 | −1 | −1 | −1 | −1 | 43 | −1 | −1 | −1 | −1 | 81 |
| −1 | 49 | 1 | −1 | −1 | −1 | −1 | −1 | −1 | −1 | −1 | −1 | −1 | −1 |
| 156 | −1 | −1 | 54 | −1 | 134 | −1 | −1 | −1 | −1 | −1 | −1 | −1 | −1 |
| −1 | 153 | 88 | −1 | −1 | −1 | −1 | −1 | −1 | 63 | −1 | −1 | −1 | −1 |
| 211 | −1 | −1 | −1 | −1 | 94 | −1 | −1 | −1 | −1 | −1 | −1 | −1 | −1 |
| −1 | −1 | 90 | −1 | −1 | −1 | −1 | 6 | −1 | −1 | −1 | −1 | 221 | 6 |
| 27 | −1 | −1 | −1 | −1 | −1 | 118 | −1 | 1 | −1 | −1 | −1 | −1 | −1 |
| −1 | 216 | 212 | −1 | −1 | 193 | −1 | −1 | −1 | −1 | −1 | −1 | −1 | −1 |
| 108 | −1 | −1 | −1 | 61 | −1 | −1 | −1 | −1 | −1 | −1 | −1 | −1 | −1 |
| −1 | −1 | 106 | −1 | −1 | 44 | −1 | 185 | −1 | 176 | −1 | −1 | −1 | −1 |

TABLE 15-continued

| | | | | | | | | | | | | | |
|---|---|---|---|---|---|---|---|---|---|---|---|---|---|
| −1 | 147 | −1 | −1 | −1 | −1 | −1 | −1 | −1 | −1 | −1 | −1 | −1 | 182 |
| 108 | −1 | −1 | −1 | −1 | 21 | −1 | −1 | −1 | −1 | −1 | −1 | 110 | −1 |
| −1 | −1 | 71 | −1 | −1 | −1 | −1 | 12 | −1 | −1 | 109 | −1 | −1 | −1 |
| 29 | −1 | −1 | −1 | −1 | −1 | −1 | −1 | −1 | −1 | −1 | −1 | 201 | 69 |
| −1 | 91 | −1 | −1 | −1 | 165 | −1 | −1 | −1 | −1 | −1 | 55 | −1 | −1 |
| −1 | −1 | 175 | −1 | −1 | −1 | −1 | 83 | −1 | −1 | −1 | −1 | −1 | −1 |
| −1 | −1 | −1 | −1 | −1 | −1 | −1 | −1 | −1 | −1 | 40 | −1 | −1 | 12 |
| −1 | 37 | −1 | −1 | −1 | 97 | −1 | −1 | −1 | −1 | −1 | 46 | −1 | −1 |
| 106 | −1 | −1 | −1 | −1 | −1 | −1 | 181 | −1 | −1 | −1 | −1 | 154 | −1 |
| −1 | −1 | 98 | −1 | −1 | −1 | −1 | −1 | −1 | −1 | 35 | −1 | −1 | 36 |
| −1 | 120 | −1 | −1 | −1 | 101 | −1 | −1 | −1 | −1 | −1 | 81 | −1 | −1 |

TABLE 16

| | | | | | | | | | | | | | |
|---|---|---|---|---|---|---|---|---|---|---|---|---|---|
| 3 | 26 | 53 | 35 | −1 | −1 | 115 | −1 | −1 | 127 | 0 | 0 | −1 | −1 |
| 19 | −1 | −1 | 94 | 104 | 66 | 84 | 98 | 69 | 50 | −1 | 0 | 0 | −1 |
| 95 | 106 | −1 | 92 | 110 | −1 | −1 | −1 | 111 | −1 | 1 | −1 | 0 | 0 |
| −1 | 120 | 121 | −1 | 22 | 4 | 73 | 49 | 128 | 79 | 0 | −1 | −1 | 0 |
| 42 | 24 | −1 | −1 | −1 | −1 | −1 | −1 | −1 | −1 | −1 | 51 | −1 | −1 |
| 40 | 140 | −1 | −1 | −1 | 84 | −1 | 137 | −1 | −1 | −1 | 71 | −1 | −1 |
| 109 | −1 | −1 | −1 | −1 | 87 | −1 | 107 | −1 | 133 | −1 | 139 | −1 | −1 |
| −1 | 97 | −1 | −1 | −1 | 135 | −1 | 35 | −1 | −1 | −1 | 108 | −1 | 65 |
| 70 | 69 | −1 | −1 | −1 | −1 | −1 | −1 | −1 | −1 | −1 | −1 | 88 | −1 |
| −1 | 97 | −1 | −1 | −1 | −1 | −1 | −1 | 40 | −1 | 24 | 49 | −1 | −1 |
| 46 | 41 | −1 | −1 | −1 | −1 | 101 | 96 | −1 | −1 | −1 | −1 | −1 | −1 |
| 28 | −1 | −1 | −1 | −1 | −1 | −1 | 30 | −1 | 116 | −1 | −1 | −1 | 64 |
| −1 | 33 | −1 | 122 | −1 | −1 | −1 | −1 | −1 | −1 | −1 | 131 | −1 | −1 |
| 76 | 37 | −1 | −1 | −1 | −1 | −1 | −1 | 62 | −1 | −1 | −1 | −1 | 47 |
| −1 | 143 | −1 | −1 | −1 | −1 | 51 | −1 | −1 | −1 | −1 | 130 | −1 | 97 |
| 139 | −1 | −1 | −1 | −1 | −1 | −1 | −1 | −1 | −1 | 96 | 128 | −1 | −1 |
| −1 | 48 | −1 | −1 | −1 | −1 | −1 | −1 | −1 | 9 | −1 | 28 | 8 | −1 |
| −1 | 120 | −1 | −1 | −1 | 43 | −1 | −1 | −1 | −1 | −1 | 65 | 42 | −1 |
| 17 | −1 | −1 | −1 | −1 | −1 | 106 | 142 | −1 | −1 | −1 | −1 | −1 | −1 |
| 79 | 28 | −1 | −1 | −1 | −1 | −1 | −1 | −1 | −1 | 41 | −1 | −1 | −1 |
| −1 | 2 | −1 | −1 | 103 | −1 | −1 | −1 | −1 | −1 | −1 | 78 | −1 | −1 |
| 91 | −1 | −1 | −1 | −1 | −1 | −1 | −1 | 75 | −1 | −1 | −1 | −1 | 81 |
| −1 | 54 | 132 | −1 | −1 | −1 | −1 | −1 | −1 | −1 | −1 | −1 | −1 | −1 |
| 68 | −1 | −1 | 115 | −1 | 56 | −1 | −1 | −1 | −1 | −1 | −1 | −1 | −1 |
| −1 | 30 | 42 | −1 | −1 | −1 | −1 | −1 | −1 | 101 | −1 | −1 | −1 | −1 |
| 128 | −1 | −1 | −1 | −1 | 63 | −1 | −1 | −1 | −1 | −1 | −1 | −1 | −1 |
| −1 | −1 | 142 | −1 | −1 | −1 | −1 | 28 | −1 | −1 | −1 | −1 | 100 | 133 |
| 13 | −1 | −1 | −1 | −1 | −1 | 10 | −1 | −1 | −1 | −1 | −1 | −1 | −1 |
| −1 | 106 | 77 | −1 | −1 | 43 | −1 | −1 | −1 | −1 | −1 | −1 | −1 | −1 |
| 133 | −1 | −1 | −1 | 25 | −1 | −1 | −1 | −1 | −1 | −1 | −1 | −1 | −1 |
| −1 | −1 | 87 | −1 | −1 | 56 | −1 | 104 | −1 | 70 | −1 | −1 | −1 | −1 |
| −1 | 80 | −1 | −1 | −1 | −1 | −1 | −1 | −1 | −1 | −1 | −1 | −1 | 139 |
| 32 | −1 | −1 | −1 | −1 | 89 | −1 | −1 | −1 | −1 | −1 | −1 | 71 | −1 |
| 1 | −1 | 135 | −1 | −1 | −1 | −1 | 6 | −1 | −1 | 2 | −1 | −1 | −1 |
| 37 | −1 | −1 | −1 | −1 | −1 | −1 | −1 | −1 | −1 | −1 | −1 | 25 | 114 |
| −1 | 60 | −1 | −1 | −1 | 137 | −1 | −1 | −1 | −1 | −1 | 93 | −1 | −1 |
| 121 | −1 | 129 | −1 | −1 | −1 | −1 | 26 | −1 | −1 | −1 | −1 | −1 | −1 |
| −1 | −1 | −1 | −1 | −1 | −1 | −1 | −1 | −1 | −1 | 97 | −1 | −1 | 56 |
| −1 | −1 | −1 | −1 | −1 | 70 | −1 | −1 | −1 | −1 | −1 | −1 | −1 | −1 |
| 119 | −1 | −1 | −1 | −1 | −1 | −1 | 32 | −1 | −1 | −1 | −1 | 142 | −1 |
| −1 | −1 | 6 | −1 | −1 | −1 | −1 | −1 | −1 | −1 | 73 | −1 | −1 | 102 |
| −1 | 48 | −1 | −1 | −1 | 47 | −1 | −1 | −1 | −1 | −1 | 19 | −1 | −1 |

TABLE 17

| | | | | | | | | | | | | | |
|---|---|---|---|---|---|---|---|---|---|---|---|---|---|
| 156 | 143 | 14 | 3 | −1 | −1 | 40 | −1 | −1 | 123 | 0 | 0 | −1 | −1 |
| 17 | −1 | −1 | 65 | 63 | 1 | 55 | 37 | 171 | 133 | −1 | 0 | 0 | −1 |
| 98 | 168 | −1 | 107 | 82 | −1 | −1 | −1 | 142 | −1 | 1 | −1 | 0 | 0 |
| −1 | 53 | 174 | −1 | 174 | 127 | 17 | 89 | 17 | 105 | 0 | −1 | −1 | 0 |
| 86 | 67 | −1 | −1 | −1 | −1 | −1 | −1 | −1 | −1 | −1 | 83 | −1 | −1 |
| 79 | 84 | −1 | −1 | −1 | 35 | −1 | 103 | −1 | −1 | −1 | 60 | −1 | −1 |
| 47 | −1 | −1 | −1 | −1 | 154 | −1 | 10 | −1 | 155 | −1 | 29 | −1 | −1 |
| −1 | 48 | −1 | −1 | −1 | 125 | −1 | 24 | −1 | −1 | −1 | 47 | −1 | 55 |
| 53 | 31 | −1 | −1 | −1 | −1 | −1 | −1 | −1 | −1 | −1 | −1 | 161 | −1 |
| −1 | 104 | −1 | −1 | −1 | −1 | −1 | −1 | 142 | −1 | 99 | 64 | −1 | −1 |
| 111 | 25 | −1 | −1 | −1 | −1 | 174 | 23 | −1 | −1 | −1 | −1 | −1 | −1 |
| 91 | −1 | −1 | −1 | −1 | −1 | −1 | 175 | −1 | 24 | −1 | −1 | −1 | 141 |

TABLE 17-continued

| −1 | 122 | −1 | 11 | −1 | −1 | −1 | −1 | −1 | −1 | −1 | 4 | −1 | −1 |
|---|---|---|---|---|---|---|---|---|---|---|---|---|---|
| 29 | 91 | −1 | −1 | −1 | −1 | −1 | −1 | 27 | −1 | −1 | −1 | −1 | 127 |
| −1 | 11 | −1 | −1 | −1 | −1 | 145 | −1 | −1 | −1 | −1 | 8 | −1 | 166 |
| 137 | −1 | −1 | −1 | −1 | −1 | −1 | −1 | −1 | −1 | 103 | 40 | −1 | −1 |
| −1 | 78 | −1 | −1 | −1 | −1 | −1 | −1 | −1 | 158 | −1 | 17 | 165 | −1 |
| −1 | 134 | −1 | −1 | −1 | 23 | −1 | −1 | −1 | −1 | −1 | 62 | 163 | −1 |
| 173 | −1 | −1 | −1 | −1 | −1 | 31 | 22 | −1 | −1 | −1 | −1 | −1 | 1 |
| 13 | 135 | −1 | −1 | −1 | −1 | −1 | −1 | −1 | −1 | 145 | −1 | −1 | −1 |
| −1 | 128 | −1 | −1 | 52 | −1 | −1 | −1 | −1 | −1 | −1 | 173 | −1 | −1 |
| 156 | −1 | −1 | −1 | −1 | −1 | −1 | −1 | 166 | −1 | −1 | −1 | −1 | 40 |
| −1 | 18 | 163 | −1 | −1 | −1 | −1 | −1 | −1 | −1 | −1 | −1 | −1 | −1 |
| 110 | −1 | −1 | 132 | −1 | 150 | −1 | −1 | −1 | −1 | −1 | −1 | −1 | −1 |
| −1 | 113 | 108 | −1 | −1 | −1 | −1 | −1 | −1 | 61 | −1 | −1 | −1 | −1 |
| 72 | −1 | −1 | −1 | −1 | 136 | −1 | −1 | −1 | −1 | −1 | −1 | −1 | −1 |
| −1 | −1 | 36 | −1 | −1 | −1 | −1 | 38 | −1 | −1 | −1 | −1 | 53 | 145 |
| 42 | −1 | −1 | −1 | −1 | −1 | 104 | −1 | −1 | −1 | −1 | −1 | −1 | −1 |
| −1 | 64 | 24 | −1 | −1 | 149 | −1 | −1 | −1 | −1 | −1 | −1 | −1 | −1 |
| 139 | −1 | −1 | −1 | 161 | −1 | −1 | −1 | −1 | −1 | −1 | −1 | −1 | −1 |
| −1 | −1 | 84 | −1 | −1 | 173 | −1 | 93 | −1 | 29 | −1 | −1 | −1 | −1 |
| −1 | 117 | −1 | −1 | −1 | −1 | −1 | −1 | −1 | −1 | −1 | −1 | −1 | 148 |
| 116 | −1 | −1 | −1 | −1 | 73 | −1 | −1 | −1 | −1 | −1 | −1 | 142 | −1 |
| −1 | −1 | 105 | −1 | −1 | −1 | −1 | 137 | −1 | −1 | 29 | −1 | −1 | −1 |
| 11 | −1 | −1 | −1 | −1 | −1 | −1 | −1 | −1 | −1 | −1 | −1 | 41 | 162 |
| −1 | 126 | −1 | −1 | −1 | 152 | −1 | −1 | −1 | −1 | −1 | 172 | −1 | −1 |
| 73 | −1 | 154 | −1 | −1 | −1 | −1 | 129 | −1 | −1 | −1 | −1 | −1 | −1 |
| −1 | −1 | −1 | −1 | −1 | −1 | −1 | −1 | −1 | −1 | 167 | −1 | −1 | 38 |
| −1 | 112 | −1 | −1 | −1 | 7 | −1 | −1 | −1 | −1 | −1 | 19 | −1 | −1 |
| 109 | −1 | −1 | −1 | −1 | −1 | −1 | 6 | −1 | −1 | −1 | −1 | 105 | −1 |
| −1 | −1 | 160 | −1 | −1 | −1 | −1 | −1 | −1 | −1 | 156 | −1 | −1 | 82 |
| −1 | 132 | −1 | −1 | −1 | 6 | −1 | −1 | −1 | −1 | −1 | 8 | −1 | −1 |

TABLE 18

| 143 | 19 | 176 | 165 | −1 | −1 | 196 | −1 | −1 | 13 | 0 | 0 | −1 | −1 |
|---|---|---|---|---|---|---|---|---|---|---|---|---|---|
| 18 | −1 | −1 | 27 | 3 | 102 | 185 | 17 | 14 | 180 | −1 | 0 | 0 | −1 |
| 126 | 163 | −1 | 47 | 183 | −1 | −1 | −1 | 132 | −1 | 1 | −1 | 0 | 0 |
| −1 | 36 | 48 | −1 | 18 | 111 | 203 | 3 | 191 | 160 | 0 | −1 | −1 | 0 |
| 43 | 27 | −1 | −1 | −1 | −1 | −1 | −1 | −1 | −1 | −1 | 117 | −1 | −1 |
| 136 | 49 | −1 | −1 | −1 | 36 | −1 | 132 | −1 | −1 | −1 | 62 | −1 | −1 |
| 7 | −1 | −1 | −1 | −1 | 34 | −1 | 198 | −1 | 168 | −1 | 12 | −1 | −1 |
| −1 | 163 | −1 | −1 | −1 | 78 | −1 | 143 | −1 | −1 | −1 | 107 | −1 | 58 |
| 101 | 177 | −1 | −1 | −1 | −1 | −1 | −1 | −1 | −1 | −1 | −1 | 22 | −1 |
| −1 | 186 | −1 | −1 | −1 | −1 | −1 | −1 | 27 | −1 | 205 | 81 | −1 | −1 |
| 125 | 60 | −1 | −1 | −1 | −1 | 177 | 51 | −1 | −1 | −1 | −1 | −1 | −1 |
| 39 | −1 | −1 | −1 | −1 | −1 | −1 | 29 | −1 | 35 | −1 | −1 | −1 | 8 |
| −1 | 18 | −1 | 155 | −1 | −1 | −1 | −1 | −1 | −1 | −1 | 49 | −1 | −1 |
| 32 | 53 | −1 | −1 | −1 | −1 | −1 | −1 | 95 | −1 | −1 | −1 | −1 | 186 |
| −1 | 91 | −1 | −1 | −1 | −1 | 20 | −1 | −1 | −1 | −1 | 52 | −1 | 109 |
| 174 | −1 | −1 | −1 | −1 | −1 | −1 | −1 | −1 | −1 | 108 | 102 | −1 | −1 |
| −1 | 125 | −1 | −1 | −1 | −1 | −1 | −1 | −1 | 31 | −1 | 54 | 176 | −1 |
| −1 | 57 | −1 | −1 | −1 | 201 | −1 | −1 | −1 | −1 | −1 | 142 | 35 | −1 |
| 129 | −1 | −1 | −1 | −1 | −1 | 203 | 140 | −1 | −1 | −1 | −1 | −1 | −1 |
| 110 | 124 | −1 | −1 | −1 | −1 | −1 | −1 | −1 | −1 | 52 | −1 | −1 | −1 |
| −1 | 196 | −1 | −1 | 35 | −1 | −1 | −1 | −1 | −1 | −1 | 114 | −1 | −1 |
| 10 | −1 | −1 | −1 | −1 | −1 | −1 | −1 | 122 | −1 | −1 | −1 | −1 | 23 |
| −1 | 202 | 126 | −1 | −1 | −1 | −1 | −1 | −1 | −1 | −1 | −1 | −1 | −1 |
| 52 | −1 | −1 | 170 | −1 | 13 | −1 | −1 | −1 | −1 | −1 | −1 | −1 | −1 |
| −1 | 113 | 161 | −1 | −1 | −1 | −1 | −1 | −1 | 88 | −1 | −1 | −1 | −1 |
| 197 | −1 | −1 | −1 | −1 | 194 | −1 | −1 | −1 | −1 | −1 | −1 | −1 | −1 |
| −1 | −1 | 164 | −1 | −1 | −1 | −1 | 172 | −1 | −1 | −1 | −1 | 49 | 161 |
| 168 | −1 | −1 | −1 | −1 | −1 | 193 | −1 | −1 | −1 | −1 | −1 | −1 | −1 |
| −1 | 14 | 186 | −1 | −1 | 46 | −1 | −1 | −1 | −1 | −1 | −1 | −1 | −1 |
| 50 | −1 | −1 | −1 | 27 | −1 | −1 | −1 | −1 | −1 | −1 | −1 | −1 | −1 |
| −1 | −1 | 70 | −1 | −1 | 17 | −1 | 50 | −1 | 6 | −1 | −1 | −1 | −1 |
| −1 | 115 | −1 | −1 | −1 | −1 | −1 | −1 | −1 | −1 | −1 | −1 | −1 | 189 |
| 110 | −1 | −1 | −1 | −1 | 0 | −1 | −1 | −1 | −1 | −1 | −1 | 163 | −1 |
| −1 | −1 | 163 | −1 | −1 | −1 | −1 | 173 | −1 | −1 | 179 | −1 | −1 | −1 |
| 197 | −1 | −1 | −1 | −1 | −1 | −1 | −1 | −1 | −1 | −1 | −1 | 191 | 193 |
| −1 | 157 | −1 | −1 | −1 | 167 | −1 | −1 | −1 | −1 | −1 | 181 | −1 | −1 |
| 197 | −1 | 167 | −1 | −1 | −1 | −1 | 179 | −1 | −1 | −1 | −1 | −1 | −1 |
| −1 | −1 | −1 | −1 | −1 | −1 | −1 | −1 | −1 | −1 | 181 | −1 | −1 | 193 |
| −1 | 157 | −1 | −1 | −1 | 173 | −1 | −1 | −1 | −1 | −1 | 191 | −1 | −1 |
| 181 | −1 | −1 | −1 | −1 | −1 | −1 | 157 | −1 | −1 | −1 | −1 | 173 | −1 |
| −1 | −1 | 193 | −1 | −1 | −1 | −1 | −1 | −1 | −1 | 163 | −1 | −1 | 179 |
| −1 | 191 | −1 | −1 | −1 | 197 | −1 | −1 | −1 | −1 | −1 | 167 | −1 | −1 |

TABLE 19

| | | | | | | | | | | | | | |
|---|---|---|---|---|---|---|---|---|---|---|---|---|---|
| 145 | 131 | 71 | 21 | −1 | −1 | 23 | −1 | −1 | 112 | 1 | 0 | −1 | −1 |
| 142 | −1 | −1 | 174 | 183 | 27 | 96 | 23 | 9 | 167 | −1 | 0 | 0 | −1 |
| 74 | 31 | −1 | 3 | 53 | −1 | −1 | −1 | 155 | −1 | 0 | −1 | 0 | 0 |
| −1 | 239 | 171 | −1 | 95 | 110 | 159 | 199 | 43 | 75 | 1 | −1 | −1 | 0 |
| 29 | 140 | −1 | −1 | −1 | −1 | −1 | −1 | −1 | −1 | −1 | 180 | −1 | −1 |
| 121 | 41 | −1 | −1 | −1 | 169 | 8 | | −1 | −1 | −1 | 207 | −1 | −1 |
| 137 | −1 | −1 | −1 | −1 | 72 | −1 | 172 | −1 | 124 | −1 | 56 | −1 | −1 |
| −1 | 86 | −1 | −1 | −1 | 186 | −1 | 87 | −1 | −1 | −1 | 172 | −1 | 154 |
| 176 | 169 | −1 | −1 | −1 | −1 | −1 | −1 | −1 | −1 | −1 | −1 | 225 | −1 |
| −1 | 167 | −1 | −1 | −1 | −1 | −1 | −1 | 238 | −1 | 48 | 68 | −1 | −1 |
| 38 | 217 | −1 | −1 | −1 | −1 | 208 | 232 | −1 | −1 | −1 | −1 | −1 | −1 |
| 178 | −1 | −1 | −1 | −1 | −1 | −1 | 214 | −1 | 168 | −1 | −1 | −1 | 51 |
| −1 | 124 | −1 | 122 | −1 | −1 | −1 | −1 | −1 | −1 | −1 | 72 | −1 | −1 |
| 48 | 57 | −1 | −1 | −1 | −1 | −1 | −1 | 167 | −1 | −1 | −1 | −1 | 219 |
| −1 | 82 | −1 | −1 | −1 | −1 | 232 | −1 | −1 | −1 | −1 | 204 | −1 | 162 |
| 38 | −1 | −1 | −1 | −1 | −1 | −1 | −1 | −1 | −1 | 217 | 157 | −1 | −1 |
| −1 | 170 | −1 | −1 | −1 | −1 | −1 | −1 | −1 | 23 | −1 | 175 | 202 | −1 |
| −1 | 196 | −1 | −1 | −1 | 173 | −1 | −1 | −1 | −1 | −1 | 195 | 218 | −1 |
| 128 | −1 | −1 | −1 | −1 | −1 | 211 | 210 | −1 | −1 | −1 | −1 | −1 | −1 |
| 39 | 84 | −1 | −1 | −1 | −1 | −1 | −1 | −1 | −1 | 88 | −1 | −1 | −1 |
| −1 | 117 | −1 | −1 | 227 | −1 | −1 | −1 | −1 | −1 | −1 | 6 | −1 | −1 |
| 238 | −1 | −1 | −1 | −1 | −1 | −1 | −1 | 13 | −1 | −1 | −1 | −1 | 11 |
| −1 | 195 | 44 | −1 | −1 | −1 | −1 | −1 | −1 | −1 | −1 | −1 | −1 | −1 |
| 5 | −1 | −1 | 94 | −1 | 111 | −1 | −1 | −1 | −1 | −1 | −1 | −1 | −1 |
| −1 | 81 | 19 | −1 | −1 | −1 | −1 | −1 | −1 | 130 | −1 | −1 | −1 | −1 |
| 66 | −1 | −1 | −1 | −1 | 95 | −1 | −1 | −1 | −1 | −1 | −1 | −1 | −1 |
| −1 | −1 | 146 | −1 | −1 | −1 | −1 | 66 | −1 | −1 | −1 | −1 | 190 | 86 |
| 64 | −1 | −1 | −1 | −1 | −1 | 181 | −1 | −1 | −1 | −1 | −1 | −1 | −1 |
| −1 | 7 | 144 | −1 | −1 | 16 | −1 | −1 | −1 | −1 | −1 | −1 | −1 | −1 |
| 25 | −1 | −1 | −1 | 57 | −1 | −1 | −1 | −1 | −1 | −1 | −1 | −1 | −1 |
| −1 | −1 | 37 | −1 | −1 | 139 | −1 | 221 | −1 | 17 | −1 | −1 | −1 | −1 |
| −1 | 201 | −1 | −1 | −1 | −1 | −1 | −1 | −1 | −1 | −1 | −1 | −1 | 46 |
| 179 | −1 | −1 | −1 | −1 | 14 | −1 | −1 | −1 | −1 | −1 | −1 | 116 | −1 |
| −1 | −1 | 46 | −1 | −1 | −1 | −1 | 2 | −1 | −1 | 106 | −1 | −1 | −1 |
| 184 | −1 | −1 | −1 | −1 | −1 | −1 | −1 | −1 | −1 | −1 | −1 | 135 | 141 |
| −1 | 85 | −1 | −1 | −1 | 225 | −1 | −1 | −1 | −1 | −1 | 175 | −1 | −1 |
| 178 | −1 | 112 | −1 | −1 | −1 | −1 | 106 | −1 | −1 | −1 | −1 | −1 | −1 |
| −1 | −1 | −1 | −1 | −1 | −1 | −1 | −1 | −1 | −1 | 154 | −1 | −1 | 114 |
| −1 | 42 | −1 | −1 | −1 | 41 | −1 | −1 | −1 | −1 | −1 | 105 | −1 | −1 |
| 167 | −1 | −1 | −1 | −1 | −1 | −1 | 45 | −1 | −1 | −1 | −1 | 189 | −1 |
| −1 | −1 | 78 | −1 | −1 | −1 | −1 | −1 | −1 | −1 | 67 | −1 | −1 | 180 |
| −1 | 53 | −1 | −1 | −1 | 215 | −1 | −1 | −1 | −1 | −1 | 230 | −1 | −1 |

Tables 20 to 27 show matrices A', B' and C' corresponding to exponent matrices (second exponent matrices) created by transforming the exponent matrices (first exponent matrices) corresponding to Tables 4 to 11.

That is, the matrices Z' and D' illustrated in FIG. 3 are added on the right side of the matrix shown in any one of Tables 20 to 27, whereby a transformed exponent matrix may be formed (Z' and D' are maintained without change after transformation).

TABLE 20

| | | | | | | | | | | | | | |
|---|---|---|---|---|---|---|---|---|---|---|---|---|---|
| 6 | 187 | 30 | 97 | −1 | 156 | 246 | −1 | −1 | 197 | 27 | 146 | 65 | 247 |
| 254 | −1 | 17 | 139 | 132 | 185 | −1 | 34 | 152 | 83 | −1 | 36 | 154 | −1 |
| 150 | 145 | 71 | −1 | 193 | 139 | 163 | 27 | 79 | 161 | 217 | −1 | −1 | 114 |
| 135 | 167 | −1 | 172 | 236 | −1 | 106 | 125 | 13 | −1 | 120 | 170 | 10 | 37 |
| 99 | 154 | −1 | −1 | −1 | −1 | −1 | −1 | −1 | −1 | −1 | −1 | −1 | −1 |
| 51 | 20 | −1 | 62 | −1 | −1 | −1 | −1 | −1 | −1 | −1 | −1 | 25 | −1 |
| 73 | −1 | −1 | −1 | −1 | −1 | 234 | −1 | −1 | −1 | 228 | 189 | −1 | 12 |
| 36 | 212 | −1 | −1 | 97 | −1 | −1 | 225 | 89 | −1 | −1 | −1 | −1 | −1 |
| 144 | 252 | −1 | 249 | −1 | −1 | −1 | −1 | −1 | −1 | −1 | −1 | 45 | −1 |
| 153 | 74 | −1 | −1 | −1 | −1 | −1 | −1 | −1 | −1 | 147 | 235 | −1 | 114 |
| −1 | 158 | 107 | −1 | 89 | −1 | −1 | 96 | 207 | −1 | −1 | −1 | −1 | −1 |
| 179 | 215 | −1 | −1 | −1 | −1 | −1 | −1 | −1 | −1 | −1 | −1 | 173 | −1 |
| 96 | 214 | −1 | −1 | −1 | −1 | −1 | −1 | −1 | −1 | 235 | 224 | −1 | 22 |
| 79 | −1 | −1 | 8 | −1 | −1 | −1 | 105 | −1 | −1 | −1 | −1 | −1 | −1 |
| 50 | −1 | −1 | −1 | −1 | −1 | −1 | −1 | −1 | −1 | −1 | −1 | 201 | −1 |
| 216 | 160 | −1 | −1 | −1 | −1 | −1 | −1 | −1 | −1 | 191 | −1 | −1 | 193 |
| −1 | 192 | −1 | 207 | −1 | −1 | −1 | −1 | −1 | −1 | −1 | 207 | −1 | −1 |
| 249 | −1 | −1 | −1 | −1 | −1 | −1 | −1 | −1 | −1 | −1 | −1 | −1 | −1 |
| −1 | 214 | −1 | −1 | −1 | −1 | −1 | −1 | −1 | −1 | −1 | −1 | 23 | 248 |
| 196 | 183 | −1 | −1 | −1 | −1 | −1 | 184 | 129 | −1 | 32 | −1 | −1 | −1 |
| 105 | −1 | −1 | 70 | −1 | −1 | −1 | −1 | −1 | 39 | −1 | 209 | −1 | −1 |

TABLE 20-continued

| | | | | | | | | | | | | | |
|---|---|---|---|---|---|---|---|---|---|---|---|---|---|
| −1 | 7 | −1 | −1 | −1 | 135 | −1 | −1 | −1 | −1 | −1 | −1 | −1 | −1 |
| 192 | −1 | −1 | −1 | −1 | −1 | −1 | −1 | −1 | −1 | −1 | −1 | 114 | 68 |
| −1 | 100 | 109 | −1 | −1 | −1 | −1 | −1 | −1 | −1 | 86 | −1 | −1 | −1 |
| 144 | −1 | −1 | 170 | 20 | −1 | −1 | −1 | −1 | −1 | −1 | 140 | −1 | −1 |
| −1 | 233 | −1 | −1 | −1 | −1 | 120 | 140 | −1 | −1 | −1 | −1 | −1 | −1 |
| 61 | −1 | 13 | −1 | 41 | −1 | −1 | −1 | −1 | −1 | −1 | −1 | −1 | −1 |
| −1 | 231 | −1 | −1 | −1 | −1 | 152 | −1 | 62 | −1 | −1 | −1 | −1 | −1 |
| 128 | −1 | −1 | −1 | 91 | −1 | −1 | −1 | −1 | −1 | −1 | −1 | −1 | −1 |
| −1 | 170 | −1 | −1 | −1 | −1 | −1 | −1 | −1 | −1 | −1 | −1 | −1 | −1 |
| 40 | −1 | −1 | −1 | −1 | −1 | −1 | −1 | −1 | −1 | 183 | −1 | −1 | 136 |
| −1 | 161 | −1 | −1 | −1 | −1 | −1 | 79 | −1 | −1 | −1 | −1 | −1 | −1 |
| 35 | −1 | −1 | −1 | −1 | −1 | −1 | −1 | −1 | −1 | −1 | −1 | 144 | −1 |
| −1 | 254 | 69 | −1 | −1 | −1 | −1 | −1 | −1 | −1 | −1 | 215 | −1 | −1 |
| 129 | −1 | −1 | −1 | −1 | −1 | −1 | 89 | −1 | −1 | −1 | −1 | −1 | −1 |
| −1 | 95 | −1 | −1 | −1 | −1 | 59 | −1 | −1 | −1 | −1 | −1 | 49 | −1 |
| 219 | −1 | −1 | −1 | −1 | −1 | −1 | −1 | −1 | −1 | −1 | −1 | −1 | −1 |
| −1 | 58 | −1 | −1 | −1 | −1 | −1 | −1 | −1 | −1 | −1 | −1 | −1 | 36 |
| 89 | −1 | −1 | −1 | −1 | −1 | −1 | −1 | −1 | 105 | 99 | −1 | 93 | −1 |
| −1 | 83 | −1 | 117 | −1 | −1 | −1 | 107 | −1 | −1 | −1 | −1 | −1 | −1 |
| 99 | −1 | −1 | −1 | −1 | −1 | −1 | −1 | 119 | −1 | −1 | −1 | −1 | −1 |
| −1 | 89 | −1 | 83 | −1 | −1 | −1 | −1 | −1 | 117 | −1 | −1 | −1 | −1 |
| 107 | −1 | −1 | −1 | 99 | −1 | −1 | −1 | −1 | −1 | −1 | −1 | −1 | −1 |
| −1 | 105 | −1 | −1 | −1 | −1 | −1 | −1 | −1 | −1 | −1 | −1 | −1 | −1 |
| 117 | −1 | −1 | −1 | −1 | −1 | −1 | 99 | −1 | 93 | −1 | −1 | −1 | −1 |
| −1 | 107 | −1 | −1 | −1 | −1 | 105 | −1 | −1 | −1 | 89 | −1 | −1 | −1 |
| | | −1 | 61 | 233 | −1 | 66 | 221 | 17 | 225 | 0 | 0 | −1 | −1 |
| | | 147 | 124 | 114 | 101 | −1 | 1 | −1 | 228 | 1 | 0 | 0 | −1 |
| | | 31 | 31 | −1 | 11 | 51 | 5 | 139 | −1 | −1 | −1 | 0 | 0 |
| | | 45 | −1 | 16 | 180 | 12 | −1 | 112 | 244 | 0 | −1 | −1 | 0 |
| | | −1 | −1 | −1 | −1 | −1 | −1 | −1 | −1 | −1 | −1 | −1 | −1 |
| | | −1 | −1 | 228 | −1 | −1 | −1 | −1 | 133 | 142 | −1 | −1 | −1 |
| | | −1 | −1 | −1 | 245 | 99 | −1 | 45 | −1 | −1 | −1 | −1 | −1 |
| | | 152 | −1 | −1 | −1 | −1 | −1 | −1 | −1 | −1 | −1 | −1 | −1 |
| | | −1 | −1 | 154 | −1 | −1 | 92 | −1 | 147 | 16 | −1 | 166 | −1 |
| | | −1 | −1 | −1 | 242 | 195 | −1 | 40 | −1 | −1 | −1 | −1 | −1 |
| | | 198 | −1 | −1 | −1 | −1 | −1 | −1 | −1 | −1 | −1 | −1 | −1 |
| | | −1 | −1 | 74 | −1 | −1 | −1 | −1 | 178 | 5 | 234 | −1 | −1 |
| | | −1 | −1 | −1 | −1 | 249 | −1 | −1 | −1 | −1 | −1 | −1 | −1 |
| | | −1 | −1 | −1 | −1 | −1 | −1 | 71 | −1 | −1 | 194 | −1 | −1 |
| | | −1 | 50 | 129 | 240 | −1 | −1 | −1 | 27 | −1 | −1 | −1 | −1 |
| | | −1 | −1 | −1 | −1 | 181 | −1 | −1 | −1 | −1 | −1 | −1 | 77 |
| | | −1 | −1 | −1 | −1 | −1 | −1 | 205 | −1 | 103 | −1 | −1 | −1 |
| | | 92 | −1 | 197 | 255 | −1 | −1 | −1 | 112 | −1 | −1 | −1 | −1 |
| | | −1 | −1 | −1 | −1 | 101 | 109 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | −1 | −1 | −1 | 97 | −1 | −1 | −1 |
| | | −1 | −1 | 147 | −1 | −1 | −1 | 125 | 85 | −1 | −1 | −1 | −1 |
| | | −1 | −1 | −1 | 98 | −1 | −1 | −1 | −1 | −1 | −1 | −1 | −1 |
| | | −1 | −1 | −1 | −1 | 104 | −1 | −1 | −1 | −1 | −1 | −1 | −1 |
| | | −1 | −1 | −1 | −1 | −1 | −1 | −1 | −1 | 35 | −1 | −1 | −1 |
| | | 74 | −1 | −1 | −1 | −1 | −1 | −1 | −1 | −1 | −1 | −1 | −1 |
| | | −1 | 195 | −1 | −1 | −1 | −1 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | 75 | −1 | 193 | −1 | −1 | −1 | −1 |
| | | 20 | −1 | −1 | −1 | 172 | −1 | −1 | −1 | −1 | −1 | −1 | 250 |
| | | −1 | −1 | −1 | −1 | −1 | −1 | −1 | −1 | −1 | −1 | 247 | −1 |
| | | −1 | −1 | −1 | −1 | −1 | −1 | −1 | −1 | 85 | −1 | −1 | 195 |
| | | 57 | −1 | −1 | −1 | −1 | −1 | −1 | −1 | −1 | −1 | 135 | −1 |
| | | −1 | −1 | −1 | −1 | −1 | −1 | −1 | 45 | −1 | −1 | −1 | −1 |
| | | −1 | 92 | −1 | 97 | −1 | −1 | −1 | −1 | −1 | −1 | −1 | −1 |
| | | −1 | −1 | −1 | −1 | −1 | −1 | −1 | −1 | 154 | −1 | −1 | −1 |
| | | 151 | 205 | −1 | −1 | 136 | −1 | −1 | −1 | −1 | −1 | −1 | −1 |
| | | −1 | −1 | −1 | −1 | −1 | −1 | −1 | −1 | −1 | 134 | −1 | −1 |
| | | −1 | −1 | −1 | −1 | −1 | −1 | −1 | −1 | −1 | −1 | −1 | −1 |
| | | −1 | −1 | −1 | −1 | −1 | 0 | −1 | −1 | −1 | −1 | −1 | −1 |
| | | −1 | −1 | −1 | 107 | −1 | −1 | −1 | −1 | −1 | −1 | −1 | −1 |
| | | −1 | −1 | −1 | −1 | 105 | −1 | −1 | −1 | −1 | −1 | −1 | −1 |
| | | −1 | −1 | −1 | −1 | −1 | −1 | −1 | −1 | −1 | −1 | 119 | −1 |
| | | −1 | −1 | 93 | −1 | 83 | −1 | −1 | −1 | −1 | −1 | −1 | 117 |
| | | −1 | −1 | −1 | −1 | −1 | −1 | −1 | −1 | 84 | −1 | −1 | −1 |
| | | −1 | −1 | −1 | −1 | −1 | −1 | −1 | −1 | −1 | −1 | −1 | −1 |

TABLE 21

| | | | | | | | | | | | | | |
|---|---|---|---|---|---|---|---|---|---|---|---|---|---|
| 77 | 365 | 334 | 15 | −1 | 203 | 168 | −1 | −1 | 67 | 96 | 275 | 367 | 27 |
| 308 | −1 | 308 | 311 | 96 | 240 | −1 | 53 | 53 | 206 | −1 | 89 | 42 | −1 |

TABLE 21-continued

| | | | | | | | | | | | | | |
|---|---|---|---|---|---|---|---|---|---|---|---|---|---|
| 179 | 134 | 56 | −1 | 52 | 128 | 223 | 117 | 224 | 321 | 255 | −1 | −1 | 184 |
| 108 | 297 | −1 | 0 | 109 | −1 | 185 | 231 | 328 | −1 | 252 | 79 | 153 | 43 |
| 52 | 203 | −1 | −1 | −1 | −1 | −1 | −1 | −1 | −1 | −1 | −1 | −1 | −1 |
| 189 | 370 | −1 | 269 | −1 | −1 | −1 | −1 | −1 | −1 | −1 | −1 | 218 | −1 |
| 106 | −1 | −1 | −1 | −1 | −1 | 127 | −1 | −1 | −1 | 383 | 33 | −1 | 292 |
| 375 | 322 | −1 | −1 | 68 | −1 | −1 | 51 | 94 | −1 | −1 | −1 | −1 | −1 |
| 77 | 205 | −1 | 219 | −1 | −1 | −1 | −1 | −1 | −1 | −1 | −1 | 366 | −1 |
| 18 | 152 | −1 | −1 | −1 | −1 | −1 | −1 | −1 | −1 | 63 | 251 | −1 | 327 |
| −1 | 283 | 45 | −1 | 110 | −1 | −1 | 273 | 1 | −1 | −1 | −1 | −1 | −1 |
| 336 | 282 | −1 | −1 | −1 | −1 | −1 | −1 | −1 | −1 | −1 | −1 | 376 | −1 |
| 307 | 198 | −1 | −1 | −1 | −1 | −1 | −1 | −1 | −1 | 210 | 152 | −1 | 334 |
| 71 | −1 | −1 | 207 | −1 | −1 | −1 | 118 | −1 | −1 | −1 | −1 | −1 | −1 |
| 242 | −1 | −1 | −1 | −1 | −1 | −1 | −1 | −1 | −1 | −1 | −1 | 136 | −1 |
| 143 | 382 | −1 | −1 | −1 | −1 | −1 | −1 | −1 | −1 | 174 | −1 | −1 | 66 |
| −1 | 371 | −1 | 46 | −1 | −1 | −1 | −1 | −1 | −1 | −1 | 327 | −1 | −1 |
| 124 | −1 | −1 | −1 | −1 | −1 | −1 | −1 | −1 | −1 | −1 | −1 | −1 | −1 |
| −1 | 254 | −1 | −1 | −1 | −1 | −1 | −1 | −1 | −1 | −1 | −1 | 221 | 104 |
| 239 | 171 | −1 | −1 | −1 | −1 | −1 | 40 | 142 | −1 | 187 | −1 | −1 | −1 |
| 197 | −1 | −1 | 178 | −1 | −1 | −1 | −1 | −1 | 120 | −1 | 43 | −1 | −1 |
| −1 | 179 | −1 | −1 | −1 | 282 | −1 | −1 | −1 | −1 | −1 | −1 | −1 | −1 |
| 354 | −1 | −1 | −1 | −1 | −1 | −1 | −1 | −1 | −1 | −1 | −1 | 373 | 151 |
| −1 | 360 | 295 | −1 | −1 | −1 | −1 | −1 | −1 | −1 | 323 | −1 | −1 | −1 |
| 86 | −1 | −1 | 226 | 149 | −1 | −1 | −1 | −1 | −1 | −1 | 45 | −1 | −1 |
| −1 | 312 | −1 | −1 | −1 | −1 | 367 | 1 | −1 | −1 | −1 | −1 | −1 | −1 |
| 313 | −1 | 303 | −1 | 308 | −1 | −1 | −1 | −1 | −1 | −1 | −1 | −1 | −1 |
| −1 | 190 | −1 | −1 | −1 | −1 | 190 | −1 | 283 | −1 | −1 | −1 | −1 | −1 |
| 162 | −1 | −1 | −1 | 365 | −1 | −1 | −1 | −1 | −1 | −1 | −1 | −1 | −1 |
| −1 | 132 | −1 | −1 | −1 | −1 | −1 | −1 | −1 | −1 | −1 | −1 | −1 | −1 |
| 225 | −1 | −1 | −1 | −1 | −1 | −1 | −1 | −1 | −1 | 155 | −1 | −1 | 124 |
| −1 | 284 | −1 | −1 | −1 | −1 | −1 | 169 | −1 | −1 | −1 | −1 | −1 | −1 |
| 282 | −1 | −1 | −1 | −1 | −1 | −1 | −1 | −1 | −1 | −1 | −1 | 183 | −1 |
| −1 | 61 | 376 | −1 | −1 | −1 | −1 | −1 | −1 | −1 | −1 | 23 | −1 | −1 |
| 154 | −1 | −1 | −1 | −1 | −1 | −1 | 236 | −1 | −1 | −1 | −1 | −1 | −1 |
| −1 | 64 | −1 | −1 | −1 | −1 | 49 | −1 | −1 | −1 | −1 | −1 | 382 | −1 |
| 174 | −1 | −1 | −1 | −1 | −1 | −1 | −1 | −1 | −1 | −1 | −1 | −1 | −1 |
| −1 | 115 | −1 | −1 | −1 | −1 | −1 | −1 | −1 | −1 | −1 | −1 | −1 | 302 |
| 199 | 1 | −1 | −1 | −1 | −1 | −1 | −1 | −1 | 207 | 95 | −1 | 170 | −1 |
| −1 | 126 | −1 | 291 | −1 | −1 | −1 | 38 | −1 | −1 | −1 | −1 | −1 | −1 |
| 209 | −1 | −1 | −1 | −1 | −1 | −1 | −1 | 347 | −1 | −1 | −1 | −1 | −1 |
| −1 | 332 | −1 | 70 | −1 | −1 | −1 | −1 | −1 | 245 | −1 | −1 | −1 | −1 |
| 271 | −1 | −1 | −1 | 370 | −1 | −1 | −1 | −1 | −1 | −1 | −1 | −1 | −1 |
| −1 | 271 | −1 | −1 | −1 | −1 | −1 | −1 | −1 | −1 | −1 | −1 | −1 | −1 |
| 304 | −1 | −1 | −1 | −1 | −1 | −1 | 306 | −1 | 221 | −1 | −1 | −1 | −1 |
| −1 | 249 | −1 | −1 | −1 | −1 | 235 | −1 | −1 | −1 | 369 | −1 | −1 | −1 |

| | | | | | | | | | | | |
|---|---|---|---|---|---|---|---|---|---|---|---|
| −1 | 169 | 278 | −1 | 142 | 204 | 54 | 38 | 0 | 0 | −1 | −1 |
| 167 | 285 | 30 | 270 | −1 | 53 | −1 | 272 | 1 | 0 | 0 | −1 |
| 296 | 331 | −1 | 253 | 144 | 179 | 371 | −1 | −1 | −1 | 0 | 0 |
| 172 | −1 | 80 | 84 | 113 | −1 | 345 | 27 | 0 | −1 | −1 | 0 |
| −1 | −1 | −1 | −1 | −1 | −1 | −1 | −1 | −1 | −1 | −1 | −1 |
| −1 | −1 | 143 | −1 | −1 | −1 | −1 | 333 | 228 | −1 | −1 | −1 |
| −1 | −1 | −1 | 131 | 366 | −1 | 159 | −1 | −1 | −1 | −1 | −1 |
| 270 | −1 | −1 | −1 | −1 | −1 | −1 | −1 | −1 | −1 | −1 | −1 |
| −1 | −1 | 345 | −1 | −1 | 160 | −1 | 16 | 318 | −1 | 214 | −1 |
| −1 | −1 | −1 | 81 | 321 | −1 | 302 | −1 | −1 | −1 | −1 | −1 |
| 30 | −1 | −1 | −1 | −1 | −1 | −1 | −1 | −1 | −1 | −1 | −1 |
| −1 | −1 | 337 | −1 | −1 | −1 | −1 | 196 | 51 | 269 | −1 | −1 |
| −1 | −1 | −1 | −1 | 310 | −1 | −1 | −1 | −1 | −1 | −1 | −1 |
| −1 | −1 | −1 | −1 | −1 | −1 | 269 | −1 | −1 | 14 | −1 | −1 |
| −1 | 247 | 295 | 37 | −1 | −1 | −1 | 372 | −1 | −1 | −1 | −1 |
| −1 | −1 | −1 | −1 | 329 | −1 | −1 | −1 | −1 | −1 | −1 | 115 |
| −1 | −1 | −1 | −1 | −1 | −1 | 95 | −1 | 328 | −1 | −1 | −1 |
| 81 | −1 | 303 | 26 | −1 | −1 | −1 | 9 | −1 | −1 | −1 | −1 |
| −1 | −1 | −1 | −1 | 252 | 380 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 326 | −1 | −1 | −1 |
| −1 | −1 | 56 | −1 | −1 | −1 | 171 | 287 | −1 | −1 | −1 | −1 |
| −1 | −1 | −1 | 362 | −1 | −1 | −1 | −1 | −1 | −1 | −1 | −1 |
| −1 | −1 | −1 | −1 | 357 | −1 | −1 | −1 | −1 | −1 | −1 | −1 |
| −1 | −1 | −1 | −1 | −1 | −1 | −1 | −1 | 151 | −1 | −1 | −1 |
| 72 | −1 | −1 | −1 | −1 | −1 | −1 | −1 | −1 | −1 | −1 | −1 |
| −1 | 248 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 140 | −1 | 110 | −1 | −1 | −1 | −1 |
| 379 | −1 | −1 | −1 | 237 | −1 | −1 | −1 | −1 | −1 | −1 | 306 |
| −1 | −1 | −1 | −1 | −1 | −1 | −1 | −1 | −1 | −1 | 294 | −1 |
| −1 | −1 | −1 | −1 | −1 | −1 | −1 | −1 | 127 | −1 | −1 | 128 |
| 209 | −1 | −1 | −1 | −1 | −1 | −1 | −1 | −1 | −1 | 97 | −1 |
| −1 | −1 | −1 | −1 | −1 | −1 | −1 | 279 | −1 | −1 | −1 | −1 |
| −1 | 182 | −1 | 72 | −1 | −1 | −1 | −1 | −1 | −1 | −1 | −1 |

TABLE 21-continued

| | | | | | | | | | | | |
|---|---|---|---|---|---|---|---|---|---|---|---|
| -1 | -1 | -1 | -1 | -1 | -1 | -1 | -1 | 119 | -1 | -1 | -1 |
| 71 | 87 | -1 | -1 | 363 | -1 | -1 | -1 | -1 | -1 | -1 | -1 |
| -1 | -1 | -1 | -1 | -1 | -1 | -1 | -1 | -1 | 269 | -1 | -1 |
| -1 | -1 | -1 | -1 | -1 | -1 | -1 | -1 | -1 | -1 | -1 | -1 |
| -1 | -1 | -1 | -1 | -1 | 87 | -1 | -1 | -1 | -1 | -1 | -1 |
| -1 | -1 | -1 | 72 | -1 | -1 | -1 | -1 | -1 | -1 | -1 | -1 |
| -1 | -1 | -1 | -1 | 96 | -1 | -1 | -1 | -1 | -1 | -1 | -1 |
| -1 | -1 | -1 | -1 | -1 | -1 | -1 | -1 | -1 | -1 | 166 | -1 |
| -1 | -1 | 252 | -1 | 270 | -1 | -1 | -1 | -1 | -1 | -1 | 216 |
| -1 | -1 | -1 | -1 | -1 | -1 | -1 | -1 | 111 | -1 | -1 | -1 |
| -1 | -1 | -1 | -1 | -1 | -1 | -1 | -1 | -1 | -1 | -1 | -1 |

TABLE 22

| | | | | | | | | | | | | | |
|---|---|---|---|---|---|---|---|---|---|---|---|---|---|
| 247 | 305 | 217 | 271 | -1 | 80 | 281 | -1 | -1 | 305 | 158 | 105 | 156 | 187 |
| 17 | -1 | 26 | 293 | 59 | 159 | -1 | 187 | 316 | 240 | -1 | 191 | 20 | -1 |
| 252 | 313 | 240 | -1 | 40 | 282 | 93 | 118 | 120 | 249 | 214 | -1 | -1 | 25 |
| 100 | 112 | -1 | 290 | 123 | -1 | 259 | 145 | 241 | -1 | 39 | 17 | 67 | 156 |
| 87 | 115 | -1 | -1 | -1 | -1 | -1 | -1 | -1 | -1 | -1 | -1 | -1 | -1 |
| 237 | 28 | -1 | 270 | -1 | -1 | -1 | -1 | -1 | -1 | -1 | -1 | 2 | -1 |
| 31 | -1 | -1 | -1 | -1 | -1 | 299 | -1 | -1 | -1 | 27 | 307 | -1 | 88 |
| 308 | 232 | -1 | -1 | 113 | -1 | -1 | 270 | 295 | -1 | -1 | -1 | -1 | -1 |
| 25 | 187 | -1 | 190 | -1 | -1 | -1 | -1 | -1 | -1 | -1 | -1 | 89 | -1 |
| 131 | 76 | -1 | -1 | -1 | -1 | -1 | -1 | -1 | -1 | 284 | 34 | -1 | 169 |
| -1 | 306 | 240 | -1 | 109 | -1 | -1 | 245 | 159 | -1 | -1 | -1 | -1 | -1 |
| 304 | 173 | -1 | -1 | -1 | -1 | -1 | -1 | -1 | -1 | -1 | -1 | 30 | -1 |
| 91 | 85 | -1 | -1 | -1 | -1 | -1 | -1 | -1 | -1 | 151 | 272 | -1 | 215 |
| 281 | -1 | -1 | 18 | -1 | -1 | -1 | 17 | -1 | -1 | -1 | -1 | -1 | -1 |
| 242 | -1 | -1 | -1 | -1 | -1 | -1 | -1 | -1 | -1 | -1 | -1 | 21 | -1 |
| 91 | 30 | -1 | -1 | -1 | -1 | -1 | -1 | -1 | -1 | 260 | -1 | -1 | 190 |
| -1 | 251 | -1 | 180 | -1 | -1 | -1 | -1 | -1 | -1 | -1 | 275 | -1 | -1 |
| 63 | -1 | -1 | -1 | -1 | -1 | -1 | -1 | -1 | -1 | -1 | -1 | -1 | -1 |
| -1 | 60 | -1 | -1 | -1 | -1 | -1 | -1 | -1 | -1 | -1 | -1 | 26 | 29 |
| 256 | 139 | -1 | -1 | -1 | -1 | -1 | 219 | 50 | -1 | 279 | -1 | -1 | -1 |
| 19 | -1 | -1 | 158 | -1 | -1 | -1 | -1 | -1 | 280 | -1 | 190 | -1 | -1 |
| -1 | 241 | -1 | -1 | -1 | 145 | -1 | -1 | -1 | -1 | -1 | -1 | -1 | -1 |
| 143 | -1 | -1 | -1 | -1 | -1 | -1 | -1 | -1 | -1 | -1 | -1 | 300 | 265 |
| -1 | 71 | 270 | -1 | -1 | -1 | -1 | -1 | -1 | -1 | 187 | -1 | -1 | -1 |
| 31 | -1 | -1 | 40 | 210 | -1 | -1 | -1 | -1 | -1 | -1 | 133 | -1 | -1 |
| -1 | 148 | -1 | -1 | -1 | -1 | 25 | 224 | -1 | -1 | -1 | -1 | -1 | -1 |
| 50 | -1 | 210 | -1 | 2 | -1 | -1 | -1 | -1 | -1 | -1 | -1 | -1 | -1 |
| -1 | 110 | -1 | -1 | -1 | -1 | 291 | -1 | 16 | -1 | -1 | -1 | -1 | -1 |
| 309 | -1 | -1 | -1 | 27 | -1 | -1 | -1 | -1 | -1 | -1 | -1 | -1 | -1 |
| -1 | 293 | -1 | -1 | -1 | -1 | -1 | -1 | -1 | -1 | -1 | -1 | -1 | -1 |
| 229 | -1 | -1 | -1 | -1 | -1 | -1 | -1 | -1 | -1 | 297 | -1 | -1 | 215 |
| -1 | 98 | -1 | -1 | -1 | -1 | -1 | 12 | -1 | -1 | -1 | -1 | -1 | -1 |
| 110 | -1 | -1 | -1 | -1 | -1 | -1 | -1 | -1 | -1 | -1 | -1 | 298 | -1 |
| -1 | 150 | 300 | -1 | -1 | -1 | -1 | -1 | -1 | -1 | -1 | 180 | -1 | -1 |
| 133 | -1 | -1 | -1 | -1 | -1 | -1 | 24 | -1 | -1 | -1 | -1 | -1 | -1 |
| -1 | 113 | -1 | -1 | -1 | -1 | 162 | -1 | -1 | -1 | -1 | -1 | 265 | -1 |
| 61 | -1 | -1 | -1 | -1 | -1 | -1 | -1 | -1 | -1 | -1 | -1 | -1 | -1 |
| -1 | 22 | -1 | -1 | -1 | -1 | -1 | -1 | -1 | -1 | -1 | -1 | -1 | 305 |
| 169 | -1 | -1 | -1 | -1 | -1 | -1 | -1 | -1 | 141 | 256 | -1 | 139 | -1 |
| -1 | 218 | -1 | 243 | -1 | -1 | -1 | 128 | -1 | -1 | -1 | -1 | -1 | -1 |
| 288 | -1 | -1 | -1 | -1 | -1 | -1 | -1 | 240 | -1 | -1 | -1 | -1 | -1 |
| -1 | 166 | -1 | 273 | -1 | -1 | -1 | -1 | -1 | 196 | -1 | -1 | -1 | -1 |
| 94 | -1 | -1 | -1 | 255 | -1 | -1 | -1 | -1 | -1 | -1 | -1 | -1 | -1 |
| -1 | 92 | -1 | -1 | -1 | -1 | -1 | -1 | -1 | -1 | -1 | -1 | -1 | -1 |
| 86 | -1 | -1 | -1 | -1 | -1 | -1 | 93 | -1 | 61 | -1 | -1 | -1 | -1 |
| -1 | 219 | -1 | -1 | -1 | -1 | 92 | -1 | -1 | -1 | 194 | -1 | -1 | -1 |

| | | | | | | | | | | | |
|---|---|---|---|---|---|---|---|---|---|---|---|
| -1 | 22 | 210 | -1 | 207 | 304 | 131 | 288 | 0 | 0 | -1 | -1 |
| 244 | 54 | 248 | 237 | -1 | 60 | -1 | 19 | 1 | 0 | 0 | -1 |
| 37 | 19 | -1 | 136 | 74 | 90 | 44 | -1 | -1 | -1 | 0 | 0 |
| 267 | -1 | 276 | 292 | 243 | -1 | 1 | 252 | 0 | -1 | -1 | 0 |
| -1 | -1 | -1 | -1 | -1 | -1 | -1 | -1 | -1 | -1 | -1 | -1 |
| -1 | -1 | 119 | -1 | -1 | -1 | -1 | 53 | 42 | -1 | -1 | -1 |
| -1 | -1 | -1 | 18 | 182 | -1 | 85 | -1 | -1 | -1 | -1 | -1 |
| 244 | -1 | -1 | -1 | -1 | -1 | -1 | -1 | -1 | -1 | -1 | -1 |
| -1 | -1 | 24 | -1 | -1 | 210 | 1 | 51 | 76 | -1 | 166 | -1 |
| -1 | -1 | -1 | 53 | 185 | -1 | 111 | -1 | -1 | -1 | -1 | -1 |
| 9 | -1 | -1 | -1 | -1 | -1 | -1 | -1 | -1 | -1 | -1 | -1 |
| -1 | -1 | 31 | -1 | -1 | -1 | -1 | 143 | 278 | 40 | -1 | -1 |
| -1 | 1 | -1 | -1 | 268 | -1 | -1 | -1 | -1 | -1 | -1 | -1 |
| -1 | -1 | -1 | -1 | -1 | -1 | 160 | -1 | -1 | 283 | -1 | -1 |
| -1 | 266 | 259 | 141 | -1 | -1 | -1 | 62 | -1 | -1 | -1 | -1 |
| -1 | -1 | -1 | -1 | 136 | -1 | -1 | -1 | -1 | -1 | -1 | 269 |

TABLE 22-continued

| | | | | | | | | | | | |
|---|---|---|---|---|---|---|---|---|---|---|---|
| −1 | −1 | −1 | −1 | −1 | −1 | 205 | −1 | 21 | −1 | −1 | −1 |
| 173 | −1 | 192 | 269 | −1 | −1 | −1 | 92 | −1 | −1 | −1 | −1 |
| −1 | −1 | −1 | −1 | 179 | 25 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 311 | −1 | −1 | −1 |
| −1 | −1 | 188 | −1 | −1 | −1 | 37 | 217 | −1 | −1 | −1 | −1 |
| −1 | −1 | −1 | 4 | −1 | −1 | −1 | −1 | −1 | −1 | −1 | −1 |
| −1 | −1 | −1 | −1 | 215 | −1 | −1 | −1 | −1 | −1 | −1 | −1 |
| −1 | −1 | −1 | −1 | −1 | −1 | −1 | −1 | 40 | −1 | −1 | −1 |
| 274 | −1 | −1 | −1 | −1 | −1 | −1 | −1 | −1 | −1 | −1 | −1 |
| −1 | 253 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 270 | −1 | 86 | −1 | −1 | −1 | −1 |
| 12 | −1 | −1 | −1 | 203 | −1 | −1 | −1 | −1 | −1 | −1 | 291 |
| −1 | −1 | −1 | −1 | −1 | −1 | −1 | −1 | −1 | −1 | 185 | −1 |
| −1 | −1 | −1 | −1 | −1 | −1 | −1 | −1 | 255 | −1 | −1 | 158 |
| 49 | −1 | −1 | −1 | −1 | −1 | −1 | −1 | −1 | −1 | 103 | −1 |
| −1 | −1 | −1 | −1 | −1 | −1 | −1 | 287 | −1 | −1 | −1 | −1 |
| −1 | 315 | −1 | 276 | −1 | −1 | −1 | −1 | −1 | −1 | −1 | −1 |
| −1 | −1 | −1 | −1 | −1 | −1 | −1 | −1 | 36 | −1 | −1 | −1 |
| 141 | 142 | −1 | −1 | 160 | −1 | −1 | −1 | −1 | −1 | −1 | −1 |
| −1 | 1 | 1 | −1 | −1 | 1 | 1 | −1 | −1 | 205 | −1 | −1 |
| −1 | −1 | −1 | −1 | −1 | −1 | −1 | −1 | −1 | −1 | −1 | −1 |
| −1 | −1 | −1 | −1 | −1 | 112 | −1 | −1 | −1 | −1 | −1 | −1 |
| −1 | −1 | −1 | 123 | −1 | −1 | −1 | −1 | −1 | −1 | −1 | −1 |
| −1 | −1 | −1 | −1 | 113 | −1 | −1 | −1 | −1 | −1 | −1 | −1 |
| −1 | −1 | −1 | −1 | −1 | −1 | −1 | −1 | −1 | −1 | 194 | −1 |
| −1 | −1 | 251 | −1 | 144 | −1 | −1 | −1 | −1 | −1 | −1 | 218 |
| −1 | −1 | −1 | −1 | −1 | −1 | −1 | −1 | 61 | −1 | −1 | −1 |
| −1 | −1 | −1 | −1 | −1 | −1 | −1 | −1 | −1 | −1 | −1 | −1 |

TABLE 23

| | | | | | | | | | | | | | |
|---|---|---|---|---|---|---|---|---|---|---|---|---|---|
| 1 | 208 | 130 | 133 | −1 | 150 | 214 | −1 | −1 | 0 | 19 | 8 | 203 | 9 |
| 83 | −1 | 179 | 73 | 178 | 105 | −1 | 67 | 91 | 137 | −1 | 18 | 131 | −1 |
| 17 | 21 | 193 | −1 | 48 | 44 | 38 | 129 | 71 | 47 | 154 | −1 | −1 | 147 |
| 23 | 206 | −1 | 59 | 219 | −1 | 179 | 82 | 208 | −1 | 190 | 69 | 11 | 77 |
| 54 | 214 | −1 | −1 | −1 | −1 | −1 | −1 | −1 | −1 | −1 | −1 | −1 | −1 |
| 60 | 165 | −1 | 138 | −1 | −1 | −1 | −1 | −1 | −1 | −1 | −1 | 144 | −1 |
| 66 | −1 | −1 | −1 | −1 | −1 | 105 | −1 | −1 | −1 | 111 | 203 | −1 | 161 |
| 207 | 148 | −1 | −1 | 120 | −1 | −1 | 124 | 74 | −1 | −1 | −1 | −1 | −1 |
| 191 | 129 | −1 | 220 | −1 | −1 | −1 | −1 | −1 | −1 | −1 | −1 | 7 | −1 |
| 215 | 187 | −1 | −1 | −1 | −1 | −1 | −1 | −1 | −1 | 11 | 119 | −1 | 135 |
| −1 | 142 | 59 | −1 | 50 | −1 | −1 | 205 | 30 | −1 | −1 | −1 | −1 | −1 |
| 172 | 213 | −1 | −1 | −1 | −1 | −1 | −1 | −1 | −1 | −1 | −1 | 222 | −1 |
| 82 | 49 | −1 | −1 | −1 | −1 | −1 | −1 | −1 | −1 | 88 | 221 | −1 | 196 |
| 143 | −1 | −1 | 168 | −1 | −1 | −1 | 152 | −1 | −1 | −1 | −1 | −1 | −1 |
| 210 | −1 | −1 | −1 | −1 | −1 | −1 | −1 | −1 | −1 | −1 | −1 | 49 | −1 |
| 134 | 104 | −1 | −1 | −1 | −1 | −1 | −1 | −1 | −1 | 93 | −1 | −1 | 15 |
| −1 | 70 | −1 | 60 | −1 | −1 | −1 | −1 | −1 | −1 | −1 | 181 | −1 | −1 |
| 168 | −1 | −1 | −1 | −1 | −1 | −1 | −1 | −1 | −1 | −1 | −1 | −1 | −1 |
| −1 | 25 | −1 | −1 | −1 | −1 | −1 | −1 | −1 | −1 | −1 | −1 | 114 | 24 |
| 216 | 218 | −1 | −1 | −1 | −1 | −1 | 121 | 26 | −1 | 216 | −1 | −1 | −1 |
| 119 | −1 | −1 | 14 | −1 | −1 | −1 | −1 | −1 | 103 | −1 | 10 | −1 | −1 |
| −1 | 32 | −1 | −1 | −1 | 93 | −1 | −1 | −1 | −1 | −1 | −1 | −1 | −1 |
| 171 | −1 | −1 | −1 | −1 | −1 | −1 | −1 | −1 | −1 | −1 | −1 | 0 | 221 |
| −1 | 136 | 21 | −1 | −1 | −1 | −1 | −1 | −1 | −1 | 56 | −1 | −1 | −1 |
| 175 | −1 | −1 | 67 | 160 | −1 | −1 | −1 | −1 | −1 | −1 | 31 | −1 | −1 |
| −1 | 223 | −1 | −1 | −1 | −1 | 58 | 159 | −1 | −1 | −1 | −1 | −1 | −1 |
| 117 | −1 | 48 | −1 | 12 | −1 | −1 | −1 | −1 | −1 | −1 | −1 | −1 | −1 |
| −1 | 16 | −1 | −1 | −1 | −1 | 83 | −1 | 50 | −1 | −1 | −1 | −1 | −1 |
| 78 | −1 | −1 | −1 | 71 | −1 | −1 | −1 | −1 | −1 | −1 | −1 | −1 | −1 |
| −1 | 74 | −1 | −1 | −1 | −1 | −1 | −1 | −1 | −1 | −1 | −1 | −1 | −1 |
| 190 | −1 | −1 | −1 | −1 | −1 | −1 | −1 | −1 | −1 | 94 | −1 | −1 | 14 |
| −1 | 49 | −1 | −1 | −1 | −1 | −1 | 175 | −1 | −1 | −1 | −1 | −1 | −1 |
| 32 | −1 | −1 | −1 | −1 | −1 | −1 | −1 | −1 | −1 | −1 | −1 | 15 | −1 |
| −1 | 110 | 175 | −1 | −1 | −1 | −1 | −1 | −1 | −1 | −1 | 63 | −1 | −1 |
| 142 | −1 | −1 | −1 | −1 | −1 | −1 | 38 | −1 | −1 | −1 | −1 | −1 | −1 |
| −1 | 32 | −1 | −1 | −1 | −1 | 51 | −1 | −1 | −1 | −1 | −1 | 198 | −1 |
| 2 | −1 | −1 | −1 | −1 | −1 | −1 | −1 | −1 | −1 | −1 | −1 | −1 | −1 |
| −1 | 143 | −1 | −1 | −1 | −1 | −1 | −1 | −1 | −1 | −1 | −1 | −1 | 29 |
| 101 | −1 | −1 | −1 | −1 | −1 | −1 | −1 | −1 | 134 | 151 | −1 | 214 | −1 |
| −1 | 212 | −1 | 147 | −1 | −1 | −1 | 175 | −1 | −1 | −1 | −1 | −1 | −1 |
| 157 | −1 | −1 | −1 | −1 | −1 | −1 | −1 | 179 | −1 | −1 | −1 | −1 | −1 |
| −1 | 201 | −1 | 9 | −1 | −1 | −1 | −1 | −1 | 164 | −1 | −1 | −1 | −1 |
| 110 | −1 | −1 | −1 | 133 | −1 | −1 | −1 | −1 | −1 | −1 | −1 | −1 | −1 |
| −1 | 18 | −1 | −1 | −1 | −1 | −1 | −1 | −1 | −1 | −1 | −1 | −1 | −1 |

TABLE 23-continued

| 140 | −1 | −1 | −1 | −1 | −1 | −1 | 220 | −1 | 215 | −1 | −1 | −1 | −1 |
|---|---|---|---|---|---|---|---|---|---|---|---|---|---|
| −1 | 40 | −1 | 1 | 1 | −1 | 103 | 1 | 1 | −1 | 195 | −1 | −1 | −1 |
| | | −1 | 210 | 154 | −1 | 83 | 26 | 120 | 143 | 0 | 0 | −1 | −1 |
| | | 145 | 215 | 106 | 30 | −1 | 193 | −1 | 37 | 1 | 0 | 0 | −1 |
| | | 10 | 147 | −1 | 26 | 107 | 1 | 134 | −1 | −1 | −1 | 0 | 0 |
| | | 155 | −1 | 128 | 150 | 125 | −1 | 194 | 66 | 0 | −1 | −1 | 0 |
| | | −1 | −1 | −1 | −1 | −1 | −1 | −1 | −1 | −1 | −1 | −1 | −1 |
| | | −1 | −1 | 42 | −1 | −1 | −1 | −1 | 94 | 72 | −1 | −1 | −1 |
| | | −1 | −1 | −1 | 173 | 88 | −1 | 108 | −1 | −1 | −1 | −1 | −1 |
| | | 66 | −1 | −1 | −1 | −1 | −1 | −1 | −1 | −1 | −1 | −1 | −1 |
| | | −1 | −1 | 20 | −1 | −1 | 185 | −1 | 166 | 181 | −1 | 23 | −1 |
| | | −1 | −1 | −1 | 39 | 115 | −1 | 6 | −1 | −1 | −1 | −1 | −1 |
| | | 121 | −1 | −1 | −1 | −1 | −1 | −1 | −1 | −1 | −1 | −1 | −1 |
| | | −1 | −1 | 189 | −1 | −1 | −1 | −1 | 192 | 141 | 23 | −1 | −1 |
| | | −1 | −1 | −1 | −1 | 42 | −1 | −1 | −1 | −1 | −1 | −1 | −1 |
| | | −1 | −1 | −1 | −1 | −1 | −1 | 7 | −1 | −1 | 146 | −1 | −1 |
| | | −1 | 13 | 33 | 173 | −1 | −1 | −1 | 181 | −1 | −1 | −1 | −1 |
| | | −1 | −1 | −1 | −1 | 15 | −1 | −1 | −1 | −1 | −1 | −1 | 143 |
| | | −1 | −1 | −1 | −1 | −1 | −1 | 35 | −1 | 124 | −1 | −1 | −1 |
| | | 114 | −1 | 24 | 161 | −1 | −1 | −1 | 220 | −1 | −1 | −1 | −1 |
| | | −1 | −1 | −1 | −1 | 81 | 38 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | −1 | −1 | −1 | 42 | −1 | −1 | −1 |
| | | −1 | −1 | 4 | −1 | −1 | −1 | 174 | 118 | −1 | −1 | −1 | −1 |
| | | −1 | −1 | −1 | 76 | −1 | −1 | −1 | −1 | −1 | −1 | −1 | −1 |
| | | −1 | −1 | −1 | −1 | 102 | −1 | −1 | −1 | −1 | −1 | −1 | −1 |
| | | −1 | −1 | −1 | −1 | −1 | −1 | −1 | −1 | 101 | −1 | −1 | −1 |
| | | 143 | −1 | −1 | −1 | −1 | −1 | −1 | −1 | −1 | −1 | −1 | −1 |
| | | −1 | 97 | −1 | −1 | −1 | −1 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | 7 | −1 | 110 | −1 | −1 | −1 | −1 |
| | | 213 | −1 | −1 | −1 | 171 | −1 | −1 | −1 | −1 | −1 | −1 | 156 |
| | | −1 | −1 | −1 | −1 | −1 | −1 | −1 | −1 | −1 | −1 | 101 | −1 |
| | | −1 | −1 | −1 | −1 | −1 | −1 | −1 | −1 | 48 | −1 | −1 | 96 |
| | | 166 | −1 | −1 | −1 | −1 | −1 | −1 | −1 | −1 | −1 | 194 | −1 |
| | | −1 | −1 | −1 | −1 | −1 | −1 | −1 | 87 | −1 | −1 | −1 | −1 |
| | | −1 | 156 | −1 | 74 | −1 | −1 | −1 | −1 | −1 | −1 | −1 | −1 |
| | | −1 | −1 | −1 | −1 | −1 | −1 | −1 | −1 | 38 | −1 | −1 | −1 |
| | | 67 | 0 | −1 | −1 | 218 | −1 | −1 | −1 | −1 | −1 | −1 | −1 |
| | | −1 | −1 | −1 | −1 | −1 | −1 | −1 | −1 | −1 | 86 | −1 | −1 |
| | | −1 | −1 | −1 | −1 | −1 | −1 | −1 | −1 | −1 | −1 | −1 | −1 |
| | | −1 | −1 | −1 | −1 | −1 | 110 | −1 | −1 | −1 | −1 | −1 | −1 |
| | | −1 | −1 | −1 | 128 | −1 | −1 | −1 | −1 | −1 | −1 | −1 | −1 |
| | | −1 | −1 | −1 | −1 | 57 | −1 | −1 | −1 | −1 | −1 | −1 | −1 |
| | | −1 | −1 | −1 | −1 | −1 | −1 | −1 | −1 | −1 | −1 | 146 | −1 |
| | | −1 | −1 | 202 | −1 | 90 | −1 | −1 | −1 | −1 | −1 | −1 | 63 |
| | | −1 | −1 | −1 | −1 | −1 | −1 | −1 | −1 | 213 | −1 | −1 | −1 |
| | | −1 | −1 | −1 | −1 | −1 | −1 | −1 | −1 | −1 | −1 | −1 | −1 |

TABLE 24

| 77 | 90 | 100 | 102 | −1 | 69 | 284 | −1 | −1 | 259 | 144 | 172 | 72 | 173 |
|---|---|---|---|---|---|---|---|---|---|---|---|---|---|
| 109 | −1 | 126 | 65 | 32 | 128 | −1 | 212 | 86 | 171 | −1 | 179 | 273 | −1 |
| 30 | 121 | 68 | −1 | 155 | 45 | 86 | 70 | 225 | 0 | 285 | −1 | −1 | 214 |
| 101 | 143 | −1 | 122 | 180 | −1 | 206 | 156 | 91 | −1 | 247 | 126 | 231 | 252 |
| 42 | 53 | −1 | −1 | −1 | −1 | −1 | −1 | −1 | −1 | −1 | −1 | −1 | −1 |
| 27 | 107 | −1 | 216 | −1 | −1 | −1 | −1 | −1 | −1 | −1 | −1 | 5 | −1 |
| 208 | −1 | −1 | −1 | −1 | −1 | 144 | −1 | −1 | −1 | 119 | 198 | −1 | 229 |
| 119 | 99 | −1 | −1 | 134 | −1 | −1 | 104 | 184 | −1 | −1 | −1 | −1 | −1 |
| 234 | 0 | −1 | 36 | −1 | −1 | −1 | −1 | −1 | −1 | −1 | −1 | 247 | −1 |
| 126 | 129 | −1 | −1 | −1 | −1 | −1 | −1 | −1 | −1 | 195 | 154 | −1 | 243 |
| −1 | 110 | 287 | −1 | 260 | −1 | −1 | 21 | 54 | −1 | −1 | −1 | −1 | −1 |
| 233 | 265 | −1 | −1 | −1 | −1 | −1 | −1 | −1 | −1 | −1 | −1 | 14 | −1 |
| 63 | 126 | −1 | −1 | −1 | −1 | −1 | −1 | −1 | −1 | 44 | 137 | −1 | 50 |
| 57 | −1 | −1 | 0 | −1 | −1 | −1 | 72 | −1 | −1 | −1 | −1 | −1 | −1 |
| 0 | −1 | −1 | −1 | −1 | −1 | −1 | −1 | −1 | −1 | −1 | −1 | 102 | −1 |
| 118 | 0 | −1 | −1 | −1 | −1 | −1 | −1 | −1 | −1 | 105 | −1 | −1 | 180 |
| −1 | 18 | −1 | 275 | −1 | −1 | −1 | −1 | −1 | −1 | −1 | 189 | −1 | −1 |
| 135 | −1 | −1 | −1 | −1 | −1 | −1 | −1 | −1 | −1 | −1 | −1 | −1 | −1 |
| −1 | 127 | −1 | −1 | −1 | −1 | −1 | −1 | −1 | −1 | −1 | −1 | 137 | 0 |
| 0 | 0 | −1 | −1 | −1 | −1 | −1 | 170 | 144 | −1 | 0 | −1 | −1 | −1 |
| 23 | −1 | −1 | 207 | −1 | −1 | −1 | −1 | −1 | 198 | −1 | 144 | −1 | −1 |
| −1 | 224 | −1 | −1 | −1 | 242 | −1 | −1 | −1 | −1 | −1 | −1 | −1 | −1 |
| 216 | −1 | −1 | −1 | −1 | −1 | −1 | −1 | −1 | −1 | −1 | −1 | 99 | 216 |
| −1 | 108 | 0 | −1 | −1 | −1 | −1 | −1 | −1 | −1 | 0 | −1 | −1 | −1 |
| 52 | −1 | −1 | 89 | 0 | −1 | −1 | −1 | −1 | −1 | −1 | 22 | −1 | −1 |

TABLE 24-continued

| | | | | | | | | | | | | | |
|---|---|---|---|---|---|---|---|---|---|---|---|---|---|
| −1 | 83 | −1 | −1 | −1 | −1 | 0 | 0 | −1 | −1 | −1 | −1 | −1 | −1 |
| 0 | −1 | 0 | −1 | 0 | −1 | −1 | −1 | −1 | −1 | −1 | −1 | −1 | −1 |
| −1 | 243 | −1 | −1 | −1 | −1 | 252 | −1 | 216 | −1 | −1 | −1 | −1 | −1 |
| 13 | −1 | −1 | −1 | 0 | −1 | −1 | −1 | −1 | −1 | −1 | −1 | −1 | −1 |
| −1 | 0 | −1 | −1 | −1 | −1 | −1 | −1 | −1 | −1 | −1 | −1 | −1 | −1 |
| 0 | −1 | −1 | −1 | −1 | −1 | −1 | −1 | −1 | −1 | 198 | −1 | −1 | 36 |
| −1 | 144 | −1 | −1 | −1 | −1 | −1 | 144 | −1 | −1 | −1 | −1 | −1 | −1 |
| 0 | −1 | −1 | −1 | −1 | −1 | −1 | −1 | −1 | −1 | −1 | −1 | 77 | −1 |
| −1 | 0 | 0 | −1 | −1 | −1 | −1 | −1 | −1 | −1 | −1 | 212 | −1 | −1 |
| 91 | −1 | −1 | −1 | −1 | −1 | −1 | 0 | −1 | −1 | −1 | −1 | −1 | −1 |
| −1 | 89 | −1 | −1 | −1 | −1 | 10 | −1 | −1 | −1 | −1 | −1 | 0 | −1 |
| 72 | −1 | −1 | −1 | −1 | −1 | −1 | −1 | −1 | −1 | −1 | −1 | −1 | −1 |
| −1 | 216 | −1 | −1 | −1 | −1 | −1 | −1 | −1 | −1 | −1 | −1 | −1 | 144 |
| 98 | −1 | −1 | −1 | −1 | −1 | −1 | −1 | −1 | 0 | 0 | −1 | 0 | −1 |
| −1 | 135 | −1 | 0 | −1 | −1 | −1 | 123 | −1 | −1 | −1 | −1 | −1 | −1 |
| 72 | −1 | −1 | −1 | −1 | −1 | −1 | −1 | 144 | −1 | −1 | −1 | −1 | −1 |
| −1 | 0 | −1 | 0 | −1 | −1 | −1 | −1 | −1 | 0 | −1 | −1 | −1 | −1 |
| 261 | −1 | −1 | −1 | 0 | −1 | −1 | −1 | −1 | −1 | −1 | −1 | −1 | −1 |
| −1 | 236 | −1 | −1 | −1 | −1 | −1 | −1 | −1 | −1 | −1 | −1 | −1 | −1 |
| 270 | −1 | −1 | −1 | −1 | −1 | −1 | 0 | −1 | 0 | −1 | −1 | −1 | −1 |
| −1 | 120 | −1 | −1 | −1 | −1 | 0 | −1 | −1 | −1 | 144 | −1 | −1 | −1 |
| | | −1 | 55 | 144 | −1 | 193 | 72 | 215 | 27 | 0 | 0 | −1 | −1 |
| | | 216 | 136 | 130 | 141 | −1 | 132 | −1 | 169 | 1 | 0 | 0 | −1 |
| | | 59 | 0 | −1 | 72 | 19 | 88 | 54 | −1 | −1 | −1 | 0 | 0 |
| | | 173 | −1 | 46 | 123 | 0 | −1 | 175 | 180 | 0 | −1 | −1 | 0 |
| | | −1 | −1 | −1 | −1 | −1 | −1 | −1 | −1 | −1 | −1 | −1 | −1 |
| | | −1 | −1 | 34 | −1 | −1 | −1 | −1 | 209 | 145 | −1 | −1 | −1 |
| | | −1 | −1 | −1 | 111 | 137 | −1 | 180 | −1 | −1 | −1 | −1 | −1 |
| | | 124 | −1 | −1 | −1 | −1 | −1 | −1 | −1 | −1 | −1 | −1 | −1 |
| | | −1 | −1 | 190 | −1 | −1 | 242 | −1 | 273 | 59 | −1 | 234 | −1 |
| | | −1 | −1 | −1 | 156 | 212 | −1 | 79 | −1 | −1 | −1 | −1 | −1 |
| | | 87 | −1 | −1 | −1 | −1 | −1 | −1 | −1 | −1 | −1 | −1 | −1 |
| | | −1 | −1 | 107 | −1 | −1 | −1 | −1 | 15 | 250 | 262 | −1 | −1 |
| | | −1 | −1 | −1 | −1 | 45 | −1 | −1 | −1 | −1 | −1 | −1 | −1 |
| | | −1 | −1 | −1 | −1 | −1 | −1 | 241 | −1 | −1 | 252 | −1 | −1 |
| | | −1 | 35 | 272 | 0 | −1 | −1 | −1 | 209 | −1 | −1 | −1 | −1 |
| | | −1 | −1 | −1 | −1 | 220 | −1 | −1 | −1 | −1 | −1 | −1 | 224 |
| | | −1 | −1 | −1 | −1 | −1 | −1 | 234 | −1 | −1 | −1 | −1 | −1 |
| | | 151 | −1 | 0 | 0 | −1 | −1 | −1 | 126 | −1 | −1 | −1 | −1 |
| | | −1 | −1 | −1 | −1 | 47 | 144 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | −1 | −1 | −1 | 61 | −1 | −1 | −1 |
| | | −1 | −1 | 22 | −1 | −1 | −1 | 279 | 270 | −1 | −1 | −1 | −1 |
| | | −1 | −1 | −1 | 31 | −1 | −1 | −1 | −1 | −1 | −1 | −1 | −1 |
| | | −1 | −1 | −1 | −1 | 123 | −1 | −1 | −1 | −1 | −1 | −1 | −1 |
| | | −1 | −1 | −1 | −1 | −1 | −1 | −1 | −1 | −1 | −1 | −1 | −1 |
| | | 105 | −1 | −1 | −1 | −1 | −1 | −1 | −1 | −1 | −1 | −1 | −1 |
| | | −1 | 11 | −1 | −1 | −1 | −1 | −1 | −1 | −1 | −1 | −1 | −1 |
| | | −1 | −1 | −1 | −1 | −1 | −1 | −1 | −1 | −1 | −1 | −1 | −1 |
| | | −1 | −1 | −1 | −1 | −1 | 133 | −1 | 226 | −1 | −1 | −1 | −1 |
| | | 108 | −1 | −1 | −1 | 0 | −1 | −1 | −1 | −1 | −1 | −1 | 246 |
| | | −1 | 1 | −1 | −1 | −1 | −1 | −1 | −1 | −1 | −1 | 115 | −1 |
| | | −1 | −1 | −1 | −1 | −1 | −1 | −1 | −1 | 123 | −1 | −1 | 269 |
| | | 252 | −1 | −1 | −1 | −1 | −1 | −1 | −1 | −1 | −1 | 126 | −1 |
| | | −1 | −1 | −1 | −1 | −1 | −1 | −1 | −1 | −1 | −1 | −1 | −1 |
| | | −1 | 180 | −1 | 0 | −1 | −1 | −1 | 270 | −1 | −1 | −1 | −1 |
| | | −1 | −1 | −1 | −1 | −1 | −1 | −1 | −1 | 84 | −1 | −1 | −1 |
| | | 272 | 0 | −1 | −1 | 0 | −1 | −1 | −1 | −1 | −1 | −1 | −1 |
| | | −1 | −1 | −1 | −1 | −1 | −1 | −1 | −1 | −1 | 0 | −1 | −1 |
| | | −1 | −1 | −1 | −1 | −1 | −1 | −1 | −1 | −1 | −1 | −1 | −1 |
| | | −1 | −1 | −1 | −1 | −1 | 171 | −1 | −1 | −1 | −1 | −1 | −1 |
| | | −1 | −1 | −1 | 286 | −1 | −1 | −1 | −1 | −1 | −1 | −1 | −1 |
| | | −1 | −1 | −1 | −1 | 105 | −1 | −1 | −1 | −1 | −1 | −1 | −1 |
| | | −1 | −1 | −1 | −1 | −1 | −1 | −1 | −1 | −1 | −1 | 253 | −1 |
| | | −1 | −1 | 45 | −1 | 0 | −1 | −1 | −1 | −1 | −1 | −1 | 18 |
| | | −1 | −1 | −1 | −1 | −1 | −1 | −1 | −1 | 232 | −1 | −1 | −1 |
| | | −1 | −1 | −1 | −1 | −1 | −1 | −1 | −1 | −1 | −1 | −1 | −1 |

TABLE 25

| | | | | | | | | | | | | | |
|---|---|---|---|---|---|---|---|---|---|---|---|---|---|
| 58 | 234 | 185 | 22 | −1 | 145 | 187 | −1 | −1 | 109 | 102 | 351 | 13 | 151 |
| 275 | −1 | 127 | 256 | 14 | 84 | −1 | 240 | 50 | 302 | −1 | 185 | 99 | −1 |
| 126 | 317 | 139 | −1 | 50 | 241 | 87 | 224 | 115 | 58 | 225 | −1 | −1 | 242 |
| 255 | 258 | −1 | 303 | 73 | −1 | 213 | 186 | 261 | −1 | 246 | 106 | 7 | 83 |
| 310 | 96 | −1 | −1 | −1 | −1 | −1 | −1 | −1 | −1 | −1 | −1 | −1 | −1 |
| 133 | 222 | −1 | 101 | −1 | −1 | −1 | −1 | −1 | −1 | −1 | −1 | 30 | −1 |

TABLE 25-continued

| | | | | | | | | | | | | | |
|---|---|---|---|---|---|---|---|---|---|---|---|---|---|
| 58 | −1 | −1 | −1 | −1 | −1 | 279 | −1 | −1 | −1 | 22 | 253 | −1 | 180 |
| 349 | 249 | −1 | −1 | 128 | −1 | −1 | 55 | 137 | −1 | −1 | −1 | −1 | −1 |
| 4 | 277 | −1 | 330 | −1 | −1 | −1 | −1 | −1 | −1 | −1 | −1 | 40 | −1 |
| 196 | 264 | −1 | −1 | −1 | −1 | −1 | −1 | −1 | −1 | 59 | 241 | −1 | 260 |
| −1 | 177 | 99 | −1 | 325 | −1 | −1 | 121 | 303 | −1 | −1 | −1 | −1 | −1 |
| 327 | 30 | −1 | −1 | −1 | −1 | −1 | −1 | −1 | −1 | −1 | −1 | 152 | −1 |
| 229 | 135 | −1 | −1 | −1 | −1 | −1 | −1 | −1 | −1 | 210 | 242 | −1 | 176 |
| 41 | −1 | −1 | 101 | −1 | −1 | −1 | 87 | −1 | −1 | −1 | −1 | −1 | −1 |
| 330 | −1 | −1 | −1 | −1 | −1 | −1 | −1 | −1 | −1 | −1 | −1 | 30 | −1 |
| 176 | 4 | −1 | −1 | −1 | −1 | −1 | −1 | −1 | −1 | 337 | −1 | −1 | 271 |
| −1 | 162 | −1 | 59 | −1 | −1 | −1 | −1 | −1 | −1 | −1 | 20 | −1 | −1 |
| 242 | −1 | −1 | −1 | −1 | −1 | −1 | −1 | −1 | −1 | −1 | −1 | −1 | −1 |
| −1 | 305 | −1 | −1 | −1 | −1 | −1 | −1 | −1 | −1 | −1 | −1 | 66 | 106 |
| 265 | 242 | −1 | −1 | −1 | −1 | −1 | 205 | 94 | −1 | 148 | −1 | −1 | −1 |
| 263 | −1 | −1 | 287 | −1 | −1 | −1 | −1 | −1 | 197 | −1 | 108 | −1 | −1 |
| −1 | 190 | −1 | −1 | −1 | 88 | −1 | −1 | −1 | −1 | −1 | −1 | −1 | −1 |
| 72 | −1 | −1 | −1 | −1 | −1 | −1 | −1 | −1 | −1 | −1 | −1 | 195 | 116 |
| −1 | 334 | 346 | −1 | −1 | −1 | −1 | −1 | −1 | −1 | 171 | −1 | −1 | −1 |
| 314 | −1 | −1 | 182 | 103 | −1 | −1 | −1 | −1 | −1 | −1 | 64 | −1 | −1 |
| −1 | 73 | −1 | −1 | −1 | −1 | 97 | 241 | −1 | −1 | −1 | −1 | −1 | −1 |
| 27 | −1 | 26 | −1 | 126 | −1 | −1 | −1 | −1 | −1 | −1 | −1 | −1 | −1 |
| −1 | 261 | −1 | −1 | −1 | −1 | 26 | −1 | 84 | −1 | −1 | −1 | −1 | −1 |
| 250 | −1 | −1 | −1 | 351 | −1 | −1 | −1 | −1 | −1 | −1 | −1 | −1 | −1 |
| −1 | 79 | −1 | −1 | −1 | −1 | −1 | −1 | −1 | −1 | −1 | −1 | −1 | −1 |
| 181 | −1 | −1 | −1 | −1 | −1 | −1 | −1 | −1 | −1 | 336 | −1 | −1 | 257 |
| −1 | 251 | −1 | −1 | −1 | −1 | −1 | 55 | −1 | −1 | −1 | −1 | −1 | −1 |
| 1 | −1 | −1 | −1 | −1 | −1 | −1 | −1 | −1 | −1 | −1 | −1 | 87 | −1 |
| −1 | 296 | 48 | −1 | −1 | −1 | −1 | −1 | −1 | −1 | −1 | 211 | −1 | −1 |
| 292 | −1 | −1 | −1 | −1 | −1 | −1 | 32 | −1 | −1 | −1 | −1 | −1 | −1 |
| −1 | 252 | −1 | −1 | −1 | −1 | 142 | −1 | −1 | −1 | −1 | −1 | 157 | −1 |
| 217 | −1 | −1 | −1 | −1 | −1 | −1 | −1 | −1 | −1 | −1 | −1 | −1 | −1 |
| −1 | 33 | −1 | −1 | −1 | −1 | −1 | −1 | −1 | −1 | −1 | −1 | −1 | 116 |
| 188 | −1 | −1 | −1 | −1 | −1 | −1 | −1 | −1 | 156 | 143 | −1 | 106 | −1 |
| −1 | 116 | −1 | 88 | −1 | −1 | −1 | 315 | −1 | −1 | −1 | −1 | −1 | −1 |
| 48 | −1 | −1 | −1 | −1 | −1 | −1 | −1 | 115 | −1 | −1 | −1 | −1 | −1 |
| −1 | 229 | −1 | 275 | −1 | −1 | −1 | −1 | −1 | 327 | −1 | −1 | −1 | −1 |
| 64 | −1 | −1 | −1 | 269 | −1 | −1 | −1 | −1 | −1 | −1 | −1 | −1 | −1 |
| −1 | 142 | −1 | −1 | −1 | −1 | −1 | −1 | −1 | −1 | −1 | −1 | −1 | −1 |
| 273 | −1 | −1 | −1 | −1 | −1 | −1 | 108 | −1 | 59 | −1 | −1 | −1 | −1 |
| −1 | 270 | −1 | −1 | −1 | −1 | 285 | −1 | −1 | −1 | 117 | −1 | −1 | −1 |

| | | | | | | | | | | | |
|---|---|---|---|---|---|---|---|---|---|---|---|
| −1 | 299 | 5 | −1 | 48 | 185 | 305 | 164 | 0 | 0 | −1 | −1 |
| 18 | 110 | 95 | 219 | −1 | 343 | −1 | 50 | 1 | 0 | 0 | −1 |
| 66 | 227 | −1 | 221 | 189 | 142 | 345 | −1 | −1 | −1 | 0 | 0 |
| 167 | −1 | 103 | 137 | 209 | −1 | 231 | 231 | 0 | −1 | −1 | 0 |
| −1 | −1 | −1 | −1 | −1 | −1 | −1 | −1 | −1 | −1 | −1 | −1 |
| −1 | −1 | 57 | −1 | −1 | −1 | −1 | 94 | 70 | −1 | −1 | −1 |
| −1 | −1 | −1 | 202 | 68 | −1 | 47 | −1 | −1 | −1 | −1 | −1 |
| 313 | −1 | −1 | −1 | −1 | −1 | −1 | −1 | −1 | −1 | −1 | −1 |
| −1 | −1 | 128 | −1 | −1 | 335 | −1 | 293 | 39 | −1 | 108 | −1 |
| −1 | −1 | −1 | 200 | 329 | −1 | 15 | −1 | −1 | −1 | −1 | −1 |
| 85 | 1 | −1 | −1 | −1 | −1 | −1 | −1 | −1 | −1 | −1 | −1 |
| −1 | −1 | −1 | −1 | −1 | −1 | −1 | 186 | 15 | 160 | −1 | −1 |
| −1 | −1 | −1 | −1 | 276 | −1 | −1 | −1 | −1 | −1 | −1 | −1 |
| −1 | −1 | −1 | −1 | −1 | −1 | 258 | −1 | −1 | 271 | −1 | −1 |
| −1 | 75 | 196 | 286 | −1 | −1 | −1 | 274 | −1 | −1 | −1 | −1 |
| −1 | −1 | −1 | −1 | 176 | −1 | −1 | −1 | −1 | −1 | −1 | 239 |
| −1 | −1 | −1 | −1 | −1 | −1 | 21 | −1 | 239 | −1 | −1 | −1 |
| 124 | −1 | 105 | 236 | −1 | −1 | −1 | 162 | −1 | −1 | −1 | −1 |
| −1 | −1 | −1 | −1 | 171 | 279 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 323 | −1 | −1 | −1 |
| −1 | −1 | 6 | −1 | −1 | −1 | 209 | 243 | −1 | −1 | −1 | −1 |
| −1 | −1 | −1 | 239 | −1 | −1 | −1 | −1 | −1 | −1 | −1 | −1 |
| −1 | −1 | −1 | −1 | 48 | −1 | −1 | −1 | −1 | −1 | −1 | −1 |
| −1 | −1 | −1 | −1 | −1 | −1 | −1 | −1 | 159 | −1 | −1 | −1 |
| 298 | −1 | −1 | −1 | −1 | −1 | −1 | −1 | −1 | −1 | −1 | −1 |
| −1 | 253 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 312 | −1 | 185 | −1 | −1 | −1 | −1 |
| 248 | −1 | −1 | −1 | 109 | −1 | −1 | −1 | −1 | −1 | −1 | 245 |
| −1 | −1 | −1 | −1 | −1 | −1 | −1 | −1 | −1 | −1 | 140 | −1 |
| −1 | −1 | −1 | −1 | −1 | −1 | −1 | −1 | 74 | −1 | −1 | 130 |
| 14 | −1 | −1 | −1 | −1 | −1 | −1 | −1 | −1 | −1 | 269 | −1 |
| −1 | −1 | −1 | −1 | −1 | −1 | −1 | 251 | −1 | −1 | −1 | −1 |
| −1 | 240 | −1 | 298 | −1 | −1 | −1 | −1 | −1 | −1 | −1 | −1 |
| −1 | −1 | −1 | −1 | −1 | −1 | −1 | −1 | 85 | −1 | −1 | −1 |
| 337 | 317 | −1 | −1 | 164 | −1 | −1 | −1 | −1 | −1 | −1 | −1 |
| −1 | −1 | −1 | −1 | −1 | −1 | −1 | −1 | −1 | 267 | −1 | −1 |
| −1 | −1 | −1 | −1 | −1 | −1 | −1 | −1 | −1 | −1 | −1 | −1 |

TABLE 25-continued

| | | | | | | | | | | | |
|---|---|---|---|---|---|---|---|---|---|---|---|
| −1 | −1 | −1 | −1 | −1 | 80 | −1 | −1 | −1 | −1 | −1 | −1 |
| −1 | −1 | −1 | 217 | −1 | −1 | −1 | −1 | −1 | −1 | −1 | −1 |
| −1 | −1 | −1 | −1 | 80 | −1 | −1 | −1 | −1 | −1 | −1 | −1 |
| −1 | −1 | −1 | −1 | −1 | −1 | −1 | −1 | −1 | −1 | 335 | −1 |
| −1 | −1 | 349 | −1 | 299 | −1 | −1 | −1 | −1 | −1 | −1 | 185 |
| −1 | −1 | −1 | −1 | −1 | −1 | −1 | −1 | 81 | −1 | −1 | −1 |
| −1 | −1 | −1 | −1 | −1 | −1 | −1 | −1 | −1 | −1 | −1 | −1 |

TABLE 26

| | | | | | | | | | | | | | |
|---|---|---|---|---|---|---|---|---|---|---|---|---|---|
| 0 | 0 | 0 | 0 | −1 | 0 | 0 | −1 | −1 | 0 | 0 | 0 | 0 | 0 |
| 186 | −1 | 197 | 84 | 0 | 198 | −1 | 0 | 0 | 206 | −1 | 192 | 148 | −1 |
| 76 | 171 | 187 | −1 | 28 | 204 | 59 | 160 | 170 | 86 | 13 | −1 | −1 | 53 |
| 204 | 202 | −1 | 175 | 95 | −1 | 159 | 187 | 202 | −1 | 57 | 125 | 54 | 121 |
| 184 | 4 | −1 | −1 | −1 | −1 | −1 | −1 | −1 | −1 | −1 | −1 | −1 | −1 |
| 23 | 108 | −1 | 184 | −1 | −1 | −1 | −1 | −1 | −1 | −1 | −1 | 143 | −1 |
| 202 | −1 | −1 | −1 | −1 | −1 | 181 | −1 | −1 | −1 | 45 | 158 | −1 | 160 |
| 63 | 120 | −1 | −1 | 96 | −1 | −1 | 55 | 49 | −1 | −1 | −1 | −1 | −1 |
| 36 | 206 | −1 | 77 | −1 | −1 | −1 | −1 | −1 | −1 | −1 | −1 | 67 | −1 |
| 202 | 198 | −1 | −1 | −1 | −1 | −1 | −1 | −1 | −1 | 63 | 155 | −1 | 7 |
| −1 | 82 | 131 | −1 | 52 | −1 | −1 | 192 | 196 | −1 | −1 | −1 | −1 | −1 |
| 24 | 14 | −1 | −1 | −1 | −1 | −1 | −1 | −1 | −1 | −1 | −1 | 85 | −1 |
| 202 | 188 | −1 | −1 | −1 | −1 | −1 | −1 | −1 | −1 | 5 | 55 | −1 | 104 |
| 156 | −1 | −1 | 61 | −1 | −1 | −1 | 207 | −1 | −1 | −1 | −1 | −1 | −1 |
| 207 | −1 | −1 | −1 | −1 | −1 | −1 | −1 | −1 | −1 | −1 | −1 | 6 | −1 |
| 35 | 202 | −1 | −1 | −1 | −1 | −1 | −1 | −1 | −1 | 127 | −1 | −1 | 26 |
| −1 | 120 | −1 | 10 | −1 | −1 | −1 | −1 | −1 | −1 | −1 | 48 | −1 | −1 |
| 117 | −1 | −1 | −1 | −1 | −1 | −1 | −1 | −1 | −1 | −1 | −1 | −1 | −1 |
| −1 | 207 | −1 | −1 | −1 | −1 | −1 | −1 | −1 | −1 | −1 | −1 | 167 | 41 |
| 196 | 202 | −1 | −1 | −1 | −1 | −1 | 42 | 24 | −1 | 17 | −1 | −1 | −1 |
| 202 | −1 | −1 | 196 | −1 | −1 | −1 | −1 | −1 | 193 | −1 | 203 | −1 | −1 |
| −1 | 202 | −1 | −1 | −1 | 122 | −1 | −1 | −1 | −1 | −1 | −1 | −1 | −1 |
| 164 | −1 | −1 | −1 | −1 | −1 | −1 | −1 | −1 | −1 | −1 | −1 | 150 | 78 |
| −1 | 163 | 190 | −1 | −1 | −1 | −1 | −1 | −1 | −1 | 76 | −1 | −1 | −1 |
| 199 | −1 | −1 | 83 | 17 | −1 | −1 | −1 | −1 | −1 | −1 | 180 | −1 | −1 |
| −1 | 204 | −1 | −1 | −1 | −1 | 134 | 192 | −1 | −1 | −1 | −1 | −1 | −1 |
| 187 | −1 | 66 | −1 | 16 | −1 | −1 | −1 | −1 | −1 | −1 | −1 | −1 | −1 |
| −1 | 110 | −1 | −1 | −1 | −1 | 68 | −1 | 186 | −1 | −1 | −1 | −1 | −1 |
| 204 | −1 | −1 | −1 | 207 | −1 | −1 | −1 | −1 | −1 | −1 | −1 | −1 | −1 |
| −1 | 116 | −1 | −1 | −1 | −1 | −1 | −1 | −1 | −1 | −1 | −1 | −1 | −1 |
| 206 | −1 | −1 | −1 | −1 | −1 | −1 | −1 | −1 | −1 | 120 | −1 | −1 | 96 |
| −1 | 204 | −1 | −1 | −1 | −1 | −1 | 159 | −1 | −1 | −1 | −1 | −1 | −1 |
| 202 | −1 | −1 | −1 | −1 | −1 | −1 | −1 | −1 | −1 | −1 | −1 | 82 | −1 |
| −1 | 198 | 178 | −1 | −1 | −1 | −1 | −1 | −1 | −1 | −1 | 202 | −1 | −1 |
| 204 | −1 | −1 | −1 | −1 | −1 | −1 | 55 | −1 | −1 | −1 | −1 | −1 | −1 |
| −1 | 204 | −1 | −1 | −1 | −1 | 163 | −1 | −1 | −1 | −1 | −1 | 40 | −1 |
| 202 | −1 | −1 | −1 | −1 | −1 | −1 | −1 | −1 | −1 | −1 | −1 | −1 | −1 |
| −1 | 126 | −1 | −1 | −1 | −1 | −1 | −1 | −1 | −1 | −1 | −1 | −1 | 206 |
| 117 | −1 | −1 | −1 | −1 | −1 | −1 | −1 | −1 | 144 | 10 | −1 | 108 | −1 |
| −1 | 204 | −1 | 180 | −1 | −1 | −1 | 99 | −1 | −1 | −1 | −1 | −1 | −1 |
| 198 | −1 | −1 | −1 | −1 | −1 | −1 | −1 | 124 | −1 | −1 | −1 | −1 | −1 |
| −1 | 206 | −1 | 133 | −1 | −1 | −1 | 1 | −1 | 66 | −1 | −1 | −1 | −1 |
| 45 | −1 | −1 | −1 | 198 | −1 | −1 | −1 | −1 | −1 | −1 | −1 | −1 | −1 |
| −1 | 207 | −1 | −1 | −1 | −1 | −1 | −1 | −1 | −1 | −1 | −1 | −1 | −1 |
| 204 | −1 | −1 | −1 | −1 | −1 | −1 | 202 | −1 | 66 | −1 | −1 | −1 | −1 |
| −1 | 27 | −1 | −1 | −1 | −1 | 163 | −1 | −1 | −1 | 55 | −1 | −1 | −1 |

| | | | | | | | | | | | |
|---|---|---|---|---|---|---|---|---|---|---|---|
| −1 | 0 | 0 | −1 | 0 | 0 | 0 | 0 | 105 | 0 | −1 | −1 |
| 0 | 202 | 178 | 0 | −1 | 40 | −1 | 177 | 0 | 0 | 0 | −1 |
| 180 | 123 | −1 | 161 | 29 | 166 | 142 | −1 | −1 | −1 | 0 | 0 |
| 203 | −1 | 116 | 35 | 88 | −1 | 206 | 66 | 105 | 0 | −1 | 0 |
| −1 | −1 | −1 | −1 | −1 | −1 | −1 | −1 | −1 | −1 | −1 | −1 |
| −1 | −1 | 1 | −1 | −1 | −1 | −1 | 47 | 33 | −1 | −1 | −1 |
| −1 | −1 | −1 | 184 | 170 | −1 | 117 | −1 | −1 | −1 | −1 | −1 |
| 132 | −1 | −1 | −1 | −1 | −1 | −1 | −1 | −1 | −1 | −1 | −1 |
| −1 | −1 | 112 | −1 | −1 | 109 | −1 | 107 | 70 | −1 | 92 | −1 |
| −1 | −1 | −1 | 204 | 44 | −1 | 35 | −1 | −1 | −1 | −1 | −1 |
| 138 | −1 | −1 | −1 | −1 | −1 | −1 | −1 | −1 | −1 | −1 | −1 |
| −1 | −1 | 192 | −1 | −1 | −1 | −1 | 104 | 204 | 84 | −1 | −1 |
| −1 | −1 | −1 | −1 | −1 | −1 | −1 | −1 | −1 | −1 | −1 | −1 |
| −1 | −1 | −1 | −1 | −1 | −1 | 192 | −1 | −1 | 162 | −1 | −1 |
| −1 | 90 | 78 | 207 | −1 | −1 | −1 | 206 | −1 | −1 | −1 | −1 |
| −1 | −1 | −1 | −1 | 155 | −1 | −1 | −1 | −1 | −1 | −1 | 162 |
| −1 | −1 | −1 | −1 | −1 | −1 | 86 | −1 | 131 | −1 | −1 | −1 |
| 24 | −1 | 178 | 205 | −1 | −1 | −1 | 53 | −1 | −1 | −1 | −1 |
| −1 | −1 | −1 | −1 | 140 | 60 | −1 | −1 | −1 | −1 | −1 | −1 |
| −1 | −1 | −1 | −1 | −1 | −1 | −1 | −1 | −1 | −1 | −1 | −1 |

TABLE 26-continued

| | | | | | | | | | | | |
|---|---|---|---|---|---|---|---|---|---|---|---|
| −1 | −1 | −1 | −1 | −1 | −1 | −1 | −1 | 75 | −1 | −1 | −1 |
| −1 | −1 | 112 | −1 | −1 | −1 | 166 | 9 | −1 | −1 | −1 | −1 |
| −1 | −1 | −1 | 77 | −1 | −1 | −1 | −1 | −1 | −1 | −1 | −1 |
| −1 | −1 | −1 | −1 | 108 | −1 | −1 | −1 | −1 | −1 | −1 | −1 |
| −1 | −1 | −1 | −1 | −1 | −1 | −1 | −1 | 99 | −1 | −1 | −1 |
| 180 | −1 | −1 | −1 | −1 | −1 | −1 | −1 | −1 | −1 | −1 | −1 |
| −1 | 11 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 168 | −1 | 115 | −1 | −1 | −1 | −1 |
| 72 | −1 | −1 | −1 | 102 | −1 | −1 | −1 | −1 | −1 | −1 | 202 |
| −1 | −1 | −1 | −1 | −1 | −1 | −1 | −1 | −1 | −1 | 188 | −1 |
| −1 | −1 | −1 | −1 | −1 | −1 | −1 | −1 | 188 | −1 | −1 | 14 |
| 145 | −1 | −1 | −1 | −1 | −1 | −1 | −1 | −1 | −1 | 188 | −1 |
| −1 | −1 | −1 | −1 | −1 | −1 | −1 | 116 | −1 | −1 | −1 | −1 |
| −1 | 11 | −1 | 53 | −1 | −1 | −1 | −1 | −1 | −1 | −1 | −1 |
| −1 | −1 | −1 | −1 | −1 | −1 | −1 | −1 | 128 | −1 | −1 | −1 |
| 8 | 31 | −1 | −1 | 165 | −1 | −1 | −1 | −1 | −1 | −1 | −1 |
| −1 | −1 | −1 | −1 | −1 | −1 | −1 | −1 | −1 | 73 | −1 | −1 |
| −1 | −1 | −1 | −1 | −1 | −1 | −1 | −1 | −1 | −1 | −1 | −1 |
| −1 | −1 | −1 | −1 | −1 | 20 | −1 | −1 | −1 | −1 | −1 | −1 |
| −1 | −1 | −1 | 196 | −1 | −1 | −1 | −1 | −1 | −1 | −1 | −1 |
| −1 | −1 | −1 | −1 | 80 | −1 | −1 | −1 | −1 | −1 | −1 | −1 |
| −1 | −1 | −1 | −1 | −1 | −1 | −1 | −1 | −1 | −1 | 46 | −1 |
| −1 | −1 | 45 | −1 | 109 | −1 | −1 | −1 | −1 | −1 | −1 | 110 |
| −1 | −1 | −1 | −1 | −1 | −1 | −1 | −1 | 102 | −1 | −1 | −1 |
| −1 | −1 | −1 | −1 | −1 | −1 | −1 | −1 | −1 | −1 | −1 | −1 |

TABLE 27

| | | | | | | | | | | | | | |
|---|---|---|---|---|---|---|---|---|---|---|---|---|---|
| 105 | 13 | 114 | 106 | −1 | 156 | 157 | −1 | −1 | 187 | 15 | 35 | 112 | 165 |
| 144 | −1 | 4 | 104 | 19 | 112 | −1 | 148 | 68 | 184 | −1 | 229 | 51 | −1 |
| 51 | 236 | 15 | −1 | 89 | 4 | 123 | 61 | 148 | 216 | 172 | −1 | −1 | 234 |
| 112 | 217 | −1 | 78 | 20 | −1 | 197 | 54 | 144 | −1 | 239 | 24 | 218 | 216 |
| 176 | 29 | −1 | −1 | −1 | −1 | −1 | −1 | −1 | −1 | −1 | −1 | −1 | −1 |
| 238 | 69 | −1 | 193 | −1 | −1 | −1 | −1 | −1 | −1 | −1 | −1 | 97 | −1 |
| 41 | −1 | −1 | −1 | −1 | −1 | 218 | −1 | −1 | −1 | 217 | 140 | −1 | 148 |
| 163 | 94 | −1 | −1 | 31 | −1 | −1 | 208 | 74 | −1 | −1 | −1 | −1 | −1 |
| 59 | 135 | −1 | 99 | −1 | −1 | −1 | −1 | −1 | −1 | −1 | −1 | 17 | −1 |
| 71 | 228 | −1 | −1 | −1 | −1 | −1 | −1 | −1 | −1 | 34 | 19 | −1 | 223 |
| −1 | 124 | 89 | −1 | 170 | −1 | −1 | 10 | 125 | −1 | −1 | −1 | −1 | −1 |
| 195 | 125 | −1 | −1 | −1 | −1 | −1 | −1 | −1 | −1 | −1 | −1 | 106 | −1 |
| 54 | 25 | −1 | −1 | −1 | −1 | −1 | −1 | 1 | −1 | 116 | 60 | −1 | 142 |
| 20 | −1 | −1 | 55 | −1 | −1 | −1 | 86 | −1 | −1 | −1 | −1 | −1 | −1 |
| 116 | −1 | −1 | −1 | −1 | −1 | −1 | −1 | −1 | −1 | −1 | −1 | 96 | −1 |
| 201 | 102 | −1 | −1 | −1 | −1 | −1 | −1 | −1 | −1 | 20 | −1 | −1 | 67 |
| −1 | 162 | −1 | 88 | −1 | −1 | −1 | −1 | −1 | −1 | −1 | 156 | −1 | −1 |
| 57 | −1 | −1 | −1 | −1 | −1 | −1 | −1 | −1 | −1 | −1 | −1 | −1 | −1 |
| −1 | 57 | −1 | −1 | −1 | −1 | −1 | −1 | −1 | −1 | −1 | −1 | 25 | 60 |
| 61 | 132 | −1 | −1 | −1 | −1 | −1 | 81 | 102 | −1 | 44 | −1 | −1 | −1 |
| 163 | −1 | −1 | 53 | −1 | −1 | −1 | −1 | −1 | 37 | −1 | 73 | −1 | −1 |
| −1 | 43 | −1 | −1 | −1 | 118 | −1 | −1 | −1 | −1 | −1 | −1 | −1 | −1 |
| 215 | −1 | −1 | −1 | −1 | −1 | −1 | −1 | −1 | −1 | −1 | −1 | 193 | 114 |
| −1 | 55 | 113 | −1 | −1 | −1 | −1 | −1 | −1 | −1 | 123 | −1 | −1 | −1 |
| 208 | −1 | −1 | 62 | 238 | −1 | −1 | −1 | −1 | −1 | −1 | 84 | −1 | −1 |
| −1 | 213 | −1 | −1 | −1 | −1 | 99 | 229 | −1 | −1 | −1 | −1 | −1 | −1 |
| 77 | −1 | 109 | −1 | 71 | −1 | −1 | −1 | −1 | −1 | −1 | −1 | −1 | −1 |
| −1 | 75 | −1 | −1 | −1 | −1 | 8 | −1 | 231 | −1 | −1 | −1 | −1 | −1 |
| 208 | −1 | −1 | −1 | 197 | −1 | −1 | −1 | −1 | −1 | −1 | −1 | −1 | −1 |
| −1 | 8 | −1 | −1 | −1 | −1 | −1 | −1 | −1 | −1 | −1 | −1 | −1 | −1 |
| 70 | −1 | −1 | −1 | −1 | −1 | −1 | −1 | −1 | −1 | 41 | −1 | −1 | 214 |
| −1 | 167 | −1 | −1 | −1 | −1 | −1 | 91 | −1 | −1 | −1 | −1 | −1 | −1 |
| 137 | −1 | −1 | −1 | −1 | −1 | −1 | −1 | −1 | −1 | −1 | −1 | 130 | −1 |
| −1 | 41 | 108 | −1 | −1 | −1 | −1 | −1 | −1 | −1 | −1 | 68 | −1 | −1 |
| 79 | −1 | −1 | −1 | −1 | −1 | −1 | 3 | −1 | −1 | −1 | −1 | −1 | −1 |
| −1 | 9 | −1 | −1 | −1 | −1 | 66 | −1 | −1 | −1 | −1 | −1 | 95 | −1 |
| 229 | −1 | −1 | −1 | −1 | −1 | −1 | −1 | −1 | −1 | −1 | −1 | −1 | −1 |
| −1 | 181 | −1 | −1 | −1 | −1 | −1 | −1 | −1 | −1 | −1 | −1 | −1 | 36 |
| 119 | −1 | −1 | −1 | −1 | −1 | −1 | −1 | −1 | 150 | 214 | −1 | 100 | −1 |
| −1 | 125 | −1 | 52 | −1 | −1 | −1 | 72 | −1 | −1 | −1 | −1 | −1 | −1 |
| 236 | −1 | −1 | −1 | −1 | −1 | −1 | −1 | 137 | −1 | −1 | −1 | −1 | −1 |
| −1 | 187 | −1 | 51 | −1 | −1 | −1 | −1 | −1 | 25 | −1 | −1 | −1 | −1 |
| 18 | −1 | −1 | −1 | 70 | −1 | −1 | −1 | −1 | −1 | −1 | −1 | −1 | −1 |
| −1 | 218 | −1 | −1 | −1 | −1 | −1 | −1 | −1 | −1 | −1 | −1 | −1 | −1 |
| 49 | −1 | −1 | −1 | −1 | −1 | −1 | 29 | −1 | 53 | −1 | −1 | −1 | −1 |
| −1 | 63 | −1 | −1 | −1 | −1 | 126 | −1 | −1 | −1 | 147 | −1 | −1 | −1 |

TABLE 27-continued

| | | | | | | | | | | | |
|---|---|---|---|---|---|---|---|---|---|---|---|
| −1 | 105 | 23 | −1 | 20 | 150 | 135 | 103 | 0 | 0 | −1 | −1 |
| 145 | 155 | 87 | 153 | −1 | 77 | −1 | 24 | 1 | 0 | 0 | −1 |
| 139 | 207 | −1 | 144 | 115 | 173 | 10 | −1 | −1 | −1 | 0 | 0 |
| 73 | −1 | 40 | 208 | 5 | −1 | 68 | 21 | 0 | −1 | −1 | 0 |
| −1 | −1 | −1 | −1 | −1 | −1 | −1 | −1 | −1 | −1 | −1 | −1 |
| −1 | −1 | 30 | −1 | −1 | −1 | −1 | 60 | 61 | −1 | −1 | −1 |
| −1 | −1 | −1 | 33 | 188 | −1 | 227 | −1 | −1 | −1 | −1 | −1 |
| 222 | −1 | −1 | −1 | −1 | −1 | −1 | −1 | −1 | −1 | −1 | −1 |
| −1 | −1 | 63 | −1 | −1 | 95 | −1 | 41 | 88 | −1 | 202 | −1 |
| −1 | −1 | −1 | 28 | 148 | −1 | 35 | −1 | −1 | −1 | −1 | −1 |
| 156 | −1 | −1 | −1 | −1 | −1 | −1 | −1 | −1 | −1 | −1 | −1 |
| −1 | −1 | 239 | −1 | −1 | −1 | −1 | 88 | 76 | 133 | −1 | −1 |
| −1 | −1 | −1 | −1 | 160 | −1 | −1 | −1 | −1 | −1 | −1 | −1 |
| −1 | −1 | −1 | −1 | −1 | −1 | 62 | −1 | −1 | 90 | −1 | −1 |
| −1 | 58 | 145 | 168 | −1 | −1 | −1 | 164 | −1 | −1 | −1 | −1 |
| −1 | −1 | −1 | −1 | 98 | −1 | −1 | −1 | −1 | −1 | −1 | 191 |
| −1 | −1 | −1 | −1 | −1 | −1 | 235 | −1 | 36 | −1 | −1 | −1 |
| 128 | −1 | 134 | 21 | −1 | −1 | −1 | 111 | −1 | −1 | −1 | −1 |
| −1 | −1 | −1 | −1 | 97 | 226 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | −1 | −1 | −1 | 111 | −1 | −1 | −1 |
| −1 | −1 | 25 | −1 | −1 | −1 | 175 | 24 | −1 | −1 | −1 | −1 |
| −1 | −1 | −1 | 62 | −1 | −1 | −1 | −1 | −1 | −1 | −1 | −1 |
| −1 | −1 | −1 | −1 | 41 | −1 | −1 | −1 | −1 | −1 | −1 | −1 |
| −1 | −1 | −1 | −1 | −1 | −1 | −1 | −1 | 183 | −1 | −1 | −1 |
| 59 | −1 | −1 | −1 | −1 | −1 | −1 | −1 | −1 | −1 | −1 | −1 |
| −1 | 142 | −1 | −1 | −1 | −1 | −1 | −1 | −1 | −1 | −1 | −1 |
| −1 | −1 | −1 | −1 | −1 | −1 | −1 | −1 | −1 | −1 | −1 | −1 |
| −1 | −1 | −1 | −1 | −1 | 40 | −1 | 35 | −1 | −1 | −1 | −1 |
| 208 | −1 | −1 | −1 | 122 | −1 | −1 | −1 | −1 | −1 | −1 | 137 |
| −1 | −1 | −1 | −1 | −1 | −1 | −1 | −1 | −1 | −1 | 135 | −1 |
| −1 | −1 | −1 | −1 | −1 | −1 | −1 | −1 | 66 | −1 | −1 | 132 |
| 89 | −1 | −1 | −1 | −1 | −1 | −1 | −1 | −1 | −1 | 29 | −1 |
| −1 | −1 | −1 | −1 | −1 | −1 | −1 | 175 | −1 | −1 | −1 | −1 |
| −1 | 98 | −1 | 60 | −1 | −1 | −1 | −1 | −1 | −1 | −1 | −1 |
| −1 | −1 | −1 | −1 | −1 | −1 | −1 | −1 | 141 | −1 | −1 | −1 |
| 33 | 198 | −1 | −1 | 140 | −1 | −1 | −1 | −1 | −1 | −1 | −1 |
| −1 | −1 | −1 | −1 | −1 | −1 | −1 | −1 | −1 | 79 | −1 | −1 |
| −1 | −1 | −1 | −1 | −1 | −1 | −1 | −1 | −1 | −1 | −1 | −1 |
| −1 | −1 | −1 | −1 | −1 | 188 | −1 | −1 | −1 | −1 | −1 | −1 |
| −1 | −1 | −1 | 210 | −1 | −1 | −1 | −1 | −1 | −1 | −1 | −1 |
| −1 | −1 | −1 | −1 | 216 | −1 | −1 | −1 | −1 | −1 | −1 | −1 |
| −1 | −1 | −1 | −1 | −1 | −1 | −1 | −1 | −1 | −1 | 169 | −1 |
| −1 | −1 | 113 | −1 | 191 | −1 | −1 | −1 | −1 | −1 | −1 | 115 |
| −1 | −1 | −1 | −1 | −1 | −1 | −1 | −1 | 93 | −1 | −1 | −1 |
| −1 | −1 | −1 | −1 | −1 | −1 | −1 | −1 | −1 | −1 | −1 | −1 |

Tables 28 to 35 show matrices A', B' and C', corresponding to exponent matrices (second exponent matrices) created by transforming the exponent matrices (first exponent matrices) corresponding to Tables 12 to 19.

That is, the matrices Z' and D' illustrated in FIG. 4 are added on the right side of the matrix shown in any one of Tables 28 to 35, whereby a transformed exponent matrix may be formed (Z' and D' are maintained without change after transformation).

TABLE 28

| | | | | | | | | | | | | | |
|---|---|---|---|---|---|---|---|---|---|---|---|---|---|
| 247 | 139 | 52 | 230 | −1 | −1 | 67 | −1 | −1 | 51 | 1 | 0 | −1 | −1 |
| 89 | −1 | −1 | 90 | 3 | 131 | 30 | 100 | 32 | 4 | −1 | 0 | 0 | −1 |
| 175 | 142 | −1 | 212 | 204 | −1 | −1 | −1 | 16 | −1 | 0 | −1 | 0 | 0 |
| −1 | 248 | 198 | −1 | 98 | 152 | 47 | 202 | 238 | 128 | 1 | −1 | −1 | 0 |
| 77 | 42 | −1 | −1 | −1 | −1 | −1 | −1 | −1 | −1 | −1 | 185 | −1 | −1 |
| 25 | 215 | −1 | −1 | −1 | 62 | −1 | 97 | −1 | −1 | −1 | 153 | −1 | −1 |
| 101 | −1 | −1 | −1 | −1 | 28 | −1 | 211 | −1 | 228 | −1 | 98 | −1 | −1 |
| −1 | 127 | −1 | −1 | −1 | 109 | −1 | 116 | −1 | −1 | −1 | 253 | −1 | 140 |
| 114 | 162 | −1 | −1 | −1 | −1 | −1 | −1 | −1 | −1 | −1 | −1 | 26 | −1 |
| −1 | 53 | −1 | −1 | −1 | −1 | −1 | −1 | 51 | −1 | 196 | 9 | −1 | −1 |
| 245 | 71 | −1 | −1 | −1 | −1 | 0 | 139 | −1 | −1 | −1 | −1 | −1 | −1 |
| 245 | −1 | −1 | −1 | −1 | −1 | −1 | 20 | −1 | 46 | −1 | −1 | −1 | 200 |
| −1 | 193 | −1 | 145 | −1 | −1 | −1 | −1 | −1 | −1 | −1 | 242 | −1 | −1 |
| 173 | 254 | −1 | −1 | −1 | −1 | −1 | −1 | 218 | −1 | −1 | −1 | −1 | 34 |
| −1 | 141 | −1 | −1 | −1 | −1 | 111 | −1 | −1 | −1 | −1 | 253 | −1 | 24 |
| 205 | −1 | −1 | −1 | −1 | −1 | −1 | −1 | 1 | −1 | 82 | 43 | −1 | −1 |
| −1 | 53 | −1 | −1 | −1 | −1 | −1 | −1 | −1 | 114 | −1 | 248 | 14 | −1 |

TABLE 28-continued

| −1 | 2 | −1 | 1 | 1 | 132 | −1 | −1 | −1 | −1 | −1 | 142 | 192 | −1 |
|---|---|---|---|---|---|---|---|---|---|---|---|---|---|
| 36 | −1 | −1 | −1 | −1 | −1 | 62 | 206 | −1 | −1 | −1 | −1 | −1 | −1 |
| 169 | 236 | −1 | −1 | −1 | −1 | −1 | −1 | −1 | −1 | 72 | −1 | −1 | −1 |
| −1 | 230 | −1 | −1 | 151 | −1 | −1 | −1 | −1 | −1 | −1 | 227 | −1 | −1 |
| 180 | −1 | −1 | −1 | −1 | −1 | −1 | −1 | 214 | −1 | −1 | −1 | −1 | 46 |
| −1 | 34 | 193 | −1 | −1 | −1 | −1 | −1 | −1 | −1 | −1 | −1 | −1 | −1 |
| 233 | −1 | −1 | 21 | 1 | 18 | −1 | −1 | −1 | −1 | −1 | −1 | −1 | −1 |
| −1 | 210 | 117 | −1 | −1 | −1 | −1 | −1 | −1 | 248 | −1 | −1 | −1 | −1 |
| 28 | −1 | −1 | −1 | −1 | 100 | −1 | −1 | −1 | −1 | −1 | −1 | −1 | −1 |
| −1 | −1 | 227 | −1 | −1 | −1 | −1 | 113 | −1 | −1 | −1 | −1 | 96 | 134 |
| 248 | −1 | −1 | −1 | −1 | −1 | 105 | −1 | −1 | −1 | −1 | −1 | −1 | −1 |
| −1 | 158 | 155 | −1 | −1 | 121 | −1 | −1 | −1 | −1 | −1 | −1 | −1 | −1 |
| 238 | −1 | −1 | −1 | 228 | −1 | −1 | −1 | −1 | −1 | −1 | −1 | −1 | −1 |
| −1 | −1 | 185 | −1 | −1 | 16 | −1 | 247 | −1 | 172 | −1 | −1 | −1 | 1 |
| −1 | 150 | −1 | −1 | −1 | −1 | −1 | −1 | −1 | −1 | −1 | −1 | −1 | 255 |
| 14 | −1 | −1 | −1 | −1 | 212 | −1 | −1 | −1 | −1 | −1 | −1 | 90 | −1 |
| −1 | −1 | 124 | −1 | −1 | −1 | −1 | 92 | −1 | −1 | 22 | −1 | −1 | −1 |
| 109 | −1 | −1 | −1 | −1 | −1 | −1 | −1 | −1 | −1 | −1 | −1 | 171 | 220 |
| −1 | 199 | −1 | −1 | −1 | 216 | −1 | −1 | −1 | −1 | −1 | 193 | −1 | −1 |
| 116 | −1 | 218 | −1 | −1 | −1 | −1 | 102 | −1 | −1 | −1 | −1 | −1 | −1 |
| −1 | −1 | −1 | −1 | −1 | −1 | −1 | −1 | −1 | −1 | 38 | −1 | −1 | 105 |
| −1 | 225 | −1 | −1 | −1 | 190 | −1 | −1 | −1 | −1 | −1 | 218 | −1 | −1 |
| 17 | −1 | −1 | −1 | −1 | −1 | −1 | 84 | −1 | −1 | −1 | −1 | 222 | −1 |
| −1 | −1 | 0 | −1 | −1 | −1 | −1 | −1 | −1 | −1 | 182 | −1 | −1 | 136 |
| −1 | 127 | −1 | −1 | −1 | 27 | −1 | −1 | −1 | −1 | −1 | 138 | −1 | −1 |

TABLE 29

| 210 | 287 | 218 | 318 | −1 | −1 | 313 | −1 | −1 | 212 | 1 | 0 | −1 | −1 |
|---|---|---|---|---|---|---|---|---|---|---|---|---|---|
| 357 | −1 | −1 | 348 | 336 | 292 | 353 | 197 | 199 | 381 | −1 | 0 | 0 | −1 |
| 359 | 270 | −1 | 267 | 274 | −1 | −1 | −1 | 270 | −1 | 0 | −1 | 0 | 0 |
| −1 | 248 | 209 | −1 | 271 | 312 | 261 | 266 | 356 | 198 | 1 | −1 | −1 | 0 |
| 312 | 310 | −1 | −1 | −1 | −1 | −1 | −1 | −1 | −1 | −1 | 355 | −1 | −1 |
| 374 | 340 | −1 | −1 | −1 | 263 | −1 | 304 | −1 | −1 | −1 | 336 | −1 | −1 |
| 255 | −1 | −1 | −1 | −1 | 292 | −1 | 284 | −1 | 335 | −1 | 200 | −1 | −1 |
| −1 | 304 | −1 | −1 | −1 | 198 | −1 | 368 | −1 | −1 | −1 | 282 | −1 | 241 |
| 266 | 314 | −1 | −1 | −1 | −1 | −1 | −1 | −1 | −1 | −1 | −1 | 232 | −1 |
| −1 | 356 | −1 | −1 | −1 | −1 | −1 | −1 | 252 | −1 | 200 | 206 | −1 | −1 |
| 325 | 280 | −1 | −1 | −1 | −1 | 362 | 332 | −1 | −1 | −1 | −1 | −1 | −1 |
| 352 | −1 | −1 | −1 | −1 | −1 | −1 | 292 | −1 | 210 | −1 | −1 | −1 | 230 |
| −1 | 345 | −1 | 291 | −1 | −1 | −1 | −1 | −1 | −1 | −1 | 373 | −1 | −1 |
| 335 | 259 | −1 | −1 | −1 | −1 | −1 | −1 | 349 | −1 | −1 | −1 | −1 | 218 |
| −1 | 365 | −1 | −1 | −1 | −1 | 266 | −1 | −1 | −1 | −1 | 363 | −1 | 221 |
| 316 | −1 | −1 | −1 | −1 | −1 | −1 | −1 | −1 | −1 | 322 | 303 | −1 | −1 |
| −1 | 297 | −1 | −1 | −1 | −1 | −1 | −1 | −1 | 207 | −1 | 249 | 320 | −1 |
| −1 | 226 | −1 | −1 | −1 | 361 | −1 | −1 | −1 | −1 | −1 | 375 | 378 | −1 |
| 198 | −1 | −1 | −1 | −1 | −1 | 378 | 338 | −1 | −1 | −1 | −1 | −1 | −1 |
| 326 | 342 | −1 | −1 | −1 | −1 | −1 | −1 | −1 | −1 | 229 | −1 | −1 | −1 |
| −1 | 308 | −1 | −1 | 323 | −1 | −1 | −1 | −1 | −1 | −1 | 231 | −1 | −1 |
| 227 | −1 | −1 | −1 | −1 | −1 | −1 | −1 | 209 | −1 | −1 | −1 | −1 | 317 |
| −1 | 364 | 332 | −1 | −1 | −1 | −1 | −1 | −1 | −1 | −1 | −1 | −1 | −1 |
| 278 | −1 | −1 | 298 | −1 | 289 | −1 | −1 | −1 | −1 | −1 | −1 | −1 | −1 |
| −1 | 202 | 231 | −1 | −1 | −1 | −1 | −1 | −1 | 320 | −1 | −1 | −1 | −1 |
| 339 | −1 | −1 | −1 | −1 | 363 | −1 | −1 | −1 | −1 | −1 | −1 | −1 | −1 |
| −1 | −1 | 317 | −1 | −1 | −1 | −1 | 247 | −1 | −1 | −1 | −1 | 329 | 299 |
| 281 | −1 | −1 | −1 | −1 | −1 | 334 | −1 | −1 | −1 | −1 | −1 | −1 | −1 |
| −1 | 314 | 273 | −1 | −1 | 216 | −1 | −1 | −1 | −1 | −1 | −1 | −1 | −1 |
| 274 | −1 | −1 | −1 | 367 | −1 | −1 | −1 | −1 | −1 | −1 | −1 | −1 | −1 |
| −1 | −1 | 264 | −1 | −1 | 230 | −1 | 332 | −1 | 328 | −1 | −1 | −1 | −1 |
| −1 | 381 | −1 | −1 | −1 | −1 | −1 | −1 | −1 | −1 | −1 | −1 | −1 | 214 |
| 300 | −1 | −1 | −1 | −1 | 376 | −1 | −1 | −1 | −1 | −1 | −1 | 367 | −1 |
| −1 | −1 | 219 | −1 | −1 | −1 | −1 | 205 | −1 | −1 | 261 | −1 | −1 | −1 |
| 211 | −1 | −1 | −1 | −1 | −1 | −1 | −1 | −1 | −1 | −1 | −1 | 207 | 372 |
| −1 | 307 | −1 | −1 | −1 | 200 | −1 | −1 | −1 | −1 | −1 | 366 | −1 | −1 |
| 359 | −1 | 233 | −1 | −1 | −1 | −1 | 214 | −1 | −1 | −1 | −1 | −1 | −1 |
| −1 | −1 | −1 | −1 | −1 | −1 | −1 | −1 | −1 | −1 | 348 | −1 | −1 | 353 |
| −1 | 300 | −1 | −1 | −1 | 233 | −1 | −1 | −1 | −1 | −1 | 194 | −1 | −1 |
| 291 | −1 | −1 | −1 | −1 | −1 | −1 | 252 | −1 | −1 | −1 | −1 | 327 | −1 |
| −1 | −1 | 281 | −1 | −1 | −1 | −1 | −1 | −1 | −1 | 278 | −1 | −1 | 221 |
| −1 | 237 | −1 | −1 | −1 | 377 | −1 | −1 | −1 | −1 | −1 | 324 | −1 | −1 |

TABLE 30

| 0 | 0 | 0 | 0 | -1 | -1 | 0 | -1 | -1 | 0 | 1 | 0 | -1 | -1 |
|---|---|---|---|---|---|---|---|---|---|---|---|---|---|
| 183 | -1 | -1 | 196 | 0 | 0 | 232 | 0 | 0 | 265 | -1 | 0 | 0 | -1 |
| 300 | 226 | -1 | 221 | 311 | -1 | -1 | -1 | 212 | -1 | 0 | -1 | 0 | 0 |
| -1 | 282 | 305 | -1 | 218 | 174 | 308 | 263 | 267 | 274 | 1 | -1 | -1 | 0 |
| 0 | 184 | -1 | -1 | -1 | -1 | -1 | -1 | -1 | -1 | -1 | 163 | -1 | -1 |
| 0 | 189 | -1 | -1 | -1 | 178 | -1 | 179 | -1 | -1 | -1 | 256 | -1 | -1 |
| 0 | -1 | -1 | -1 | -1 | 196 | -1 | 221 | -1 | 275 | -1 | 172 | -1 | -1 |
| -1 | 0 | -1 | -1 | -1 | 275 | -1 | 172 | -1 | -1 | -1 | 224 | -1 | 242 |
| 0 | 255 | -1 | -1 | -1 | -1 | -1 | -1 | -1 | -1 | -1 | -1 | 233 | -1 |
| -1 | 0 | -1 | -1 | -1 | -1 | -1 | -1 | 223 | -1 | 270 | 235 | -1 | -1 |
| 0 | 303 | -1 | -1 | -1 | -1 | 164 | 300 | -1 | -1 | -1 | -1 | -1 | -1 |
| 0 | -1 | -1 | -1 | -1 | -1 | -1 | 313 | -1 | 316 | -1 | -1 | -1 | 318 |
| -1 | 0 | -1 | 207 | -1 | -1 | -1 | -1 | -1 | -1 | -1 | 272 | -1 | -1 |
| 0 | 208 | -1 | -1 | -1 | -1 | -1 | -1 | 218 | -1 | -1 | -1 | -1 | 294 |
| -1 | 0 | -1 | -1 | -1 | -1 | 182 | -1 | -1 | -1 | -1 | 263 | -1 | 293 |
| 0 | -1 | -1 | -1 | -1 | -1 | -1 | -1 | -1 | -1 | 248 | 221 | -1 | -1 |
| -1 | 0 | -1 | -1 | -1 | -1 | -1 | -1 | -1 | 241 | -1 | 209 | 177 | -1 |
| -1 | 0 | -1 | -1 | -1 | 296 | -1 | -1 | -1 | -1 | -1 | 211 | 302 | -1 |
| 0 | -1 | -1 | -1 | -1 | -1 | 302 | 234 | -1 | -1 | -1 | -1 | -1 | -1 |
| 0 | 162 | -1 | -1 | -1 | -1 | -1 | -1 | -1 | -1 | 167 | -1 | -1 | -1 |
| -1 | 0 | -1 | -1 | 172 | -1 | -1 | -1 | -1 | -1 | -1 | 216 | -1 | -1 |
| 0 | -1 | -1 | -1 | -1 | -1 | -1 | -1 | 303 | -1 | -1 | -1 | -1 | 287 |
| -1 | 0 | 316 | -1 | -1 | 1 | -1 | -1 | -1 | -1 | -1 | -1 | -1 | -1 |
| 0 | -1 | -1 | 245 | -1 | 162 | -1 | -1 | -1 | -1 | -1 | -1 | -1 | -1 |
| -1 | 0 | 251 | -1 | -1 | -1 | -1 | -1 | -1 | 233 | -1 | -1 | -1 | -1 |
| 0 | -1 | -1 | -1 | -1 | 255 | -1 | -1 | -1 | -1 | -1 | -1 | -1 | -1 |
| -1 | -1 | 0 | -1 | -1 | -1 | -1 | 220 | -1 | -1 | -1 | -1 | 307 | 313 |
| 0 | -1 | -1 | -1 | -1 | -1 | 288 | -1 | -1 | -1 | -1 | -1 | -1 | -1 |
| -1 | 0 | 194 | -1 | -1 | 210 | -1 | -1 | -1 | -1 | -1 | -1 | -1 | -1 |
| 0 | -1 | -1 | -1 | 166 | -1 | -1 | -1 | -1 | -1 | -1 | -1 | -1 | -1 |
| -1 | -1 | 0 | -1 | -1 | 285 | -1 | 269 | -1 | 186 | -1 | -1 | -1 | -1 |
| -1 | 0 | -1 | -1 | -1 | -1 | -1 | -1 | -1 | -1 | -1 | -1 | -1 | 300 |
| 0 | -1 | -1 | -1 | -1 | 300 | -1 | -1 | -1 | -1 | -1 | -1 | 198 | -1 |
| -1 | -1 | 0 | -1 | -1 | -1 | -1 | 232 | -1 | -1 | 308 | -1 | -1 | -1 |
| 0 | -1 | -1 | -1 | -1 | -1 | -1 | -1 | -1 | -1 | -1 | -1 | 301 | 242 |
| -1 | 0 | -1 | -1 | -1 | 163 | -1 | -1 | -1 | -1 | -1 | 314 | -1 | -1 |
| 0 | -1 | 257 | -1 | -1 | -1 | -1 | 238 | -1 | -1 | -1 | -1 | -1 | -1 |
| -1 | -1 | -1 | -1 | -1 | -1 | -1 | -1 | -1 | -1 | -1 | -1 | -1 | 176 |
| -1 | 0 | -1 | -1 | -1 | 227 | -1 | -1 | -1 | -1 | -1 | 301 | -1 | -1 |
| 0 | -1 | -1 | -1 | -1 | -1 | -1 | 296 | -1 | -1 | -1 | -1 | 182 | -1 |
| -1 | -1 | 0 | -1 | -1 | -1 | -1 | -1 | -1 | -1 | 285 | -1 | -1 | 177 |
| -1 | 0 | -1 | -1 | -1 | 318 | -1 | -1 | -1 | -1 | -1 | 265 | -1 | -1 |

TABLE 31

| 152 | 114 | 201 | 43 | -1 | -1 | 129 | -1 | -1 | 216 | 0 | 0 | -1 | -1 |
|---|---|---|---|---|---|---|---|---|---|---|---|---|---|
| 171 | -1 | -1 | 68 | 109 | 68 | 109 | 24 | 195 | 193 | -1 | 0 | 0 | -1 |
| 72 | 93 | -1 | 178 | 33 | -1 | -1 | -1 | 133 | -1 | 1 | -1 | 0 | 0 |
| -1 | 39 | 218 | -1 | 188 | 100 | 100 | 114 | 68 | 91 | 0 | -1 | -1 | 0 |
| 24 | 208 | -1 | -1 | -1 | -1 | -1 | -1 | -1 | -1 | -1 | 123 | -1 | -1 |
| 39 | 86 | -1 | -1 | -1 | 54 | -1 | 5 | -1 | -1 | -1 | 31 | -1 | -1 |
| 101 | -1 | -1 | -1 | -1 | 169 | -1 | 193 | -1 | 2 | -1 | 15 | -1 | -1 |
| -1 | 121 | -1 | -1 | -1 | 211 | -1 | 119 | -1 | -1 | -1 | 74 | -1 | 43 |
| 77 | 181 | -1 | -1 | -1 | -1 | -1 | -1 | -1 | -1 | -1 | -1 | 72 | -1 |
| -1 | 222 | -1 | -1 | -1 | -1 | -1 | -1 | 194 | -1 | 41 | 141 | -1 | -1 |
| 50 | 74 | -1 | -1 | -1 | -1 | 216 | 168 | -1 | -1 | -1 | -1 | -1 | -1 |
| 125 | -1 | -1 | -1 | -1 | -1 | -1 | 86 | -1 | 114 | -1 | -1 | -1 | 125 |
| -1 | 178 | -1 | 7 | -1 | -1 | -1 | -1 | -1 | -1 | -1 | 115 | -1 | -1 |
| 187 | 111 | -1 | -1 | -1 | -1 | -1 | -1 | 81 | -1 | -1 | -1 | -1 | 84 |
| -1 | 188 | -1 | -1 | -1 | -1 | 129 | -1 | -1 | -1 | -1 | 184 | -1 | 108 |
| 108 | -1 | -1 | -1 | -1 | -1 | -1 | -1 | -1 | -1 | 25 | 114 | -1 | -1 |
| -1 | 149 | -1 | -1 | -1 | -1 | -1 | -1 | -1 | 66 | -1 | 90 | 127 | -1 |
| -1 | 176 | -1 | -1 | -1 | 92 | -1 | -1 | -1 | -1 | -1 | 18 | 222 | -1 |
| 156 | -1 | -1 | -1 | -1 | -1 | 208 | 68 | -1 | -1 | -1 | -1 | -1 | -1 |
| 189 | 86 | -1 | -1 | -1 | -1 | -1 | -1 | -1 | -1 | 139 | -1 | -1 | -1 |
| -1 | 218 | -1 | -1 | 204 | -1 | -1 | -1 | -1 | -1 | -1 | 83 | -1 | -1 |
| 144 | -1 | -1 | -1 | -1 | -1 | -1 | -1 | 181 | -1 | -1 | -1 | -1 | 143 |
| -1 | 175 | 223 | -1 | -1 | -1 | -1 | -1 | -1 | -1 | -1 | -1 | -1 | -1 |
| 68 | -1 | -1 | 170 | -1 | 90 | -1 | -1 | -1 | -1 | -1 | -1 | -1 | -1 |
| -1 | 71 | 136 | -1 | -1 | -1 | -1 | -1 | -1 | 161 | -1 | -1 | -1 | -1 |
| 13 | -1 | -1 | -1 | -1 | 130 | -1 | -1 | -1 | -1 | -1 | -1 | -1 | -1 |
| -1 | -1 | 134 | -1 | -1 | -1 | -1 | 218 | -1 | -1 | -1 | -1 | 3 | 218 |
| 197 | -1 | -1 | -1 | -1 | -1 | 106 | -1 | -1 | -1 | -1 | -1 | -1 | -1 |
| -1 | 8 | 12 | -1 | -1 | 31 | -1 | -1 | -1 | -1 | -1 | -1 | -1 | -1 |
| 116 | -1 | -1 | -1 | 163 | -1 | -1 | -1 | -1 | -1 | -1 | -1 | -1 | -1 |
| -1 | -1 | 118 | -1 | -1 | 180 | -1 | 39 | -1 | 48 | -1 | -1 | -1 | -1 |

TABLE 31-continued

| | | | | | | | | | | | | | |
|---|---|---|---|---|---|---|---|---|---|---|---|---|---|
| -1 | 77 | -1 | -1 | -1 | -1 | -1 | -1 | -1 | -1 | -1 | -1 | -1 | 42 |
| 116 | -1 | -1 | -1 | -1 | 203 | -1 | -1 | -1 | -1 | -1 | -1 | 114 | -1 |
| -1 | -1 | 153 | -1 | -1 | -1 | -1 | 212 | -1 | -1 | 116 | -1 | -1 | -1 |
| 195 | -1 | -1 | -1 | -1 | -1 | -1 | -1 | -1 | -1 | -1 | -1 | 23 | 155 |
| -1 | 133 | -1 | -1 | -1 | 59 | -1 | -1 | -1 | -1 | -1 | 169 | -1 | -1 |
| 223 | -1 | 49 | -1 | -1 | -1 | -1 | 141 | -1 | -1 | -1 | -1 | -1 | -1 |
| -1 | -1 | -1 | -1 | -1 | -1 | -1 | -1 | -1 | -1 | 185 | -1 | -1 | 212 |
| -1 | 187 | -1 | -1 | -1 | 127 | -1 | -1 | -1 | -1 | -1 | 178 | -1 | -1 |
| 118 | -1 | -1 | -1 | -1 | -1 | -1 | 43 | -1 | -1 | -1 | -1 | 70 | -1 |
| -1 | -1 | 126 | -1 | -1 | -1 | -1 | -1 | -1 | -1 | 190 | -1 | -1 | 188 |
| -1 | 104 | -1 | -1 | -1 | 123 | -1 | -1 | -1 | -1 | -1 | 143 | -1 | -1 |

TABLE 32

| | | | | | | | | | | | | | |
|---|---|---|---|---|---|---|---|---|---|---|---|---|---|
| 285 | 262 | 235 | 253 | -1 | -1 | 173 | -1 | -1 | 161 | 1 | 0 | -1 | -1 |
| 269 | -1 | -1 | 194 | 184 | 222 | 204 | 190 | 219 | 238 | -1 | 0 | 0 | -1 |
| 193 | 182 | -1 | 196 | 178 | -1 | -1 | -1 | 177 | -1 | 0 | -1 | 0 | 0 |
| -1 | 168 | 167 | -1 | 266 | 284 | 215 | 239 | 160 | 209 | 1 | -1 | -1 | 0 |
| 246 | 264 | -1 | -1 | -1 | -1 | -1 | -1 | -1 | -1 | -1 | 237 | -1 | -1 |
| 248 | 148 | -1 | -1 | -1 | 204 | -1 | 151 | -1 | -1 | -1 | 217 | -1 | -1 |
| 179 | -1 | -1 | -1 | -1 | 201 | -1 | 181 | -1 | 155 | -1 | 149 | -1 | -1 |
| -1 | 191 | -1 | -1 | -1 | 153 | -1 | 253 | -1 | -1 | -1 | 180 | -1 | 223 |
| 218 | 219 | -1 | -1 | -1 | -1 | -1 | -1 | -1 | -1 | -1 | -1 | 200 | -1 |
| -1 | 191 | -1 | -1 | -1 | -1 | -1 | -1 | 248 | -1 | 265 | 239 | -1 | -1 |
| 242 | 247 | -1 | -1 | -1 | -1 | 187 | 192 | -1 | -1 | -1 | -1 | -1 | -1 |
| 260 | -1 | -1 | -1 | -1 | -1 | -1 | 258 | -1 | 172 | -1 | -1 | -1 | 224 |
| -1 | 255 | -1 | 166 | -1 | -1 | -1 | -1 | -1 | -1 | -1 | 157 | -1 | -1 |
| 212 | 251 | -1 | -1 | -1 | -1 | -1 | -1 | 226 | -1 | -1 | -1 | -1 | 241 |
| -1 | 145 | -1 | -1 | -1 | -1 | 237 | -1 | -1 | -1 | -1 | 158 | -1 | 191 |
| 149 | -1 | -1 | -1 | -1 | -1 | -1 | -1 | -1 | -1 | 193 | 160 | -1 | -1 |
| -1 | 240 | -1 | -1 | -1 | -1 | -1 | -1 | -1 | 279 | -1 | 260 | 280 | -1 |
| -1 | 168 | -1 | -1 | -1 | 245 | -1 | -1 | -1 | -1 | -1 | 223 | 246 | -1 |
| 271 | -1 | -1 | -1 | -1 | -1 | 182 | 146 | -1 | -1 | -1 | -1 | -1 | -1 |
| 209 | 260 | -1 | -1 | -1 | -1 | -1 | -1 | -1 | -1 | 248 | -1 | -1 | -1 |
| -1 | 286 | -1 | -1 | 185 | -1 | -1 | -1 | -1 | -1 | -1 | 210 | -1 | -1 |
| 197 | -1 | -1 | -1 | -1 | -1 | -1 | -1 | 213 | -1 | -1 | -1 | -1 | 207 |
| -1 | 234 | 156 | -1 | -1 | -1 | -1 | -1 | -1 | -1 | -1 | -1 | -1 | -1 |
| 220 | -1 | -1 | 173 | -1 | 232 | -1 | -1 | -1 | -1 | -1 | -1 | -1 | -1 |
| -1 | 258 | 246 | -1 | -1 | -1 | -1 | -1 | -1 | 187 | -1 | -1 | -1 | -1 |
| 160 | -1 | -1 | -1 | -1 | 225 | -1 | -1 | -1 | -1 | -1 | -1 | -1 | -1 |
| -1 | -1 | 146 | -1 | -1 | -1 | -1 | 260 | -1 | -1 | -1 | -1 | 188 | 155 |
| 275 | -1 | -1 | -1 | -1 | -1 | 278 | -1 | -1 | -1 | -1 | -1 | -1 | -1 |
| -1 | 182 | 211 | -1 | -1 | 245 | -1 | -1 | -1 | -1 | -1 | -1 | -1 | -1 |
| 155 | -1 | -1 | -1 | 263 | -1 | -1 | -1 | -1 | -1 | -1 | -1 | -1 | -1 |
| -1 | -1 | 201 | -1 | -1 | 232 | -1 | 184 | -1 | 218 | -1 | -1 | -1 | -1 |
| -1 | 208 | -1 | -1 | -1 | -1 | -1 | -1 | -1 | -1 | -1 | -1 | -1 | 149 |
| 256 | -1 | -1 | -1 | -1 | 199 | -1 | -1 | -1 | -1 | -1 | -1 | 217 | -1 |
| -1 | -1 | 153 | -1 | -1 | -1 | -1 | 282 | -1 | -1 | 287 | -1 | -1 | -1 |
| 251 | -1 | -1 | -1 | -1 | -1 | -1 | -1 | -1 | -1 | -1 | -1 | 263 | 174 |
| -1 | 228 | -1 | -1 | -1 | 151 | -1 | -1 | -1 | -1 | -1 | 195 | -1 | -1 |
| 167 | -1 | 159 | -1 | -1 | -1 | -1 | 262 | -1 | -1 | -1 | -1 | -1 | -1 |
| -1 | -1 | -1 | -1 | -1 | -1 | -1 | -1 | -1 | -1 | 192 | -1 | -1 | 232 |
| -1 | 287 | -1 | -1 | -1 | 218 | -1 | -1 | -1 | -1 | -1 | 287 | -1 | -1 |
| 169 | -1 | -1 | -1 | -1 | -1 | -1 | 256 | -1 | -1 | -1 | -1 | 146 | -1 |
| -1 | -1 | 282 | -1 | -1 | -1 | -1 | -1 | -1 | -1 | 216 | -1 | -1 | 186 |
| -1 | 240 | -1 | -1 | -1 | 241 | -1 | -1 | -1 | -1 | -1 | 269 | -1 | -1 |

TABLE 33

| | | | | | | | | | | | | | |
|---|---|---|---|---|---|---|---|---|---|---|---|---|---|
| 196 | 209 | 338 | 349 | -1 | -1 | 312 | -1 | -1 | 229 | 1 | 0 | -1 | -1 |
| 335 | -1 | -1 | 287 | 289 | 351 | 297 | 315 | 181 | 219 | -1 | 0 | 0 | -1 |
| 254 | 184 | -1 | 245 | 270 | -1 | -1 | -1 | 210 | -1 | 0 | -1 | 0 | 0 |
| -1 | 299 | 178 | -1 | 178 | 225 | 335 | 263 | 335 | 247 | 1 | -1 | -1 | 0 |
| 266 | 285 | -1 | -1 | -1 | -1 | -1 | -1 | -1 | -1 | -1 | 269 | -1 | -1 |
| 273 | 268 | -1 | -1 | -1 | 317 | -1 | 249 | -1 | -1 | -1 | 292 | -1 | -1 |
| 305 | -1 | -1 | -1 | -1 | 198 | -1 | 342 | -1 | 197 | -1 | 323 | -1 | -1 |
| -1 | 304 | -1 | -1 | -1 | 227 | -1 | 328 | -1 | -1 | -1 | 305 | -1 | 297 |
| 299 | 321 | -1 | -1 | -1 | -1 | -1 | -1 | -1 | -1 | -1 | -1 | 191 | -1 |
| -1 | 248 | -1 | -1 | -1 | -1 | -1 | -1 | 210 | -1 | 254 | 288 | -1 | -1 |
| 241 | 327 | -1 | -1 | -1 | -1 | 178 | 329 | -1 | -1 | -1 | -1 | -1 | -1 |
| 261 | -1 | -1 | -1 | -1 | -1 | -1 | 177 | -1 | 328 | -1 | -1 | -1 | 211 |

TABLE 33-continued

| | | | | | | | | | | | | | |
|---|---|---|---|---|---|---|---|---|---|---|---|---|---|
| −1 | 230 | −1 | 341 | −1 | −1 | −1 | −1 | −1 | −1 | −1 | 348 | −1 | −1 |
| 323 | 261 | −1 | −1 | −1 | −1 | −1 | −1 | 325 | −1 | −1 | −1 | −1 | 225 |
| −1 | 341 | −1 | −1 | −1 | −1 | 207 | −1 | −1 | −1 | −1 | 344 | −1 | 186 |
| 215 | −1 | −1 | −1 | −1 | −1 | −1 | −1 | −1 | −1 | 250 | 312 | −1 | −1 |
| −1 | 274 | −1 | −1 | −1 | −1 | −1 | −1 | −1 | 194 | −1 | 335 | 187 | −1 |
| −1 | 218 | −1 | −1 | −1 | 329 | −1 | −1 | −1 | −1 | −1 | 290 | 189 | −1 |
| 179 | −1 | −1 | −1 | −1 | −1 | 321 | 330 | −1 | −1 | −1 | −1 | −1 | −1 |
| 339 | 217 | −1 | −1 | −1 | −1 | −1 | −1 | −1 | −1 | 208 | −1 | −1 | −11 |
| −1 | 224 | −1 | −1 | 300 | −1 | −1 | −1 | −1 | −1 | −1 | 179 | −1 | −1 |
| 196 | −1 | −1 | −1 | −1 | −1 | −1 | −1 | 186 | −1 | −1 | −1 | −1 | 312 |
| −1 | 334 | 189 | −1 | −1 | −1 | −1 | −1 | −1 | −1 | −1 | −1 | −1 | −1 |
| 242 | −1 | −1 | 220 | −1 | 202 | −1 | −1 | −1 | −1 | −1 | −1 | −1 | −1 |
| −1 | 239 | 244 | −1 | −1 | −1 | −1 | −1 | −1 | 291 | −1 | −1 | −1 | −1 |
| 280 | −1 | −1 | −1 | −1 | 216 | −1 | −1 | −1 | −1 | −1 | −1 | −1 | −1 |
| −1 | −1 | 316 | −1 | −1 | −1 | −1 | 314 | −1 | −1 | −1 | −1 | 299 | 207 |
| 310 | −1 | −1 | −1 | −1 | −1 | 248 | −1 | −1 | −1 | −1 | −1 | −1 | −1 |
| −1 | 288 | 328 | −1 | −1 | 203 | −1 | −1 | −1 | −1 | −1 | −1 | −1 | −1 |
| 213 | −1 | −1 | −1 | 191 | −1 | −1 | −1 | −1 | −1 | −1 | −1 | −1 | −1 |
| −1 | −1 | 268 | −1 | −1 | 179 | −1 | 259 | −1 | 323 | −1 | −1 | −1 | −1 |
| −1 | 235 | −1 | −1 | −1 | −1 | −1 | −1 | −1 | −1 | −1 | −1 | −1 | 204 |
| 236 | −1 | −1 | −1 | −1 | 279 | −1 | −1 | −1 | −1 | −1 | −1 | 210 | −1 |
| −1 | −1 | 247 | −1 | −1 | −1 | −1 | 215 | −1 | −1 | 324 | −1 | −1 | −1 |
| 341 | −1 | −1 | −1 | −1 | −1 | −1 | −1 | −1 | −1 | −1 | −1 | 311 | 190 |
| −1 | 226 | −1 | −1 | −1 | 200 | −1 | −1 | −1 | −1 | −1 | 180 | −1 | −1 |
| 279 | −1 | 198 | −1 | −1 | −1 | −1 | 223 | −1 | −1 | −1 | −1 | −1 | −1 |
| −1 | −1 | −1 | −1 | −1 | −1 | −1 | −1 | −1 | −1 | 186 | −1 | −1 | 314 |
| −1 | 240 | −1 | −1 | −1 | 345 | −1 | −1 | −1 | −1 | −1 | 333 | −1 | −1 |
| 243 | −1 | −1 | −1 | −1 | −1 | −1 | 346 | −1 | −1 | −1 | −1 | 247 | −1 |
| −1 | −1 | 192 | −1 | −1 | −1 | −1 | −1 | −1 | −1 | 197 | −1 | −1 | 270 |
| −1 | 220 | −1 | −1 | −1 | 346 | −1 | −1 | −1 | −1 | −1 | 344 | −1 | −1 |

TABLE 34

| | | | | | | | | | | | | | |
|---|---|---|---|---|---|---|---|---|---|---|---|---|---|
| 65 | 189 | 32 | 43 | −1 | −1 | 12 | −1 | −1 | 195 | 1 | 0 | −1 | −1 |
| 190 | −1 | −1 | 181 | 205 | 106 | 23 | 191 | 194 | 28 | −1 | 0 | 0 | −1 |
| 82 | 45 | −1 | 161 | 25 | −1 | −1 | −1 | 76 | −1 | 0 | −1 | 0 | 0 |
| −1 | 172 | 160 | −1 | 190 | 97 | 5 | 205 | 17 | 48 | 1 | −1 | −1 | 0 |
| 165 | 181 | −1 | −1 | −1 | −1 | −1 | −1 | −1 | −1 | −1 | 91 | −1 | −1 |
| 72 | 159 | −1 | −1 | −1 | 172 | −1 | 76 | −1 | −1 | −1 | 146 | −1 | −1 |
| 201 | −1 | −1 | −1 | −1 | 174 | −1 | 10 | −1 | 40 | −1 | 196 | −1 | −1 |
| −1 | 45 | −1 | −1 | −1 | 130 | −1 | 65 | −1 | −1 | −1 | 101 | −1 | 150 |
| 107 | 31 | −1 | −1 | −1 | −1 | −1 | −1 | −1 | −1 | −1 | −1 | 186 | −1 |
| −1 | 22 | −1 | −1 | −1 | −1 | −1 | −1 | 181 | −1 | 4 | 127 | −1 | −1 |
| 83 | 148 | −1 | −1 | −1 | −1 | 31 | 157 | −1 | −1 | −1 | −1 | −1 | −1 |
| 169 | −1 | −1 | −1 | −1 | −1 | −1 | 179 | −1 | 173 | −1 | −1 | −1 | 200 |
| −1 | 190 | −1 | 53 | −1 | −1 | −1 | −1 | −1 | −1 | −1 | 159 | −1 | −1 |
| 176 | 155 | −1 | −1 | −1 | −1 | −1 | −1 | 113 | −1 | −1 | −1 | −1 | 22 |
| −1 | 117 | −1 | −1 | −1 | −1 | 188 | −1 | −1 | −1 | −1 | 156 | −1 | 99 |
| 34 | −1 | −1 | −1 | −1 | −1 | −1 | −1 | −1 | −1 | 101 | 106 | −1 | −1 |
| −1 | 83 | −1 | −1 | −1 | −1 | −1 | −1 | −1 | 177 | −1 | 154 | 32 | −1 |
| −1 | 151 | −1 | −1 | −1 | 7 | −1 | −1 | −1 | −1 | −1 | 66 | 173 | −1 |
| 79 | −1 | −1 | −1 | −1 | −1 | 5 | 68 | −1 | −1 | −1 | −1 | −1 | −1 |
| 98 | 84 | −1 | −1 | −1 | −1 | −1 | −1 | −1 | −1 | 157 | −1 | −1 | −1 |
| −1 | 12 | −1 | −1 | 173 | −1 | −1 | −1 | −1 | −1 | −1 | 94 | −1 | −1 |
| 198 | −1 | −1 | −1 | −1 | −1 | −1 | −1 | 86 | −1 | −1 | −1 | −1 | 185 |
| −1 | 6 | 82 | −1 | −1 | −1 | −1 | −1 | −1 | −1 | −1 | −1 | −1 | −1 |
| 156 | −1 | −1 | 38 | −1 | 195 | −1 | −1 | −1 | −1 | −1 | −1 | −1 | −1 |
| −1 | 95 | 47 | −1 | −1 | −1 | −1 | −1 | −1 | 120 | −1 | −1 | −1 | −1 |
| 11 | −1 | −1 | −1 | −1 | 14 | −1 | −1 | −1 | −1 | −1 | −1 | −1 | −1 |
| −1 | −1 | 44 | −1 | −1 | −1 | −1 | 36 | −1 | −1 | −1 | −1 | 159 | 47 |
| 40 | −1 | −1 | −1 | −1 | −1 | 15 | −1 | −1 | −1 | −1 | −1 | −1 | −1 |
| −1 | 194 | 22 | −1 | −1 | 162 | −1 | −1 | −1 | −1 | −1 | −1 | −1 | −1 |
| 158 | −1 | −1 | −1 | 181 | −1 | −1 | −1 | −1 | −1 | −1 | −1 | −1 | −1 |
| −1 | −1 | 138 | −1 | −1 | 191 | −1 | 158 | 1 | 202 | −1 | −1 | −1 | −1 |
| −1 | 93 | −1 | −1 | −1 | −1 | −1 | −1 | −1 | −1 | −1 | −1 | −1 | 19 |
| 98 | −1 | −1 | −1 | −1 | 0 | −1 | −1 | −1 | −1 | −1 | −1 | 45 | −1 |
| −1 | −1 | 45 | −1 | −1 | −1 | −1 | 35 | −1 | −1 | 30 | −1 | −1 | −1 |
| 11 | −1 | −1 | −1 | −1 | −1 | −1 | −1 | −1 | −1 | −1 | −1 | 17 | 15 |
| −1 | 51 | −1 | −1 | −1 | 41 | −1 | −1 | −1 | −1 | −1 | 27 | −1 | −1 |
| 11 | −1 | 41 | −1 | −1 | −1 | −1 | 29 | −1 | −1 | −1 | −1 | −1 | −1 |
| −1 | −1 | 1 | −1 | −1 | −1 | −1 | −1 | −1 | −1 | 28 | −1 | −1 | 15 |
| −1 | 51 | −1 | −1 | −1 | 35 | −1 | −1 | −1 | −1 | −1 | 17 | −1 | −1 |
| 27 | −1 | −1 | −1 | −1 | −1 | −1 | 51 | −1 | −1 | −1 | −1 | 35 | −1 |
| −1 | −1 | 15 | −1 | −1 | −1 | −1 | −1 | −1 | −1 | 46 | −1 | −1 | 29 |
| −1 | 17 | −1 | −1 | −1 | 11 | −1 | −1 | −1 | −1 | −1 | 41 | −1 | −1 |

TABLE 35

| | | | | | | | | | | | | | |
|---|---|---|---|---|---|---|---|---|---|---|---|---|---|
| 95 | 109 | 169 | 219 | −1 | −1 | 217 | −1 | −1 | 128 | 0 | 0 | −1 | −1 |
| 98 | −1 | −1 | 66 | 57 | 213 | 144 | 217 | 231 | 73 | −1 | 0 | 0 | −1 |
| 166 | 209 | −1 | 237 | 187 | −1 | −1 | −1 | 85 | −1 | 1 | −1 | 0 | 0 |
| −1 | 1 | 69 | −1 | 145 | 130 | 81 | 41 | 197 | 165 | 0 | −1 | −1 | 0 |
| 211 | 100 | −1 | −1 | −1 | −1 | −1 | −1 | −1 | −1 | −1 | 60 | −1 | −1 |
| 119 | 199 | −1 | −1 | −1 | 71 | −1 | 152 | −1 | −1 | −1 | 33 | −1 | −1 |
| 103 | −1 | −1 | −1 | −1 | 168 | −1 | 68 | −1 | 116 | −1 | 184 | −1 | −1 |
| −1 | 154 | −1 | −1 | −1 | 54 | −1 | 153 | −1 | −1 | −1 | 68 | −1 | 86 |
| 64 | 71 | −1 | −1 | −1 | −1 | −1 | −1 | −1 | −1 | −1 | −1 | 15 | −1 |
| −1 | 73 | −1 | −1 | −1 | −1 | −1 | −1 | 2 | −1 | 193 | 172 | −1 | −1 |
| 202 | 23 | −1 | −1 | −1 | −1 | 32 | 8 | −1 | −1 | −1 | −1 | −1 | −1 |
| 62 | −1 | −1 | −1 | −1 | −1 | −1 | 26 | −1 | 72 | −1 | −1 | −1 | 189 |
| −1 | 116 | −1 | 118 | −1 | −1 | −1 | −1 | −1 | −1 | −1 | 168 | −1 | −1 |
| 192 | 183 | −1 | −1 | −1 | −1 | −1 | −1 | 73 | −1 | −1 | −1 | −1 | 21 |
| −1 | 158 | −1 | −1 | −1 | −1 | 8 | −1 | −1 | −1 | −1 | 36 | −1 | 78 |
| 202 | −1 | −1 | −1 | −1 | −1 | −1 | −1 | −1 | −1 | 24 | 83 | −1 | −1 |
| −1 | 70 | −1 | −1 | −1 | −1 | −1 | −1 | −1 | 217 | −1 | 65 | 38 | −1 |
| −1 | 44 | −1 | −1 | −1 | 67 | −1 | −1 | −1 | −1 | −1 | 45 | 22 | −1 |
| 112 | −1 | −1 | −1 | −1 | −1 | 29 | 30 | −1 | −1 | −1 | −1 | −1 | −1 |
| 201 | 156 | −1 | −1 | −1 | −1 | −1 | −1 | −1 | −1 | 153 | −1 | −1 | −1 |
| −1 | 123 | −1 | −1 | 13 | −1 | −1 | −1 | −1 | −1 | −1 | 234 | −1 | −1 |
| 2 | −1 | −1 | −1 | −1 | −1 | −1 | −1 | 227 | −1 | −1 | −1 | −1 | 229 |
| −1 | 45 | 196 | −1 | −1 | −1 | −1 | −1 | −1 | −1 | −1 | −1 | −1 | −1 |
| 235 | −1 | −1 | 146 | −1 | 129 | −1 | −1 | −1 | −1 | −1 | −1 | −1 | −1 |
| −1 | 159 | 221 | −1 | −1 | −1 | −1 | −1 | −1 | 110 | −1 | −1 | −1 | −1 |
| 174 | −1 | −1 | −1 | −1 | 145 | −1 | −1 | −1 | −1 | −1 | −1 | −1 | −1 |
| −1 | −1 | 94 | −1 | −1 | −1 | −1 | 174 | −1 | −1 | −1 | −1 | 50 | 154 |
| 176 | −1 | −1 | −1 | −1 | −1 | 59 | −1 | −1 | −1 | −1 | −1 | −1 | −1 |
| −1 | 233 | 96 | −1 | −1 | 224 | −1 | −1 | −1 | −1 | −1 | −1 | −1 | −1 |
| 215 | −1 | −1 | −1 | 183 | −1 | −1 | −1 | −1 | −1 | −1 | −1 | −1 | −1 |
| −1 | −1 | 203 | −1 | −1 | 101 | −1 | 19 | −1 | 223 | −1 | −1 | −1 | −1 |
| −1 | 39 | −1 | −1 | −1 | −1 | −1 | −1 | −1 | −1 | −1 | −1 | −1 | 194 |
| 61 | −1 | −1 | −1 | −1 | 226 | −1 | −1 | −1 | −1 | −1 | −1 | 124 | −1 |
| −1 | −1 | 194 | −1 | −1 | −1 | −1 | 238 | −1 | −1 | 135 | −1 | −1 | −1 |
| 56 | −1 | −1 | −1 | −1 | −1 | −1 | −1 | −1 | −1 | −1 | −1 | 105 | 99 |
| −1 | 155 | −1 | −1 | −1 | 15 | −1 | −1 | −1 | −1 | −1 | 65 | −1 | −1 |
| 62 | −1 | 128 | −1 | −1 | −1 | −1 | 134 | −1 | −1 | −1 | −1 | −1 | −1 |
| −1 | −1 | −1 | −1 | −1 | −1 | −1 | −1 | −1 | −1 | 87 | −1 | −1 | 126 |
| −1 | 198 | −1 | −1 | −1 | 199 | −1 | −1 | −1 | −1 | −1 | 135 | −1 | −1 |
| 73 | −1 | −1 | −1 | −1 | −1 | −1 | 195 | −1 | −1 | −1 | −1 | 51 | −1 |
| −1 | −1 | 162 | −1 | −1 | −1 | −1 | −1 | −1 | −1 | 174 | −1 | −1 | 60 |
| −1 | 187 | −1 | −1 | −1 | 25 | −1 | −1 | −1 | −1 | −1 | 10 | −1 | −1 |

According to the present invention, LDPC encoding/decoding may be performed by transforming the parity check matrix of given LDPC code and creating another parity check matrix having similar algebraic characteristics, whereby the efficiency of channel encoding/decoding may be maximized.

Also, the present invention may transform different formats of parity check matrices of LDPC code into a single unified format, whereby the complexity of encoding/decoding may be reduced.

Also, the present invention may create a new parity check matrix in which most of the algebraic characteristics of the original parity check matrix before transformation are maintained, whereby performance degradation may be prevented when channel encoding/decoding is performed.

As described above, the channel coding/decoding method and apparatus using the method according to the present invention are not limitedly applied to the configurations and operations of the above-described embodiments, but all or some of the embodiments may be selectively combined and configured, so that the embodiments may be modified in various ways.

What is claimed is:

1. A channel-coding method, comprising:

loading a first exponent matrix;

transforming the first exponent matrix into a second exponent matrix;

creating a parity check matrix corresponding to a required block size using the second exponent matrix;

performing low-density parity-check (LDPC) encoding using the parity check matrix, wherein transforming the first exponent matrix into the second exponent matrix comprises, performing an operation of addition or subtraction by using a first natural number on one column of the first exponent matrix and thereby creating a temporal exponent matric, the operation corresponding to a circular column permutation;

creating conversion values for elements that are greater than 0 in the temporal exponent matrix to create the second exponent matrix using the conversion values, and wherein the one column is a $(k_b+1)$-th column of the first exponent matrix (where $k_b$ is a second natural number that is acquired by subtracting a number of rows in the first exponent matrix from a number of columns therein).

2. The channel-coding method of claim 1, wherein the first exponent matrix and the second exponent matrix are classified as two types, which are a first type and a second type, depending on first four elements in the $(k_b+1)$-th column of the first exponent matrix.

3. The channel-coding method of claim 2, wherein the exponent matrix is classified as the first type or as the second type according to a number of natural numbers included in the first four elements.

4. The channel-coding method of claim 3, wherein, when the first exponent matrix is the first type, the second exponent matrix is the second type, and when the first exponent matrix is the second type, the second exponent matrix is the first type.

5. The channel-coding method of claim 1, wherein the operation is performed using a following equation, $$V'_{ij}=(V_{ij}-a) \bmod Z_{max} \text{ for } 0 \le V_{ij} \le Z_{max}-1$$

where $V'_{ij}$ denotes elements of the temporal exponent matrix, $V_{ij}$ denotes elements of the first exponent matrix, mod denotes a modulo operator, $Z_{max}$ denotes a maximum block size, and a denotes the first natural number.

6. The channel-coding method of claim 5, wherein the conversion value is created by subtracting an element that is greater than 0 in the temporal exponent matrix from the maximum block size.

7. The channel-coding method of claim 6, wherein the second exponent matrix is created using a following equation, $$W_{ij} = \begin{cases} V'_{ij}, & V'_{ij} = -1, 0, \\ Z_{max} - V'_{ij}, & V'_{ij} > 0 \end{cases},$$

where $W_{ij}$ denotes elements of the second exponent matrix, $V'_{ij}$ denotes elements of the temporal exponent matrix, and $Z_{max}$ denotes the maximum block size.

8. A channel encoder, comprising:

memory for storing data pertaining to a first exponent matrix corresponding to an original parity check matrix;

a processor for creating a parity check matrix corresponding to a second exponent matrix that is created by transforming the first exponent matrix and for performing low-density parity-check (LDPC) encoding using the created parity check matrix, wherein the second exponent matrix is created using conversion values for elements that are greater than 0 in a temporal exponent matrix;

the temporal exponent matrix is created by performing an operation of addition or subtraction by using a first natural number on one column of the first exponent matrix, the operation corresponding to a circular column permutation, and wherein the one column is a $(k_b+1)$-th column of the first exponent matrix (where $k_b$ is a second natural number that is acquired by subtracting a number of rows in the first exponent matrix from a number of columns therein).

9. The channel encoder of claim 1, wherein the first exponent matrix and the second exponent matrix are classified as two types, which are a first type and a second type, depending on first four elements in the $(k_b+1)$-th column of the first exponent matrix.

10. The channel encoder of claim 9, wherein the exponent matrix is classified as the first type or the second type according to a number of natural numbers included in the first four elements.

11. The channel encoder of claim 10, wherein, when the first exponent matrix is the first type, the second exponent matrix is the second type, and when the first exponent matrix is the second type, the second exponent matrix is the first type.

12. The channel encoder of claim 8, wherein the operation is performed using a following equation, $$V'_{ij}=(V_{ij}-a) \bmod Z_{max} \text{ for } 0 \le V_{ij} \le Z_{max}-1$$

where $V'_{ij}$ denotes elements of the temporal exponent matrix, $V_{ij}$ denotes elements of the first exponent matrix, mod denotes a modulo operator, $Z_{max}$ denotes a maximum block size, and a denotes the natural number.

13. The channel encoder of claim 12, wherein the second exponent matrix is created using a following equation, $$W_{ij} = \begin{cases} V'_{ij}, & V'_{ij} = -1, 0, \\ Z_{max} - V'_{ij}, & V'_{ij} > 0 \end{cases},$$

where $W_{ij}$ denotes elements of the second exponent matrix, $V'_{ij}$ denotes elements of the temporal exponent matrix, and $Z_{max}$ denotes the maximum block size.

14. A channel decoder, comprising:

memory for storing data pertaining to a first exponent matrix corresponding to an original parity check matrix; and a processor for creating a parity check matrix corresponding to a second exponent matrix that is created by transforming the first exponent matrix and for performing low-density parity-check (LDPC) decoding using the created parity check matrix, wherein the second exponent matrix is created using conversion values for elements that are greater than 0 in a temporal exponent matrix; and the temporal exponent matrix is created by performing an operation of addition or subtraction by using a first natural number on one column of the first exponent matrix, the operation corresponding to a circular column permutation, wherein the one column is a $(k_b+1)$-th column of the first exponent matrix (where $k_b$ is a second natural number that is acquired by subtracting a number of rows in the first exponent matrix from a number of columns therein).

* * * * *